(12) United States Patent
Stoppel et al.

(10) Patent No.: US 10,349,182 B2
(45) Date of Patent: Jul. 9, 2019

(54) MICROMECHANICAL PIEZOELECTRIC ACTUATORS FOR IMPLEMENTING LARGE FORCES AND DEFLECTIONS

(71) Applicant: Fraunhofer-Gesellschaft zur Foerderung der angewandten Forschung e.V., Munich (DE)

(72) Inventors: Fabian Stoppel, Itzehoe (DE); Bernhard Wagner, Looft (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 15/448,846

(22) Filed: Mar. 3, 2017

(65) Prior Publication Data

US 2017/0325030 A1 Nov. 9, 2017

Related U.S. Application Data

(63) Continuation of application No. PCT/EP2015/070124, filed on Sep. 3, 2015.

(30) Foreign Application Priority Data

Sep. 5, 2014 (DE) .................. 10 2014 217 798

(51) Int. Cl.
*H04R 17/00* (2006.01)
*H04R 3/00* (2006.01)
(Continued)

(52) U.S. Cl.
CPC .......... *H04R 17/00* (2013.01); *H01L 41/0946* (2013.01); *H04R 3/002* (2013.01); *H04R 29/001* (2013.01); *H04R 2201/003* (2013.01)

(58) Field of Classification Search
CPC ...... H04R 17/00; H04R 17/005; H04R 17/02; H04R 17/025; H04R 17/10; H01L 41/0946
See application file for complete search history.

(56) References Cited

U.S. PATENT DOCUMENTS 6,198,565 B1 * 3/2001 Iseki .................. G02B 26/0841
348/E5.137
7,003,125 B2 2/2006 Yi et al.
(Continued)

FOREIGN PATENT DOCUMENTS

CN 101630063 A 1/2010
CN 102006540 A 4/2011
(Continued)

OTHER PUBLICATIONS

Dejaeger, et al., "Development and Characterization of a Piezoelectrically Actuated MEMS Digital Loudspeaker", Procedia Engineering 47, 2012, pp. 184-187.
(Continued)

*Primary Examiner* — Joshua Kaufman
(74) *Attorney, Agent, or Firm* — Perkins Coie LLP; Michael A. Glenn

(57) ABSTRACT

A MEMS includes a diaphragm, a stroke structure coupled to the diaphragm, and at least two piezoelectric actuators coupled to a plurality of mutually spaced-apart contact points of the stroke structure via a plurality of mutually spaced-apart connecting elements, the at least two piezoelectric actuators being configured to cause a stroke movement of the stroke structure so as to deflect the diaphragm.

15 Claims, 31 Drawing Sheets

(51) Int. Cl.
  *H04R 29/00* (2006.01)
  *H01L 41/09* (2006.01)

(56) References Cited

U.S. PATENT DOCUMENTS

| | | |
|---|---|---|
| 7,089,069 B2 | 8/2006 | Gabriel et al. |
| 8,280,079 B2 | 10/2012 | Kim et al. |
| 8,282,087 B2 | 10/2012 | Mayer et al. |
| 2004/0252936 A1 | 12/2004 | Despont et al. |
| 2006/0002652 A1 | 1/2006 | Yang et al. |
| 2010/0014143 A1 | 1/2010 | Kanno et al. |
| 2010/0149615 A1 | 6/2010 | Kotera et al. |
| 2010/0316242 A1 | 12/2010 | Ben et al. |
| 2011/0051985 A1* | 3/2011 | Hwang .......... H04R 17/00 381/396 |
| 2013/0156253 A1 | 6/2013 | Lemarquand et al. |
| 2013/0294636 A1 | 11/2013 | Cassett et al. |
| 2014/0177881 A1* | 6/2014 | Fanget .......... H04R 3/002 381/190 |

FOREIGN PATENT DOCUMENTS

| | | |
|---|---|---|
| CN | 101750735 B | 9/2013 |
| DE | 69938602 T2 | 7/2009 |
| EP | 2803633 A1 | 11/2014 |
| JP | 59139799 A | 8/1984 |
| JP | 2006351297 A | 12/2006 |

OTHER PUBLICATIONS

Glacer, et al., "Reversible acoustical transducers in MEMS technology", Proc. DTIP, 2013.

Shahosseini, et al., "Optimization and Microfabrication of High Performance Silicon-Based MEMS Microspeaker", IEEE Sensors journal 13, 2013, pp. 273-284.

Yi, et al., "Performance of packaged piezoelectric microspeakers depending on the material properties", PROC. MEMS, 2009, pp. 765-768.

* cited by examiner

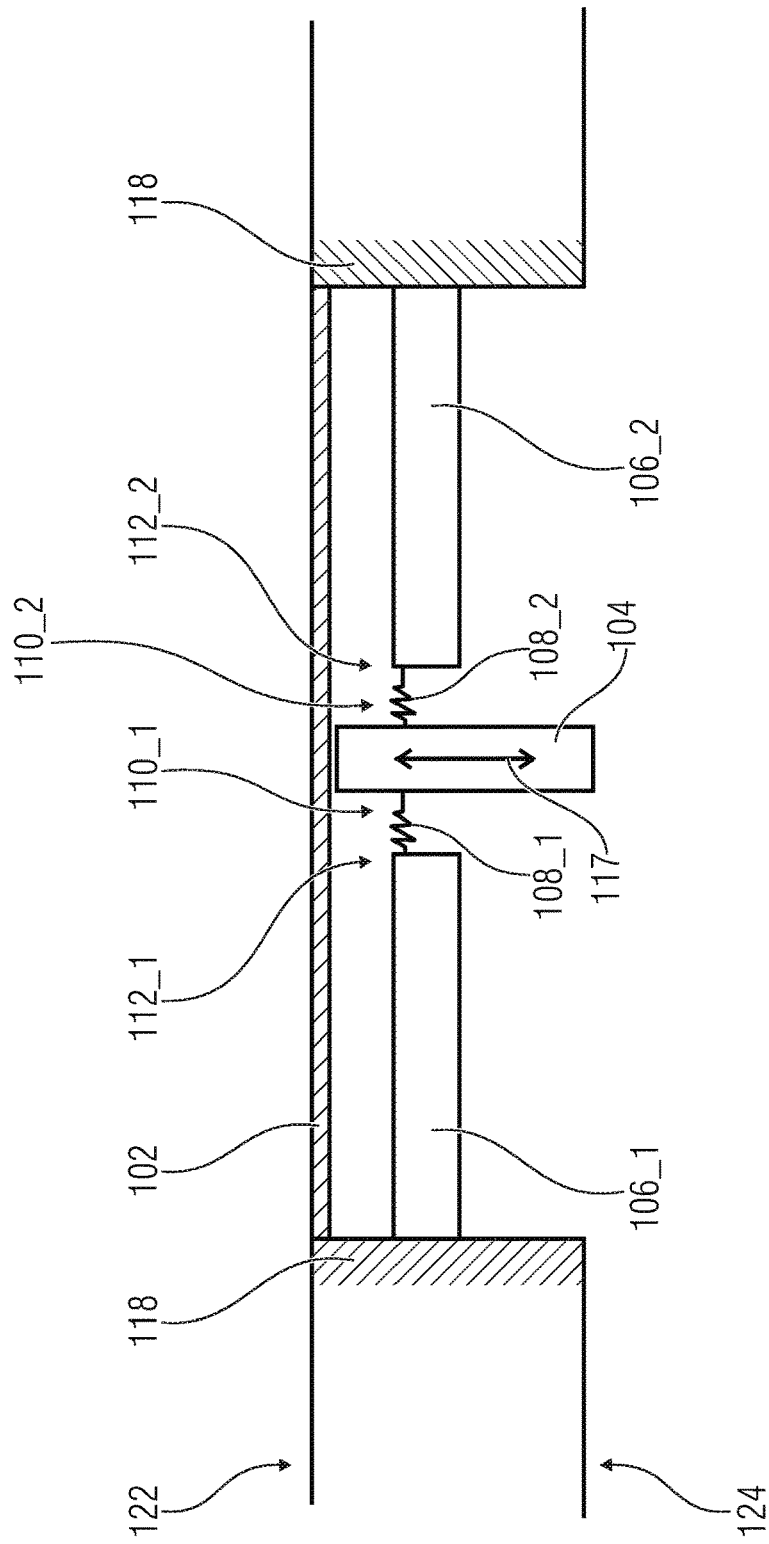

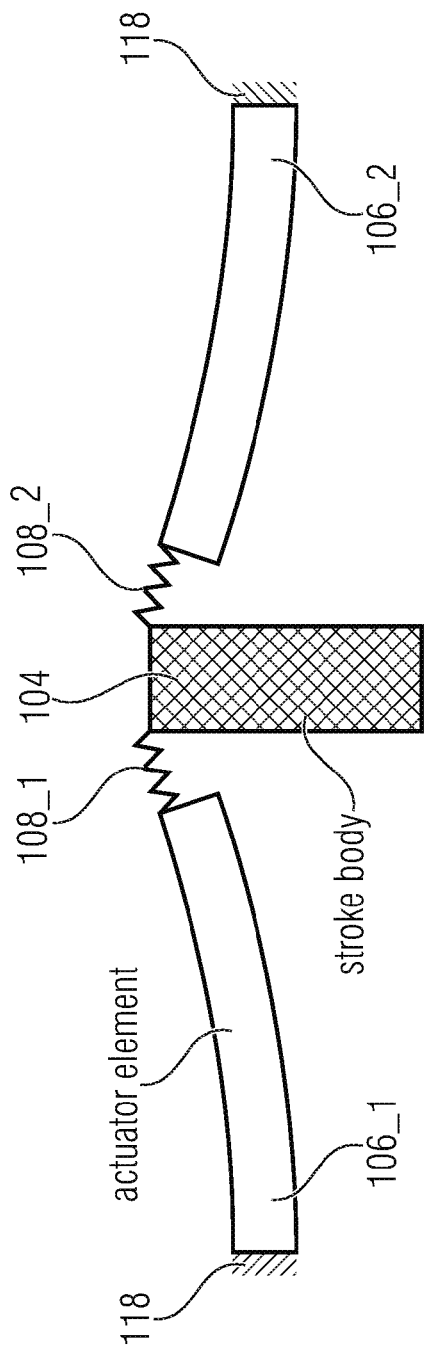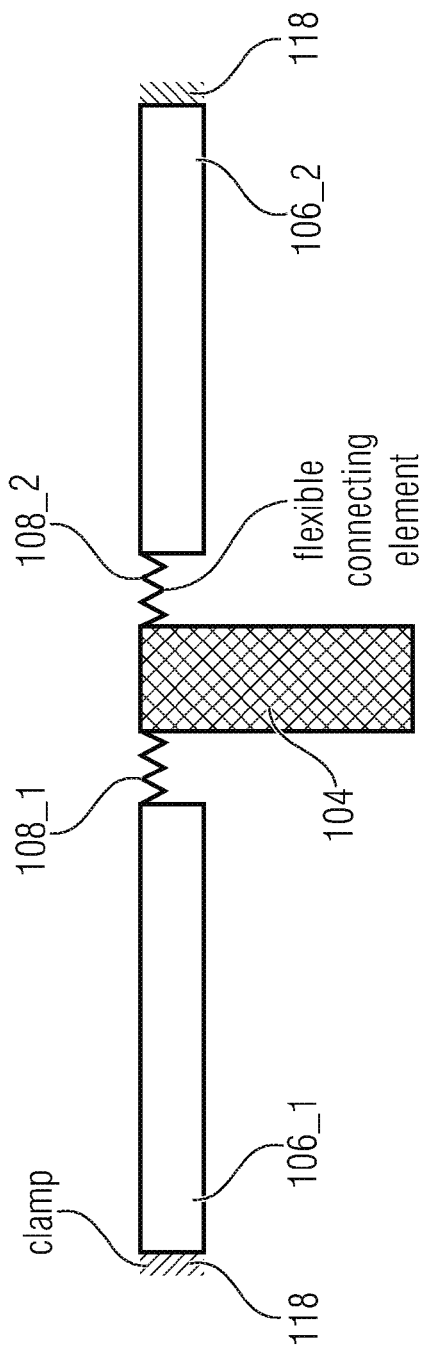
FIGURE 2A
FIGURE 2B

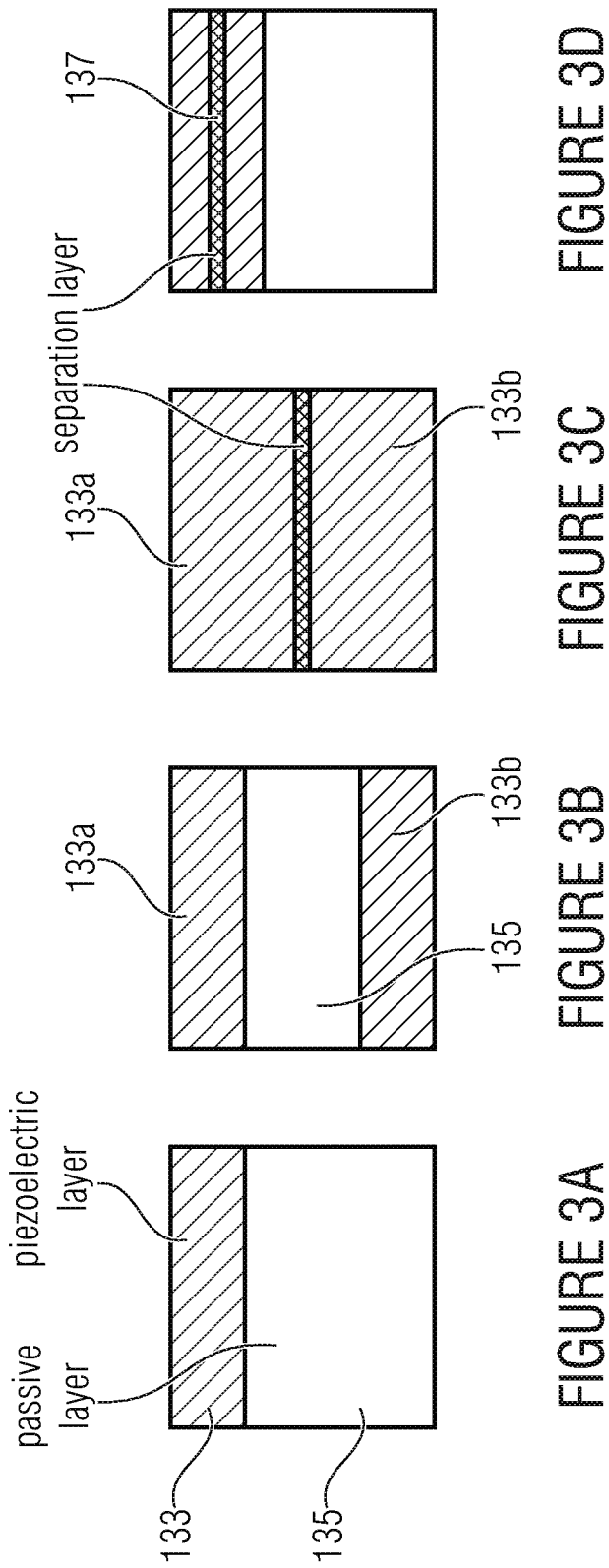

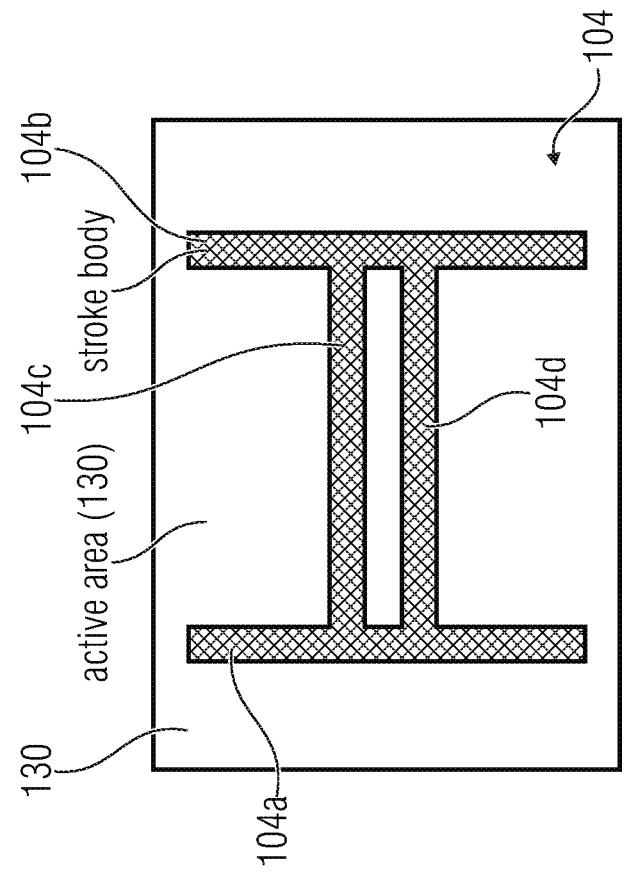
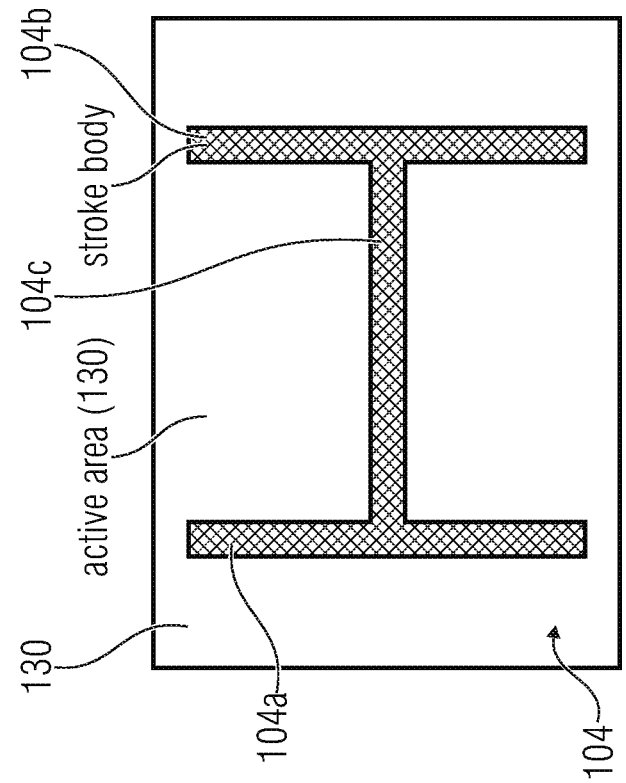
FIGURE 4A
FIGURE 4B

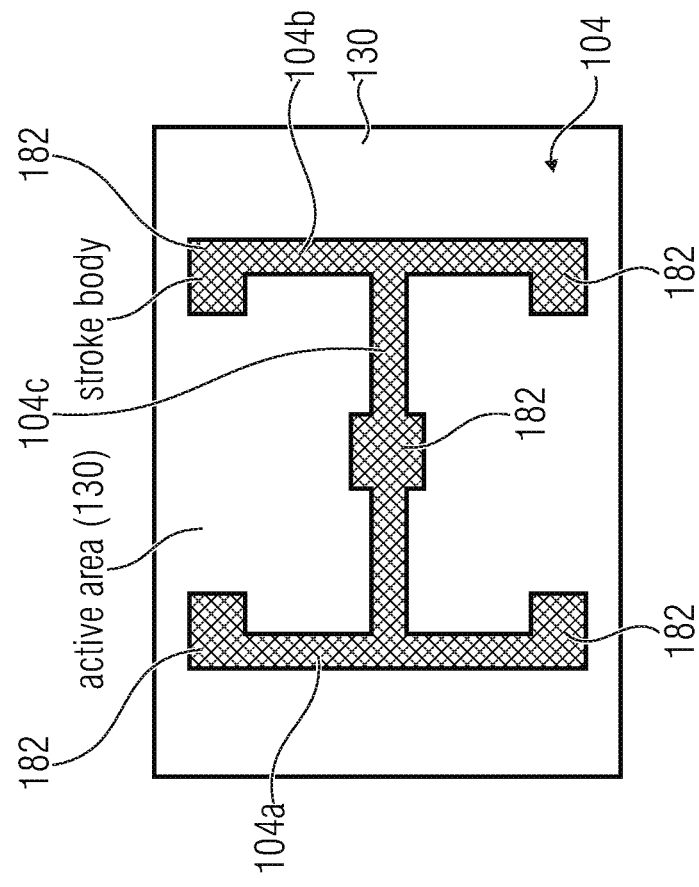
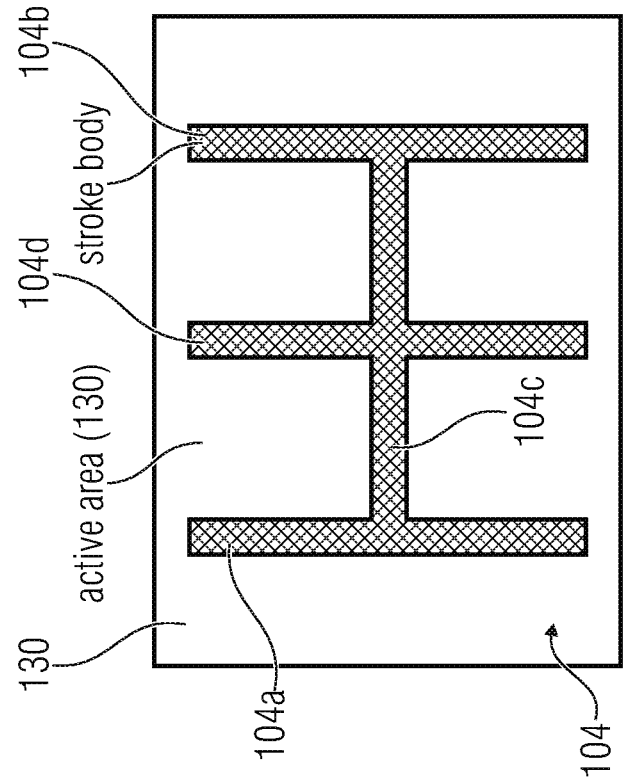

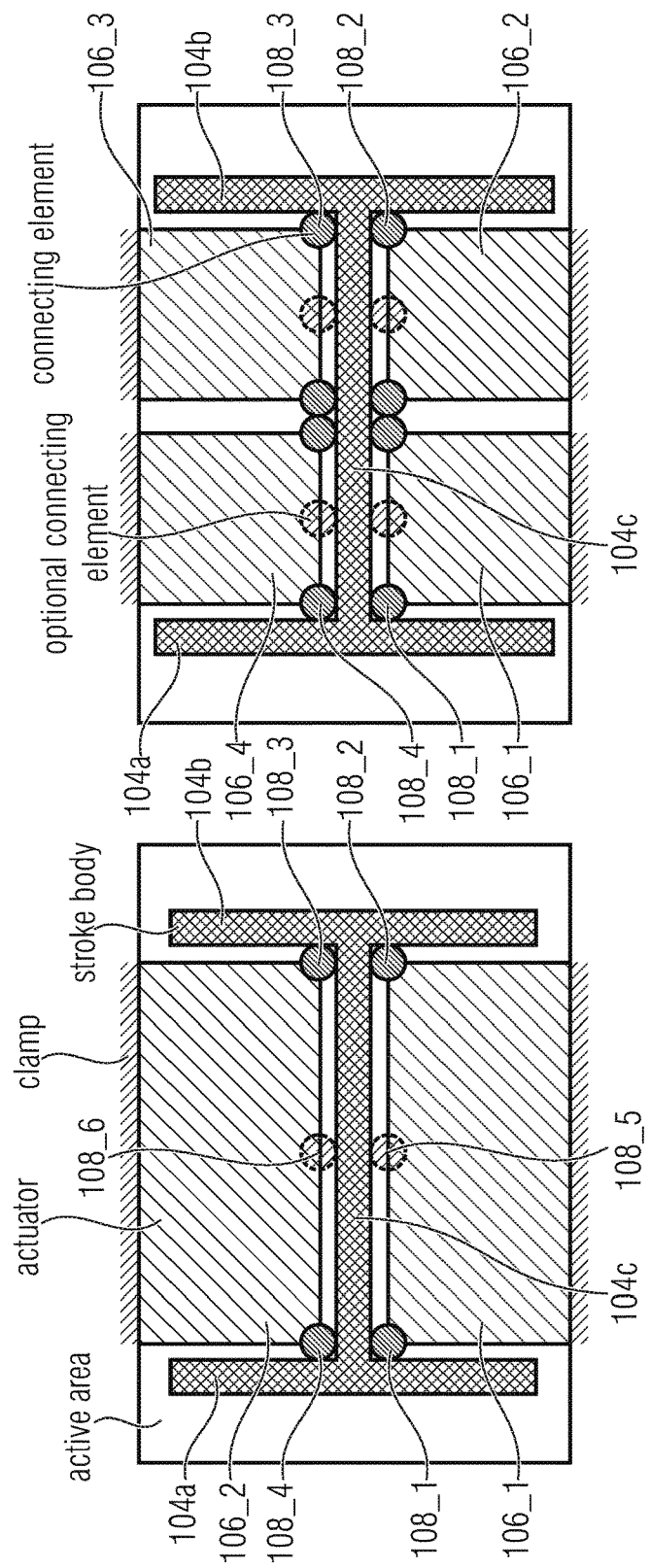

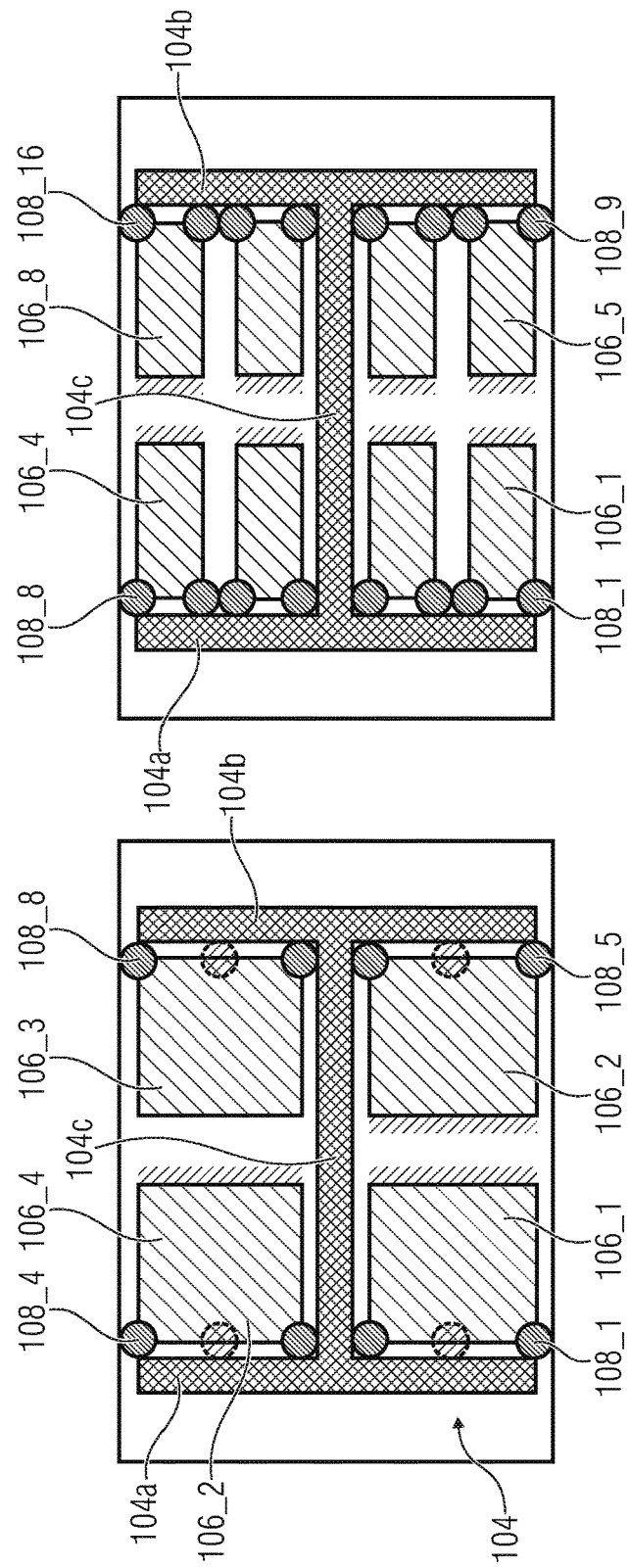

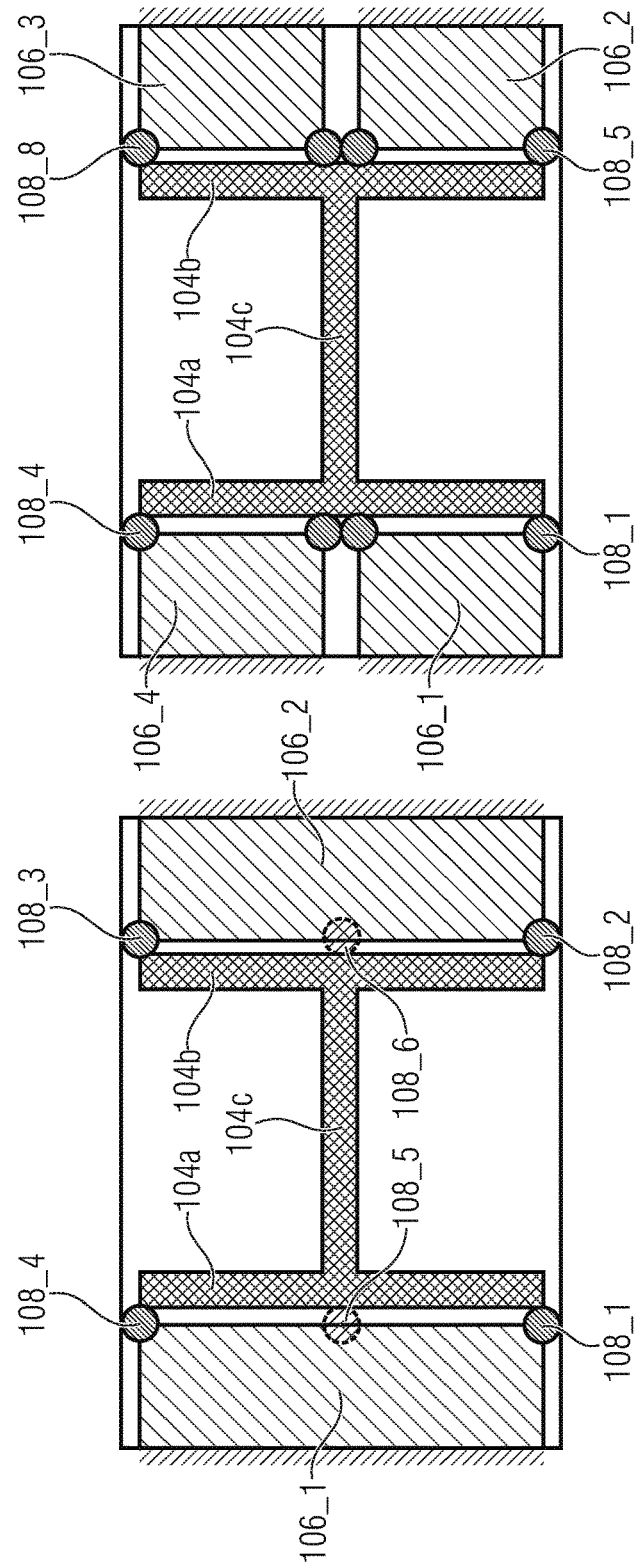

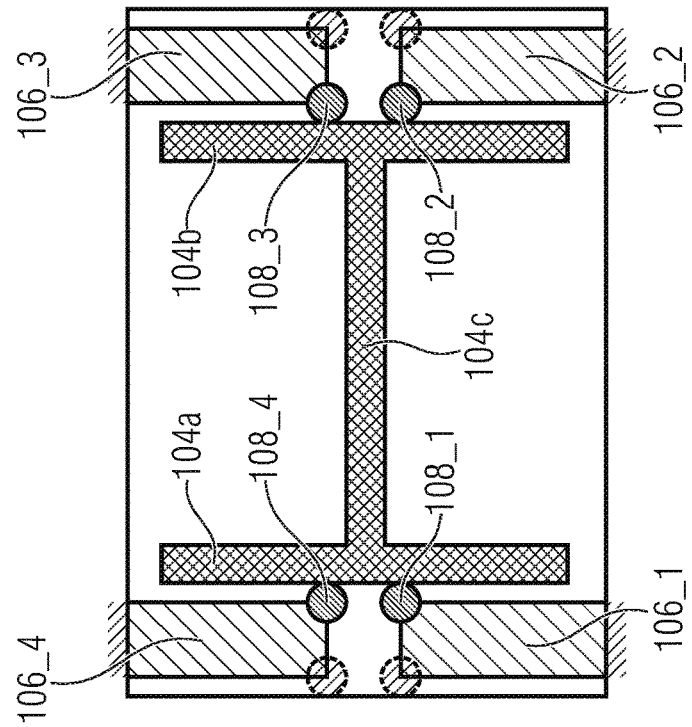
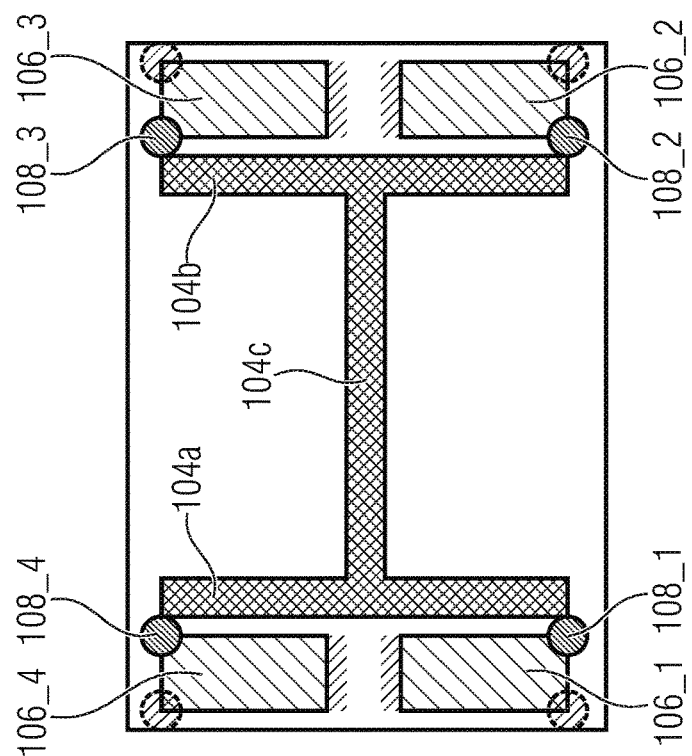

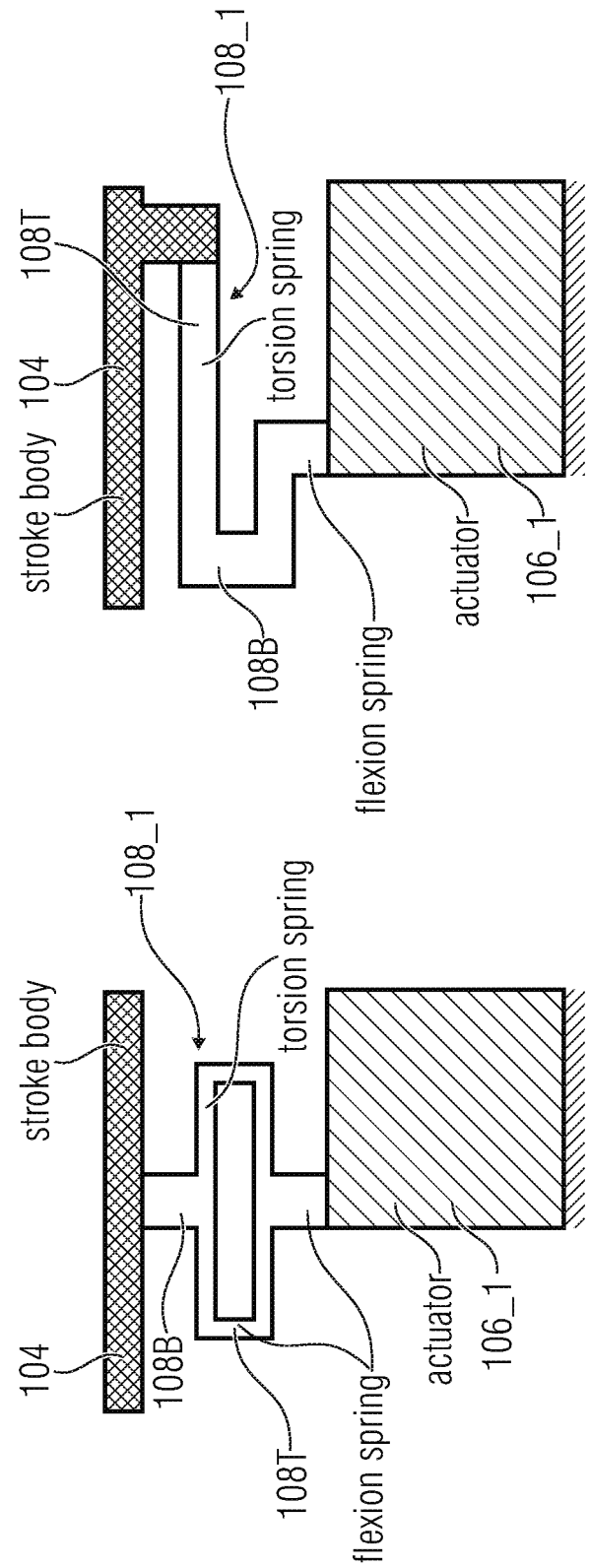

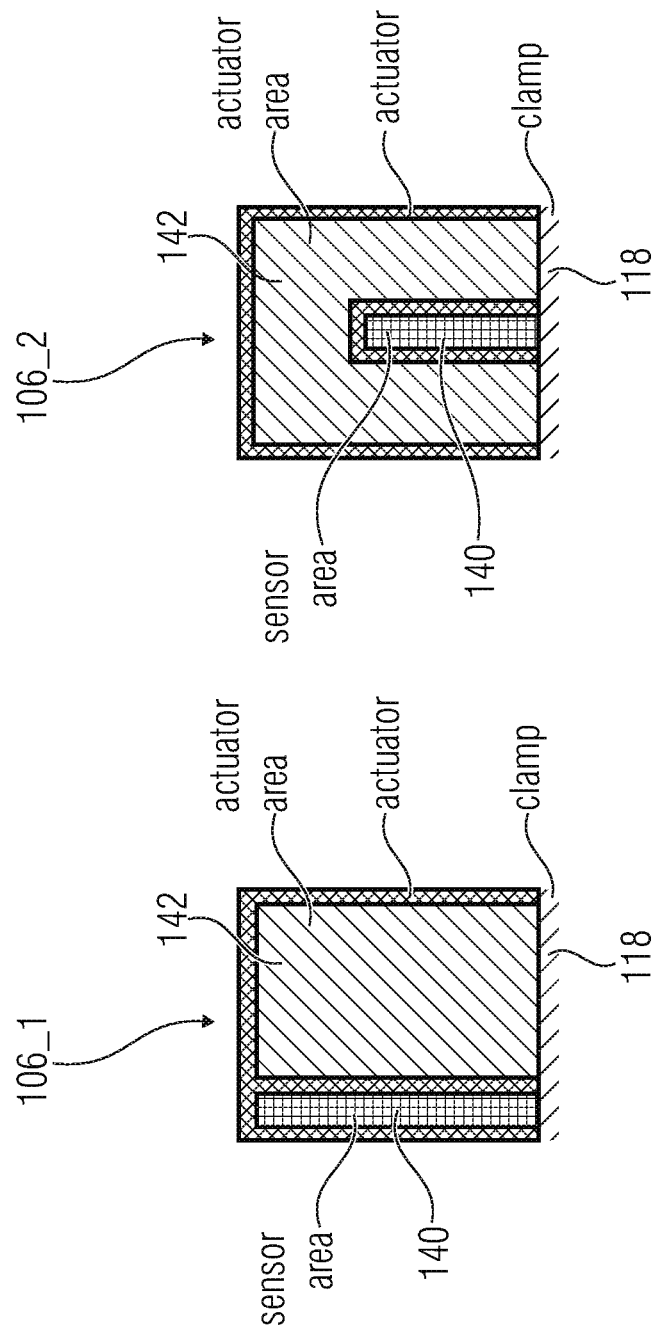

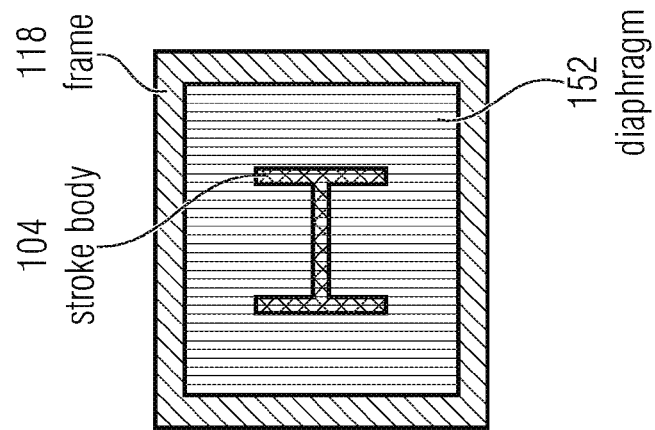
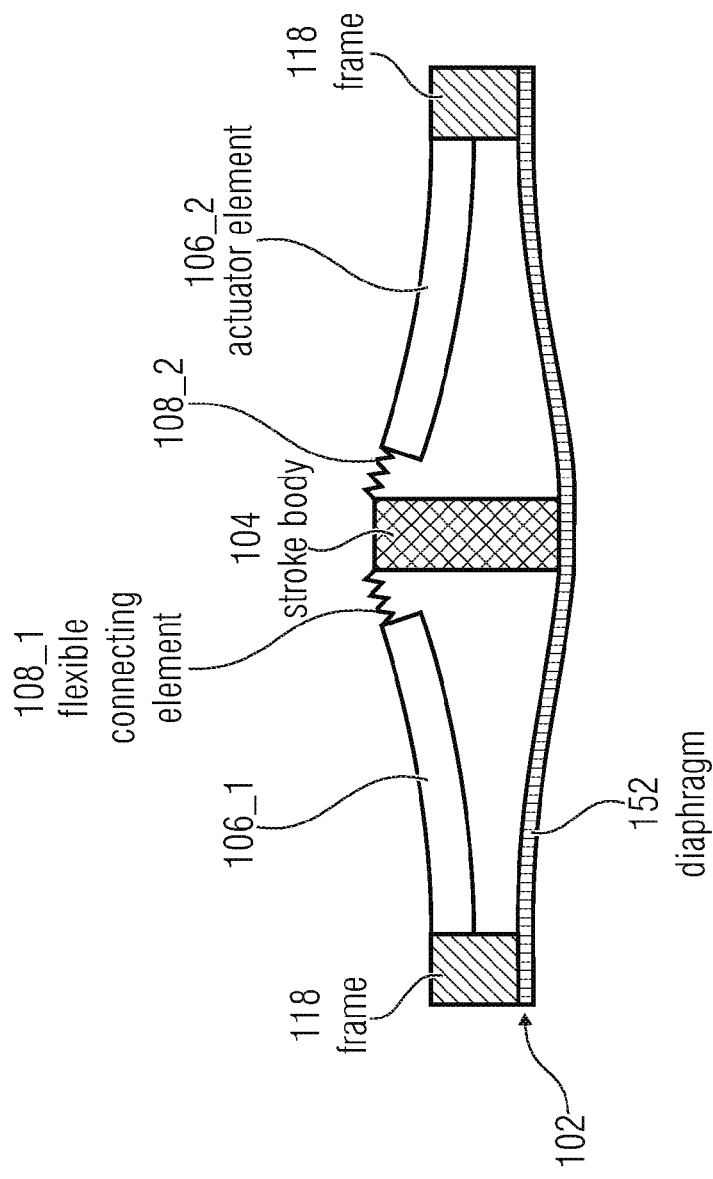
FIGURE 10B
FIGURE 10A

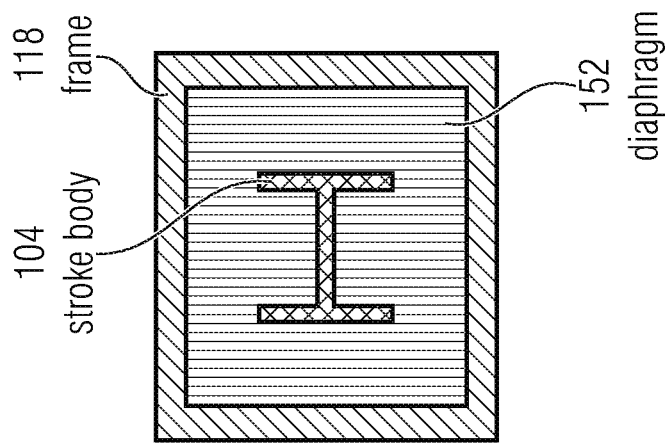
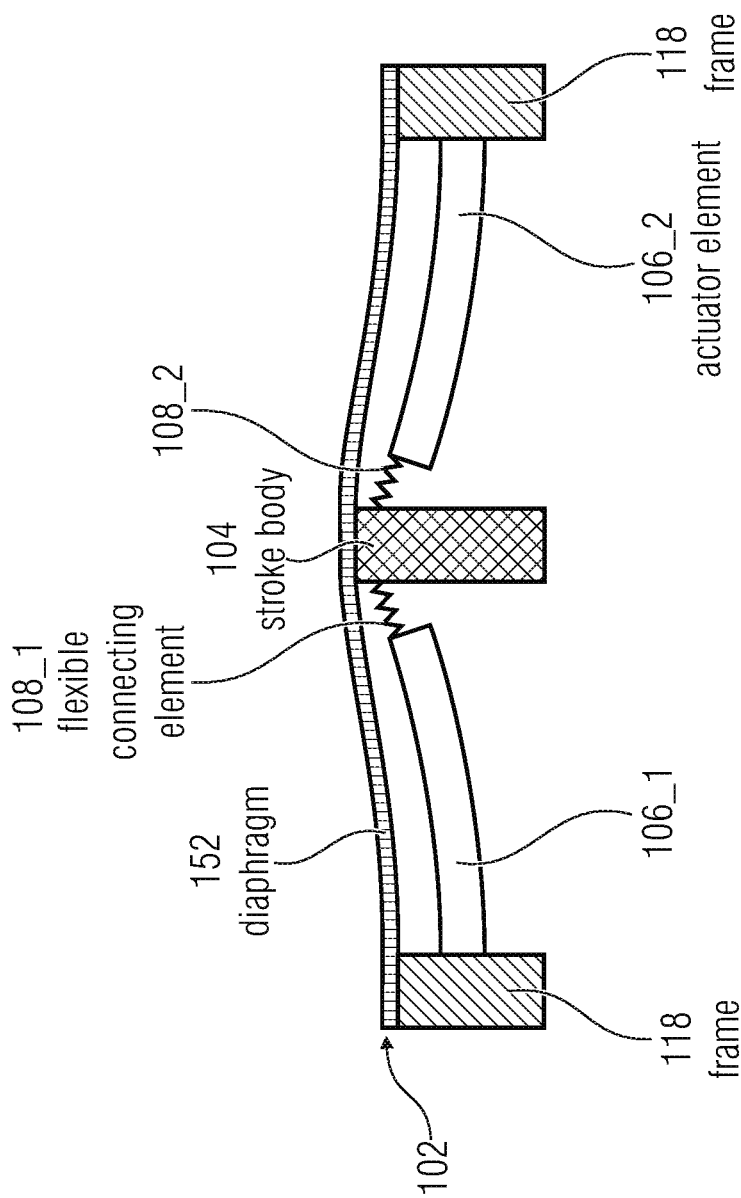
FIGURE 11B
FIGURE 11A

MICROMECHANICAL PIEZOELECTRIC ACTUATORS FOR IMPLEMENTING LARGE FORCES AND DEFLECTIONS

CROSS-REFERENCE TO RELATED APPLICATIONS

This application is a continuation of copending International Application No. PCT/EP2015/070124, filed Sep. 3, 2015, which is incorporated herein by reference in its entirety, and additionally claims priority from German Application No. 10 2014 217 798.7, filed Sep. 5, 2014, which is incorporated herein by reference in its entirety.

Embodiments of the present invention relate to a MEMS (micro-electromechanical system). Some embodiments relate to micromechanical piezoelectric actuators for implementing large forces and deflections. Further embodiments relate to a MEMS speaker for generating sound waves within the audible wavelength spectrum. Further embodiments relate to a system or a regulation unit regulated operation of a MEMS loudspeaker.

BACKGROUND OF THE INVENTION

In recent years, miniaturized actuators have increasingly gained importance and have become indispensable in many fields of application. By using suitable designs as well as drive arrangements (electrostatic, electromagnetic, thermoelectric, piezoelectric) it is possible to implement actuators having very different properties which cover a broad range of applications.

However, there is a fundamental problem in creating large forces at large deflections—a property that is essential, in particular, in the field of fluid displacement and MEMS loudspeakers. This is due to the fact that actuators having large deflections may use low spring rigidities, whereas high spring rigidities tend to be used for transmitting large forces. An exception to this is constituted by electrodynamic drives only, which can create comparatively large forces and strokes even at low spring constants since the force is created by means of the magnetic field.

In particular in acoustics, the majority of all structural components therefore are based on electrodynamic drives. A classic example are precision-engineered loudspeakers for mobile phones wherein sufficiently large strokes and forces for air displacement are generated by means of a moving coil which moves within a permanent magnetic field.

Disadvantages of these conventional electrodynamic loudspeakers are the high power consumption of approx. 1 watt due to the low efficiency as well as large acoustic distortions. A further disadvantage is the relatively large structural height of 3-4 mm.

By means of MEMS technology, said disadvantages (low efficiency, large structural height) can be overcome. However, there are no MEMS loudspeakers on the market, but merely a series of publications by research laboratories. In the US 2013/0156253 A1 and in literature [Shahosseini et al., Optimization and Microfabrication of High Performance Silicon-Based MEMS Microspeaker, IEEE Sensors journal, 13 (2013) 273-284], an electrodynamic MEMS loudspeaker is described which, however, involves hybrid integration of a permanent magnetic ring. The concept of piezoelectric MEMS loudspeakers was presented in U.S. Pat. Nos. 7,003, 125, 8,280,079, US 2013/0294636 A1 and in literature [Yi et al., Performance of packaged piezoelectric microspeakers depending on the material properties, Proc. MEMS 2009, 765-768] and [Dejaeger et al., Development and Characterization of a Piezoelectrically Actuated MEMS Digital Loudspeaker, Procedia Engineering 47 (2012) 184-187]. Therein, however, the piezoelectric materials such as PZT, AlN or ZnO have been directly applied onto the loudspeaker diaphragm, so that the properties of the drive and of the diaphragm are linked. A further piezoelectric MEMS loudspeaker comprising a plate-shaped body that is deflected out of the plane in the manner of a piston shape via a diaphragm and several actuators is presented in US 2011/0051985 A1. Digital MEMS loudspeakers based on arrays with electrostatically driven diaphragms, which however, can produce sufficiently high sound pressures only at high frequencies are described in U.S. Pat. No. 7,089,069, US 2010/0316242 A1 and in literature [Glacer et al., Reversible acoustical transducers in MEMS technology, Proc. DTIP 2013].

SUMMARY

According to an embodiment, a MEMS may have a diaphragm; a stroke structure coupled to the diaphragm; and at least two piezoelectric actuators coupled to a plurality of mutually spaced-apart contact points of the stroke structure via a plurality of mutually spaced-apart connecting elements; the at least two piezoelectric actuators being configured to cause a stroke movement of the stroke structure so as to deflect the diaphragm; and wherein each of the at least two piezoelectric actuators is connected to at least two mutually spaced-apart contact points of the stroke structure via at least two mutually spaced-apart connecting elements.

According to another embodiment, a system may have: an inventive MEMS; and a control means configured to control the at least two piezoelectric actuators of the MEMS; the MEMS including at least one piezoelectric position sensor configured to provide a sensor signal dependent on the deflection of the diaphragm; and the control means being configured to control the at least two piezoelectric actuators of the MEMS in a regulated manner on the basis of the sensor signal.

Another embodiment may have a utilization of the inventive MEMS for sound generation, for ultrasound generation, for displacing liquids, for displacing gasses, or for generating droplets of liquid.

According to another embodiment, a MEMS loudspeaker for generating sound waves within the audible wavelength spectrum may have: a diaphragm, a stroke structure coupled to the diaphragm, and at least two piezoelectric actuators, by means of which a stroke movement of the stroke structure can be caused for deflecting the diaphragm, characterized in that the piezoelectric actuators are connected to a plurality of mutually spaced-apart contact points of the stroke structure via a plurality of mutually spaced-apart flexible connecting elements, and that each of the at least two piezoelectric actuators is connected to at least two mutually spaced-apart contact points of the stroke structure via at least two mutually spaced-apart connecting elements.

According to another embodiment, a MEMS loudspeaker for generating sound waves within the audible wavelength spectrum may have: a diaphragm, a stroke structure coupled to the diaphragm, and at least one piezoelectric actuator by means of which a stroke movement of the stroke structure can be caused for deflecting the diaphragm, characterized in that the MEMS loudspeaker includes at least one position sensor configured to provide a sensor signal dependent on the deflection of the diaphragm, and that each of the at least two piezoelectric actuators is connected to at least two mutually spaced-apart contact points of the stroke structure via at least two mutually spaced-apart connecting elements.

According to another embodiment, a regulating unit for operating a MEMS loudspeaker in a regulated manner may have: an inventive MEMS loudspeaker, and a control means configured to control a piezoelectric actuator of the MEMS loudspeaker, characterized in that the MEMS loudspeaker includes at least one piezoelectric position sensor configured to provide the control means with a sensor signal dependent on the deflection of a diaphragm of the MEMS loudspeaker, and in that the control means is configured to control the at least one piezoelectric actuator of the MEMS loudspeaker in a regulated manner on the basis of the sensor signal.

Embodiments of the present invention provide a MEMS comprising a diaphragm, a stroke structure (lifting structure) coupled to the diaphragm, and at least two piezoelectric actuators coupled to a plurality of mutually spaced-apart contact points of the stroke structure via a plurality of mutually spaced-apart connecting elements, the at least two piezoelectric actuators being configured to cause a stroke movement (lifting movement) of the stroke structure so as to deflect the diaphragm.

In accordance with the concept of the present invention, the MEMS (microsystem) comprises, for exciting a diaphragm, a stroke body (lifting body) and at least two piezoelectric actuators, the at least two actuators being connected to a plurality of mutually spaced-apart contact points of the stroke structure via a plurality of mutually spaced-apart connecting elements. Due to the fact that the MEMS comprises at least two piezoelectric actuators connected to the stroke structure via a plurality of connecting elements, it is possible to transmit large forces and deflections to the diaphragm via the stroke structure at the same time. Due to the fact that the plurality of connecting elements and, thus, also the plurality of contact points are mutually spaced apart, it can be ensured or guaranteed that the stroke structure performs the stroke movement in a reproducible and uniform manner and does not deviate, for example, from a desired direction of the stroke movement, as would be the case, for example, in the event of tilting modes occurring.

Further embodiments relate to a MEMS loudspeaker comprising a diaphragm, a stroke structure coupled to the diaphragm, and at least two piezoelectric actuators coupled to a plurality of mutually spaced-apart contact points of the stroke structure via a plurality of mutually spaced-apart connecting elements, the at least two piezoelectric actuators being configured to cause a stroke movement of the stroke structure so as to deflect the diaphragm. The connecting elements are configured to be flexible. Thus, they can deform in a reversible manner.

According to the above description, the stroke structure thus comprises several contact points. They are mutually spaced apart, in particular, in the transverse and/or longitudinal directions of the actuator. Each of said contact points has one connecting element attached therein which flexibly, or elastically, connects the respectively associated actuator to the stroke structure.

In accordance with the concept of the present invention, the MEMS loudspeaker (microsystem) comprises, for exciting a diaphragm, a stroke body and at least two piezoelectric actuators, the at least two actuators being connected to a plurality of mutually spaced-apart contact points of the stroke structure via a plurality of mutually spaced-apart connecting elements. Due to the fact that the MEMS loudspeaker comprises at least two piezoelectric actuators connected to the stroke structure via a plurality of connecting elements, it is possible to transmit large forces and deflections to the diaphragm via the stroke structure at the same time. Due to the fact that the plurality of connecting elements and, thus, also the plurality of contact points are mutually spaced apart, it can be ensured or guaranteed that the stroke structure performs the stroke movement in a reproducible and uniform manner and does not deviate, for example, from a desired direction of the stroke movement, as would be the case, for example, in the event of tilting modes occurring.

Thus, what is proposed is a MEMS loudspeaker for generating sound waves within the audible wavelength spectrum which comprises a diaphragm, a stroke structure coupled to the diaphragm, and at least two piezoelectric actuators by means of which a stroke movement of the stroke structure can be caused for deflecting the diaphragm. The piezoelectric actuators are connected to a plurality of mutually spaced-apart contact points of the stroke structure via a plurality of mutually spaced-apart and flexible connecting elements.

It is advantageous for the connecting elements associated with one of the two actuators to be mutually spaced apart in the transverse direction of the actuator and/or of the MEMS sound transducer.

It is advantageous for the diaphragm to be connected to the stroke structure at a front end of the stroke structure in a direct manner, and/or for the piezoelectric actuators to be connected to the stroke structure on at least one side face of the stroke structure, in particular on two opposite side faces, in an indirect manner, namely via the connecting elements. In a cross-sectional view of the MEMS loudspeaker, the front end of the stroke structure is thus oriented in the z direction, i.e. in the stroke direction (lifting direction). The side faces of the stroke structure, in contrast, are aligned in the transverse direction, i.e. perpendicularly to the stroke axis (lifting axis).

In an advantageous further development of the invention, several mutually spaced-apart connecting elements are connected to several mutually spaced-apart contact points of the at least two piezoelectric actuators.

Moreover, it is advantageous for each of the at least two piezoelectric actuators to be connected to at least two mutually spaced-apart contact points of the stroke structure via at least two mutually spaced-apart connecting elements.

In addition, it is advantageous for the stroke structure to be coupled to the diaphragm via a plurality of regions—i.e. in several regions. Said regions are advantageously arranged with the diaphragm along at least two straight lines or curves that are at least partially spaced-apart from one another.

It is advantageous for the stroke structure to be coupled to the diaphragm via a plurality of regions that are arranged in a distributed and/or mutually spaced-apart manner.

Similarly, it is advantageous for the stroke structure to comprise a plurality of mutually connected beams, each of which is coupled to the diaphragm at least partially at a front end. Thus, the stroke structure includes several beam-shaped parts. The latter are advantageously arranged in a mutually perpendicular manner in a top view. In addition, the stroke structure is advantageously configured to be in one piece.

It is advantageous for the at least two piezoelectric actuators to be implemented as bending beams (cantilevers). Thus, they are advantageously implemented in a rectilinear manner.

Moreover, the actuators advantageously comprise a fixed end, which is directly connected, in particular, to the carrier substrate, and a movable end that is advantageously indirectly connected to the stroke structure—namely via the at least one flexible, or elastic, connecting element.

It is advantageous for the actuator to have a larger width than length.

In addition, it is advantageous for the at least two piezoelectric actuators to be arranged, in a cross-sectional view of the MEMS loudspeaker, within a first plane in an idle position, or zero position, for the diaphragm to be arranged within a second plane spaced apart from the former in the stroke direction, and/or for the stroke structure to extend in the stroke direction, starting from the diaphragm, in the direction of the second plane, in particular as far as or beyond the latter.

It is advantageous for at least one of the connecting elements to comprise or to be implemented, at least partially, as a spring element. The connecting element may thus deform in a flexible, or elastic, manner. As a result, the maximum stroke of the diaphragm may be increased as compared to the maximum actuator stroke since the diaphragm can flexibly oscillate beyond the actuator stroke due to the spring element.

In order to be able to avoid tilting of the diaphragm it is advantageous for the spring element, in particular each one, to include at least one flexion spring element, at least one torsion spring element, and/or a combination of at least one flexion spring element and at least one torsion spring element, or to be implemented in this manner.

It is advantageous for the piezoelectric actuators to comprise, in a cross-sectional view of the MEMS loudspeaker, a fixedly clamped first end and a movable second end, respectively, along their longitudinal axes.

Moreover, it is advantageous for the flexion spring element to extend in the longitudinal direction, and/or for the torsion spring element to extend in the transverse direction, of the piezoelectric actuator.

Furthermore, it is advantageous for the flexion spring element and the torsion spring element of a connecting element to be rotated by 90° in relation to each other in a top view of the MEMS loudspeaker.

Also, it is advantageous for the flexion spring element to be directly connected to the actuator and/or to be formed in one piece with same. Moreover, it is advantageous for the torsion spring element to be arranged, in the direction of the flux of force, between the flexion spring element and the stroke structure.

It is advantageous for the diaphragm to comprise a rigid region and a flexible region. Advantageously, the stroke structure is coupled to the rigid region of the diaphragm, the rigid region of the diaphragm being formed, in particular, by an extended stroke structure.

In an advantageous further development of the invention, the MEMS loudspeaker comprises at least one piezoelectric position sensor. The latter is advantageously configured to provide a sensor signal dependent on the deflection of the diaphragm.

In addition, it is advantageous for at least one of the piezoelectric actuators to be configured as a piezoelectric position sensor.

Similarly, it is advantageous for the MEMS loudspeaker to comprise at least four piezoelectric actuators, two of the at least four piezoelectric actuators being configured as piezoelectric position sensors. In addition, said at least four piezoelectric actuators are advantageously arranged symmetrically with respect to a center of gravity of the MEMS loudspeaker in such a manner that the two piezoelectric actuators configured as piezoelectric position sensors and the remaining piezoelectric actuators each are arranged symmetrically with respect to the center of gravity of the stroke structure.

It is advantageous for the MEMS loudspeaker to comprise at least one stack of two mutually insulated piezoelectric layers, one of the two layers forming the at least one piezoelectric sensor, and the other one of the two layers forming one of the at least two piezoelectric actuators.

Moreover, it is advantageous for the two mutually insulated piezoelectric layers to comprise different materials.

Advantageously, the piezoelectric position sensor and one piezoelectric actuator of the at least two piezoelectric actuators are formed by a common piezoelectric layer.

In addition, it is advantageous for the MEMS loudspeaker to comprise at least one piezoresistive or one capacitive position sensor that is configured to provide a sensor signal dependent on the deflection of the diaphragm.

It is also advantageous for the stroke structure to comprise a plurality of stroke bodies and/or for at least two stroke bodies of the plurality of stroke bodies to be connected to one another via an extended stroke body.

It is advantageous for the MEMS loudspeaker to comprise a cavity. The latter is advantageously configured at least partially by a carrier substrate of the MEMS loudspeaker, which carrier substrate has the shape of a frame, in particular. Moreover, the cavity is advantageously arranged on that side of the diaphragm which faces the actuators and/or the stroke structure.

It is advantageous for the carrier substrate and the stroke structure to be formed of the same material and/or of the same base body.

Advantageously, the stroke structure is directly connected to the diaphragm. In addition, it is advantageous for the stroke structure to be indirectly connected to the at least one actuator.

The indirect connection between the stroke structure and the actuator is advantageously configured by means of the flexible and/or elastic connecting element.

It is advantageous for the actuators to be spaced apart from the diaphragm in the stroke direction, or z direction.

In addition, it is advantageous for the actuators and the diaphragm to be aligned in a mutually parallel manner in their neutral positions.

Further embodiments relate to a MEMS loudspeaker for generating sound waves within the audible wavelength spectrum with a diaphragm. The diaphragm is advantageously attached, in its edge region and/or in the z direction, to a substrate frame such that it is able to oscillate. The substrate frame is advantageously made of silicon. In addition, the MEMS loudspeaker advantageously includes a cavity. Also, the MEMS loudspeaker includes a stroke structure coupled to the diaphragm. The stroke structure thus is attached to the diaphragm in a advantageously direct and fixed manner, in particular on a side of the diaphragm which faces the cavity. Advantageously, it is only in a subregion of the diaphragm that the stroke structure is connected to the latter in a two-dimensional manner latter. The MEMS loudspeaker includes at least one piezoelectric actuator by means of which a stroke movement of the stroke structure can be caused for deflecting the diaphragm. Thus, the actuator is directly or indirectly connected to the stroke structure, in particular via at least one elastic, or flexible, connecting element. In addition, the actuator is indirectly coupled to the diaphragm, namely via the stroke structure. The cavity of the MEMS loudspeaker is arranged on the stroke-structure side of the diaphragm. Advantageously, the cavity is at least partially configured by a hollow space of the substrate frame. In addition, the diaphragm advantageously extends across one of the two openings of the substrate frame.

The MEMS loudspeaker comprises at least one position sensor configured to provide a sensor signal dependent on the deflection of the diaphragm. Thus, the position, or deflection, of the diaphragm is directly and/or indirectly detectable by means of the position sensor, i.e. in particular indirectly via the stroke-structure position.

The position sensor and/or the actuator are arranged, advantageously in the z direction, inside the hollow space and/or at the second opening, facing away from the diaphragm, of the hollow space. The stroke structure extends advantageously in the z direction, starting from the diaphragm, at least as far as the actuator and/or the position sensor.

Embodiments of the present invention provide for a MEMS loudspeaker comprising at least two piezoelectric actuators connected to a plurality of mutually spaced-apart contact points of the stroke structure via a plurality of mutually spaced-apart connecting elements, the at least two piezoelectric actuators being configured to cause a stroke movement of the stroke structure so as to deflect the diaphragm. The connecting elements are advantageously configured to be flexible. Thus, they can deform in a reversible manner.

It is advantageous for the actuator to be operable in a regulated manner as a function of the sensor signal by means of a control means provided for this purpose. To this end, the diaphragm is deflected via the actuator, and/or its position or deflection in the z direction is detected by means of the position sensor. The electronic input signal detected by the position sensor is conveyed to the control means. On the basis of this input signal, the control means determines the actual position, or actual deflection, of the diaphragm. To this end, it takes into account, in particular, the elastic oscillation properties of a connecting element, which advantageously connects a free end of the in particular beam-shaped position sensor to the stroke structure. As a function of this detected actual position of the diaphragm, the control means determines a desired target position of the diaphragm and/or an electronic output signal dependent thereon. The output signal is conveyed to the actuator, which deflects the diaphragm accordingly. During and/or at the end of the deflection movement, the actual position of the diaphragm is detected again via the position sensor and is possibly again and/or iteratively readjusted, or adjusted, in accordance with the above description.

In an advantageous further development of the invention, the MEMS loudspeaker comprises at least one piezoelectric and/or capacitive position sensor.

It is advantageous for the position sensor to be integrated in the actuator. Thus, the actuator and the position sensor form a unit, or an actuator/sensor element. Thus, the deflection of the actuator can be directly detected via the position sensor.

Moreover, it is advantageous for the sensor electrodes of the integrated position sensor to be configured as two-dimensional (flat) or interdigital electrodes and/or to be electrically insulated from the actuator electrodes.

In this respect, it is advantageous for the piezoelectric position sensor and the piezoelectric actuator to be configured by a common piezoelectric layer.

Furthermore, it is advantageous for the common piezoelectric layer to comprise a sensor area forming the position sensor and an actuator area forming the actuator, which is electrically insulated from the former, in particular, the sensor area advantageously taking up a smaller surface area as compared to the actuator area.

Alternatively, it is also advantageous for the piezoelectric position sensor and the piezoelectric actuator to be configured by a separate piezoelectric layer, respectively. In this respect, the actuator thus advantageously comprises a stack of at least two mutually insulated piezoelectric layers, at least part of the one layer of which forms the at least one piezoelectric position sensor, and at least part of the other layer forms the at least one piezoelectric actuator.

Moreover, it is advantageous for the stack to be oriented in the direction of the stroke axis, so that the piezoelectric layers are arranged one above the other. Alternatively, it is advantageous for the stack to be oriented transversely to the stroke axis, so that the piezoelectric layers are arranged adjacently to one another.

In addition, it is advantageous for the two mutually insulated piezoelectric layers to comprise different materials, advantageously the layer forming the actuator consisting of PZT, and the layer forming the position sensor consisting of AlN.

As an alternative to the integrative solution it is also advantageous for the position sensor and the at least one actuator to be separate from each other. The position sensor and the associated actuator are thus configured by two mutually separate, or individual, components and/or piezo elements, in particular bending beams.

Also, it is advantageous for the MEMS loudspeaker to comprise several actuators, at least one of which can be used as a position sensor. The position sensor thus comprises essentially the same physical features as compared to the actuator. As a physical distinguishing feature, they are advantageously configured in a mutually mirror-inverted manner only. The actuator used as an actuator and the position sensor used as a position sensor thus differ from each other merely by a functional feature since the actuator is actively deflectable by applying a voltage, and the position sensor in contrast is able to generate a voltage by the passive deflection. Here, the voltage generated via the direct piezoelectric effect, which voltage is approximately proportional to the deflection of the stroke structure, can advantageously be tapped via an actuator electrode and/or be evaluated by the control means provided for this purpose.

Similarly, it is advantageous for several actuators and/or position sensors to be arranged opposite one another in pairs, the MEMS loudspeaker advantageously comprising at least four piezoelectric actuators arranged symmetrically with respect to the center of gravity of the stroke structure, and/or two of the at least four piezoelectric actuators being configured as piezoelectric position sensors.

It is advantageous for the at least one actuator and/or position sensor to be connected to the stroke structure via at least one, in particular flexible, connecting element. Thus, the actuator and/or the position sensor is indirectly connected to the diaphragm via the at least one interposed connecting element and via the interposed stroke structure.

Similarly, it is advantageous for the MEMS loudspeaker to comprise advantageously at least two piezoelectric actuators which are connected to a plurality of mutually spaced-apart contact points of the stroke structure via a plurality of mutually spaced-apart connecting elements.

Moreover, it is advantageous for the diaphragm to be connected to the stroke structure at a front end of the stroke structure in a direct manner, and/or for the piezoelectric actuators and/or position sensors to be connected to the stroke structure on at least one side face of the stroke structure, in particular on two opposite side faces, in an indirect manner via the connecting elements.

It is advantageous for the plurality of connecting elements that are mutually spaced apart in particular in the transverse direction of the MEMS loudspeaker to be connected to a plurality of mutually spaced-apart contact points of the at least two piezoelectric actuators and/or position sensors.

Also, it is advantageous for each of the at least two piezoelectric actuators and/or position sensors to be connected to at least two mutually spaced-apart contact points of the stroke structure via at least two mutually spaced-apart connecting elements.

It is advantageous for the stroke structure to be coupled to the diaphragm via a plurality of regions arranged with the diaphragm along at least two straight lines or curves that are at least partially spaced-apart from one another.

Also, it is advantageous for the stroke structure to span, perpendicularly to a direction of the stroke movement, a surface area which corresponds to at least 30% of a surface area of the diaphragm.

It is advantageous for the stroke structure to be coupled to the diaphragm via a plurality of regions arranged in a distributed manner.

Similarly, it is advantageous for the stroke structure to comprise an I structure, an L structure, an H structure, an X structure, an O structure, or a cross-shaped structure within a sectional plane which runs perpendicularly to a direction of the stroke movement.

It is advantageous for a lever arm disposed between one of the points of application of force of the stroke structure to the diaphragm and a nearest location point of a diaphragm suspension to be half the size, at the most, of a lever arm of the at least two piezoelectric actuators.

Moreover, it is advantageous for a cross-sectional area of the stroke structure that is perpendicular to a direction of the stroke movement (z direction) of the stroke structure to be smaller than a sum of piezoelectrically active actuator areas and/or position sensors of the at least two piezoelectric actuators.

It is advantageous for the stroke structure to comprise a plurality of mutually connected beams, each of which is coupled to the diaphragm at least partially at a front end.

Similarly, it is advantageous for the actuator and/or the position sensor to be configured as a bending beam. Also, it is advantageous for the at least two piezoelectric actuators and/or position sensors to be configured as bending beams.

Also, it is advantageous for the stroke structure to be symmetrical and/or for the at least two piezoelectric actuators and/or position sensors to be arranged symmetrically with respect to a center of gravity of the stroke structure.

It is advantageous for the plurality of mutually spaced-apart contact points of the stroke structure to be arranged symmetrically with respect to the center of gravity of the stroke structure.

Also, it is advantageous for the at least two piezoelectric actuators and/or position sensors to be arranged within a first plane in an idle position, for the diaphragm to be arranged within a second plane spaced apart from the former in the stroke direction, and/or for the stroke structure to extend in the stroke direction, starting from the diaphragm, in the direction of the second plane, in particular as far as or beyond the latter.

It is advantageous for at least one of the connecting elements to comprise a spring element and/or to be configured as such. Also, it is advantageous for the spring element, in particular each spring element, to include at least one flexion spring element and/or at least one torsion spring element.

Also, it is advantageous for the piezoelectric actuators and/or position sensors to comprise, in a cross-sectional view of the MEMS loudspeaker, a fixedly clamped first end and a movable second end, respectively, along their longitudinal axes, and/or for the flexion spring element to extend in the longitudinal direction, and/or for the torsion spring element to extend in the transverse direction, of the piezoelectric actuator and/or position sensor. Advantageously, the flexion spring element is configured such that it is bendable about its transverse axis. Advantageously, the torsion spring element is configured such that it is bendable about its longitudinal axis.

It is advantageous for the flexion spring element and the torsion spring element of a connecting element to be rotated by 90° in relation to each other in a top view of the MEMS loudspeaker.

Similarly, it is advantageous for the diaphragm to extend in parallel with a first surface and a second surface of the MEMS loudspeaker, the diaphragm being configured to separate, when the MEMS loudspeaker is used as intended, the first surface and the second surface of the MEMS loudspeaker from each other in a fluidic and/or gas-shaped manner.

It is advantageous for the diaphragm to comprise a rigid region and a flexible region, the stroke structure being coupled to the rigid region of the diaphragm, the rigid region of the diaphragm advantageously being formed, in particular, by an extended stroke structure.

Similarly, it is advantageous for the stroke structure to comprise silicon and/or to be produced, with the substrate frame, from the same base body.

Also, it is advantageous for the stroke structure to comprise at least three portions arranged to form an H-shaped stroke structure, so that the stroke structure is H-shaped within the sectional plane that runs perpendicularly to the direction of the stroke movement of the stroke structure.

It is advantageous for a first piezoelectric actuator of the at least two piezoelectric actuators to be arranged, outside the H-shaped stroke structure, along a first portion of the three portions of the stroke structure, and for a second piezoelectric actuator of the at least two piezoelectric actuators to be arranged, outside the H-shaped stroke structure, along a second portion of the three portions of the stroke structure, the first portion and the second portion of the stroke structure extending in parallel with each other.

It is advantageous for a third piezoelectric actuator of the at least two piezoelectric actuators to be at least partly arranged, inside the H-shaped stroke structure, along a first side of a third portion of the three portions of the stroke structure. Also, it is advantageous for a fourth piezoelectric actuator of the at least two piezoelectric actuators to be at least partly arranged, inside the H-shaped stroke structure, along a second side, located opposite the first side, of the third portion of the stroke structure, the third portion extending perpendicularly to the first portion and the second portion.

Also, it is advantageous for the first piezoelectric actuator to extend at least over the entire first portion of the stroke structure and to be connected to at least two of the mutually spaced-apart contact points of the first portion of the stroke structure via at least two of the mutually spaced-apart connecting elements, the second piezoelectric actuator extending at least over the entire second portion of the stroke structure and being connected to at least two of the mutually spaced-apart contact points of the second portion of the stroke structure via at least two of the mutually spaced-apart connecting elements.

Also, it is advantageous for the first piezoelectric actuator and a fifth piezoelectric actuator of the at least two piezoelectric actuators to be arranged, outside the stroke structure, along the first portion of the stroke structure, the second piezoelectric actuator and a sixth piezoelectric actuator of the at least two piezoelectric actuators being arranged, outside the stroke structure, along the second portion of the stroke structure.

It is advantageous for the first piezoelectric actuator and the fifth piezoelectric actuator to be each connected to at least one of the mutually spaced-apart contact points of the first portion of the stroke structure via at least one of the mutually spaced-apart connecting elements, the second piezoelectric actuator and the sixth piezoelectric actuator each being connected to at least one of the mutually spaced-apart contact points of the second portion of the stroke structure via at least one of the mutually spaced-apart connecting elements.

Also, it is advantageous for the first portion to be subdivided into a first segment and a second segment, the first piezoelectric actuator being arranged along the first segment of the first portion and being connected to the first segment of the first portion via the respective connecting element, the fifth piezoelectric actuator being arranged along the second segment of the first portion and being connected to the second segment of the first portion via the respective connecting element; and wherein the second portion is subdivided into a first segment and a second segment, the second piezoelectric actuator being arranged along the first segment of the second portion and being connected to the first segment of the second portion via the respective connecting element, the sixth piezoelectric actuator being arranged along the second segment of the second portion and being connected to the second segment of the second portion via the respective connecting element.

It is advantageous for the third piezoelectric actuator and a seventh piezoelectric actuator of the at least two piezoelectric actuators to be at least partly arranged, inside the stroke structure, along the first side of the third portion of the stroke structure, the fourth piezoelectric actuator and an eighth piezoelectric actuator of the at least two piezoelectric actuators being at least partly arranged, inside the stroke structure, along the second side of the third portion of the stroke structure.

Similarly, it is advantageous for the third portion to be subdivided into a first segment and a second segment, the third piezoelectric actuator being arranged along a first side of the first segment of the third portion, the fourth piezoelectric actuator being arranged along a second side, located opposite the first side, of the first segment of the third portion, the seventh piezoelectric actuator being arranged along a first side of the second segment of the third portion, the eighth piezoelectric actuator being arranged along a second side, located opposite the first side, of the second segment of the third portion.

It is advantageous for the stroke structure to comprise several stroke bodies and/or for at least two stroke bodies to be connected to each other via an extended stroke body.

What is further proposed is a regulating unit for operating a MEMS loudspeaker in a regulated manner. The regulating unit includes a MEMS loudspeaker in accordance with the above description, it being possible for the mentioned features to be present individually or in any combination. Moreover, the regulating unit includes a control means configured to control a piezoelectric actuator of the MEMS loudspeaker. The MEMS loudspeaker comprises at least one piezoelectric position sensor configured to provide the control means with a sensor signal dependent on the deflection of a diaphragm of the MEMS loudspeaker, and the control means is configured to control the at least one piezoelectric actuator of the MEMS loudspeaker in a regulated manner on the basis of the sensor signal.

It is advantageous when the actual position of the stroke structure during operation can be continuously determined by means of the position sensor and can be regulated by means of the control means by controlling the at least one piezoelectric actuator.

It is advantageous for the stroke structure to comprise several contact points. These are mutually spaced apart, in particular, in the transverse and/or longitudinal direction of the actuator. Each of said contact points has one connecting element attached to it which flexibly, or elastically, connects the actuator associated in each case to the stroke structure.

It is advantageous for the MEMS loudspeaker to comprise, for exciting a diaphragm, a stroke body and at least two piezoelectric actuators, the at least two actuators being connected to a plurality of mutually spaced-apart contact points of the stroke structure via a plurality of mutually spaced-apart connecting elements. Due to the fact that the MEMS loudspeaker comprises at least two piezoelectric actuators connected to the stroke structure via a plurality of connecting elements, it is possible to transmit large forces and deflections to the diaphragm via the stroke structure at the same time. Due to the fact that the plurality of connecting elements and, thus, also the plurality of contact points are mutually spaced apart, it can be ensured or guaranteed that the stroke structure performs the stroke movement in a reproducible and uniform manner and does not deviate, for example, from a desired direction of the stroke movement, as would be the case, for example, in the event of tilting modes occurring.

It is advantageous for the piezoelectric actuators to be connected to a plurality of mutually spaced-apart contact points of the stroke structure via a plurality of mutually spaced-apart and flexible connecting elements.

It is advantageous for the connecting elements associated with one of the two actuators to be mutually spaced apart in the transverse direction of the actuator and/or of the MEMS sound transducer.

It is advantageous for the diaphragm to be connected to the stroke structure at a front end of the stroke structure in a direct manner, and/or for the piezoelectric actuators to be connected to the stroke structure on at least one side face of the stroke structure, in particular on two opposite side faces, in an indirect manner, namely via the connecting elements. In a cross-sectional view of the MEMS loudspeaker, the front end of the stroke structure is thus oriented in the z direction, i.e. in the stroke direction (lifting direction). The side faces of the stroke structure, in contrast, are aligned in the transverse direction, i.e. perpendicularly to the stroke axis (lifting axis).

In an advantageous further development of the invention, several mutually spaced-apart connecting elements are connected to several mutually spaced-apart contact points of the at least two piezoelectric actuators.

Moreover, it is advantageous for each of the at least two piezoelectric actuators to be connected to at least two mutually spaced-apart contact points of the stroke structure via at least two mutually spaced-apart connecting elements.

In addition, it is advantageous for the stroke structure to be coupled to the diaphragm via a plurality of regions—i.e. in several regions. Said regions are advantageously arranged with the diaphragm along at least two straight lines or curves that are at least partially spaced-apart from one another.

It is advantageous for the stroke structure to be coupled to the diaphragm via a plurality of regions that are arranged in a distributed and/or mutually spaced-apart manner.

Similarly, it is advantageous for the stroke structure to comprise a plurality of mutually connected beams, each of which is coupled to the diaphragm at least partially at a front end. Thus, the stroke structure includes several beam-shaped parts. The latter are advantageously arranged in a mutually perpendicular manner in a top view. In addition, the stroke structure is advantageously configured to be in one piece.

It is advantageous for the at least two piezoelectric actuators to be implemented as bending beams (cantilevers). Thus, they are advantageously implemented in a rectilinear manner.

It is advantageous for the at least one actuator and/or position sensor to comprise a fixed end, which is directly connected, in particular, to the carrier substrate, and a movable end that is advantageously indirectly connected to the stroke structure—namely via the at least one flexible, or elastic, connecting element.

It is advantageous for the actuator to have a larger width than length.

In addition, it is advantageous for the at least two piezoelectric actuators to be arranged, in a cross-sectional view of the MEMS loudspeaker, within a first plane in an idle position, or zero position, for the diaphragm to be arranged within a second plane spaced apart from the former in the stroke direction, and/or for the stroke structure to extend in the stroke direction, starting from the diaphragm, in the direction of the second plane, in particular as far as or beyond the latter.

It is advantageous for at least one of the connecting elements to comprise or to be implemented, at least partially, as a spring element. The connecting element may thus deform in a flexible, or elastic, manner. As a result, the maximum stroke of the diaphragm may be increased as compared to the maximum actuator stroke since the diaphragm can flexibly oscillate beyond the actuator stroke due to the spring element.

In order to be able to avoid tilting of the diaphragm it is advantageous for the spring element, in particular each one, to include at least one flexion spring element, at least one torsion spring element, and/or a combination of at least one flexion spring element and at least one torsion spring element, or to be implemented in this manner.

It is advantageous for the piezoelectric actuators to comprise, in a cross-sectional view of the MEMS loudspeaker, a fixedly clamped first end and a movable second end, respectively, along their longitudinal axes.

Moreover, it is advantageous for the flexion spring element to extend in the longitudinal direction, and/or for the torsion spring element to extend in the transverse direction, of the piezoelectric actuator.

Also, it is advantageous for the flexion spring element to be directly connected to the actuator and/or to be formed in one piece with same. Moreover, it is advantageous for the torsion spring element to be arranged, in the direction of the flux of force, between the flexion spring element and the stroke structure.

It is advantageous for the diaphragm to comprise a rigid region and a flexible region. Advantageously, the stroke structure is coupled to the rigid region of the diaphragm, the rigid region of the diaphragm being formed, in particular, by an extended stroke structure.

In an advantageous further development of the invention, the MEMS loudspeaker comprises at least one piezoelectric position sensor. The latter is advantageously configured to provide a sensor signal dependent on the deflection of the diaphragm.

In addition, it is advantageous for at least one of the piezoelectric actuators to be configured as a piezoelectric position sensor.

Similarly, it is advantageous for the MEMS loudspeaker to comprise at least four piezoelectric actuators, two of the at least four piezoelectric actuators being configured as piezoelectric position sensors. In addition, said at least four piezoelectric actuators are advantageously arranged symmetrically with respect to a center of gravity of the MEMS loudspeaker in such a manner that the two piezoelectric actuators configured as piezoelectric position sensors and the remaining piezoelectric actuators each are arranged symmetrically with respect to the center of gravity of the stroke structure.

It is advantageous for the MEMS loudspeaker to comprise at least one stack of two mutually insulated piezoelectric layers, one of the two layers forming the at least one piezoelectric sensor, and the other one of the two layers forming one of the at least two piezoelectric actuators.

Moreover, it is advantageous for the two mutually insulated piezoelectric layers to comprise different materials.

Advantageously, the piezoelectric position sensor and one piezoelectric actuator of the at least two piezoelectric actuators are formed by a common piezoelectric layer.

In addition, it is advantageous for the MEMS loudspeaker to comprise at least one piezoresistive or one capacitive position sensor that is configured to provide a sensor signal dependent on the deflection of the diaphragm.

It is also advantageous for the stroke structure to comprise a plurality of stroke bodies and/or for at least two stroke bodies of the plurality of stroke bodies to be connected to one another via an extended stroke body.

It is advantageous for the MEMS loudspeaker to comprise a cavity. The latter is advantageously configured at least partially by a carrier substrate of the MEMS loudspeaker, which carrier substrate has the shape of a frame, in particular. Moreover, the cavity is advantageously arranged on that side of the diaphragm which faces the actuators and/or the stroke structure.

It is advantageous for the carrier substrate and the stroke structure to be formed of the same material and/or of the same base body.

Advantageously, the stroke structure is directly connected to the diaphragm. In addition, it is advantageous for the stroke structure to be indirectly connected to the at least one actuator. The indirect connection between the stroke structure and the actuator is advantageously configured by means of the flexible and/or elastic connecting element.

It is advantageous for the actuators to be spaced apart from the diaphragm in the stroke direction, or z direction.

In addition, it is advantageous for the actuators and the diaphragm to be aligned in a mutually parallel manner in their neutral positions.

BRIEF DESCRIPTION OF THE DRAWINGS

Embodiments of the present invention will be detailed subsequently referring to the appended drawings, in which:

FIG. 1a shows a schematic cross-sectional view of a MEMS, in accordance with an embodiment of the present invention;

FIG. 2a shows a schematic cross-sectional view of a MEMS in the activated state, in accordance with an embodiment of the present invention;

FIG. 2b shows a schematic cross-sectional view of the MEMS in the idle state, in accordance with an embodiment of the present invention;

FIGS. 3a-d show schematic cross-sectional views of four different embodiments of the piezoelectric actuators of the MEMS;

FIGS. 4a-f show schematic top views of six different embodiments of the stroke structure of the MEMS;

FIGS. 5a-5h show schematic top views of eight different embodiments of arrangements of the piezoelectric actuators in relation to the stroke structure of the MEMS;

FIGS. 6a-f show schematic top views of six different embodiments of the connecting elements of the MEMS;

FIGS. 7a, b show schematic top views of two embodiments of a piezoelectric actuator with an integrated position sensor;

FIG. 10a shows a schematic cross-sectional view of a MEMS having a flexible diaphragm, in accordance with an embodiment of the present invention;

FIG. 10b shows a schematic top view of the MEMS shown in FIG. 10a and having the flexible diaphragm, in accordance with an embodiment of the present invention;

FIG. 11a shows a schematic cross-sectional view of a MEMS having a flexible diaphragm, in accordance with an embodiment of the present invention;

FIG. 11b shows a schematic top view of the MEMS shown in FIG. 11a and having the flexible diaphragm, in accordance with an embodiment of the present invention;

DETAILED DESCRIPTION OF THE INVENTION

Figure 1B:
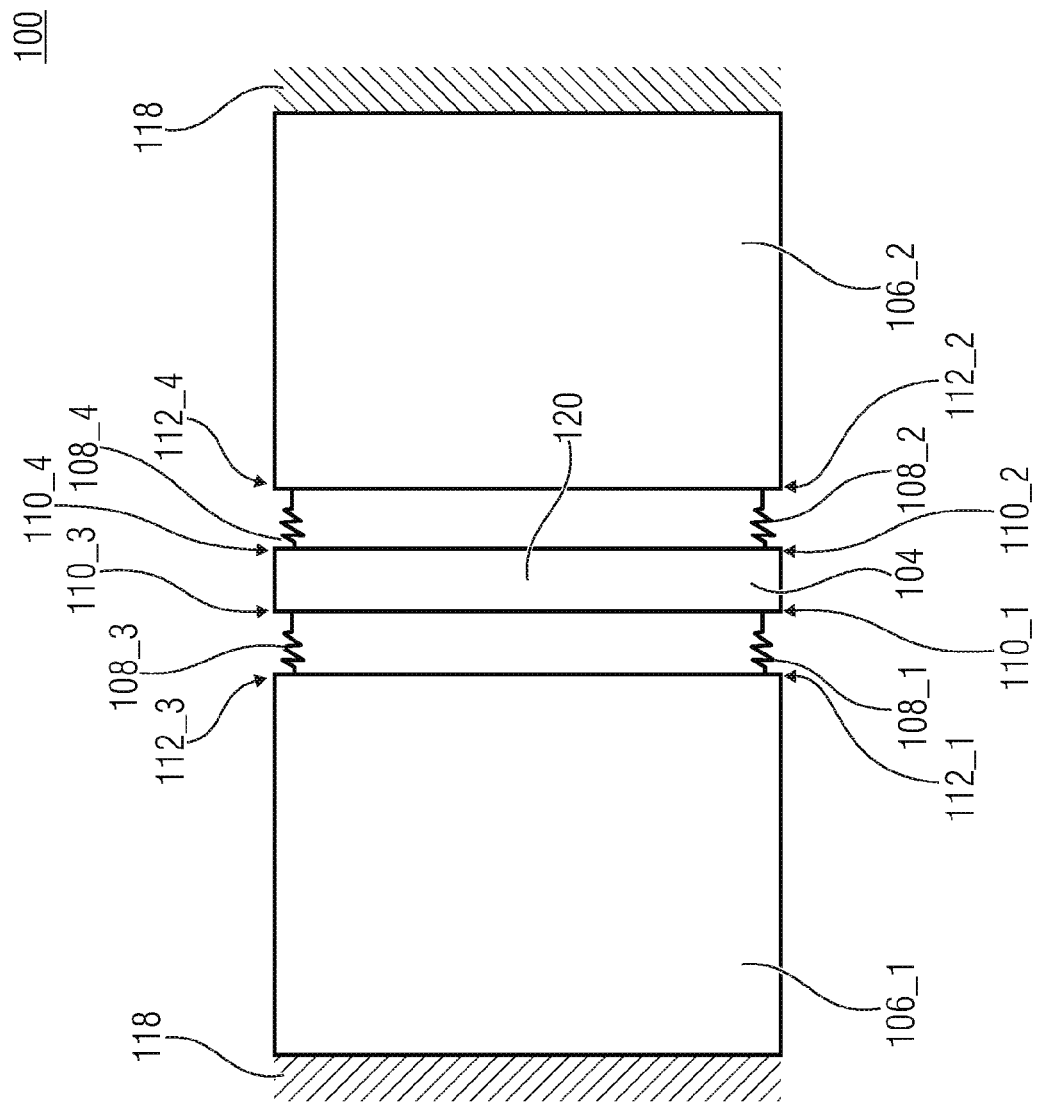
FIG. 1b shows a schematic top view of the MEMS shown in FIG. 1a, in accordance with an embodiment of the present invention.
Figure 4F:
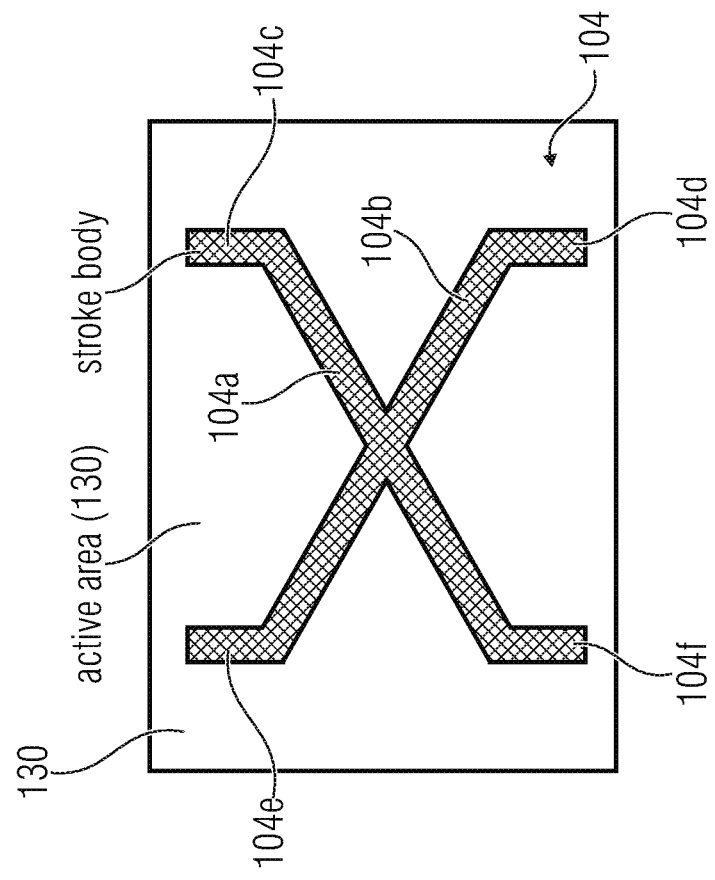
Figure 4E:
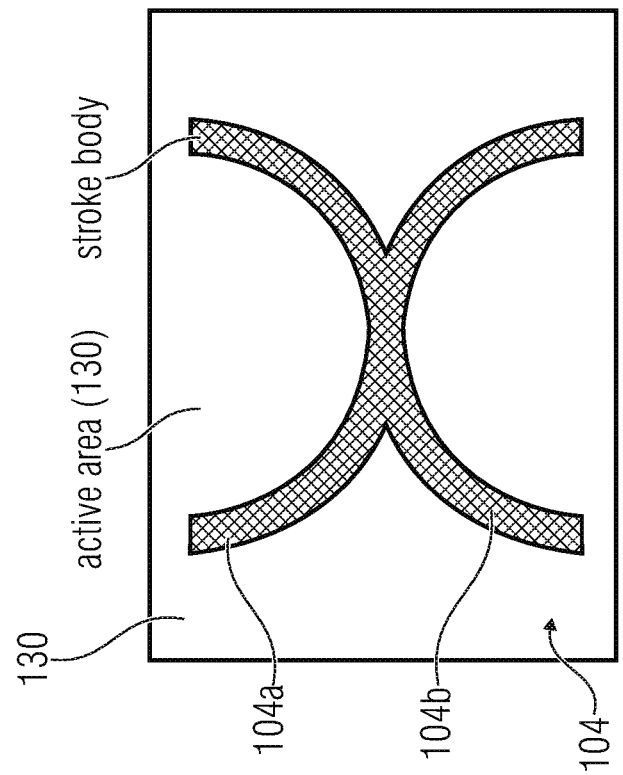

In the following description of the embodiments of the invention, elements which are identical or have identical functions will be provided with identical reference numerals in the Figures, so that their descriptions in the various embodiments are interchangeable.

FIG. 1a shows a schematic cross-sectional view of a MEMS 100 in accordance with an embodiment of the present invention, while FIG. 1b shows a schematic top view of the MEMS 100 shown in FIG. 1a. The MEMS 100 comprises a diaphragm 102, a stroke structure 104 coupled to the diaphragm 102, and at least two piezoelectric actuators 106_1 to 106_n (n=2) coupled to a plurality of mutually spaced-apart contact points 110_1 to 110_m (m=4) of the stroke structure 104 via a plurality of mutually spaced-apart connecting elements 108_1 to 108_m (m=4), the at least two piezoelectric actuators 106_1 to 106_n (n=2) being configured to cause a (uni- or bidirectional) stroke movement of the stroke structure 104 so as to deflect the diaphragm 102.

In embodiments, the at least two piezoelectric actuators 106_1 to 106_n (n=2) may be arranged within a plane in an idle position, it being possible for the at least two piezoelectric actuators 106_1 to 106_n (n=2) to be configured to cause a stroke movement of the stroke structure 104 such that a direction of the stroke movement is perpendicular to the plane of the piezoelectric actuators 106_1 to 106_n (n=2). In FIG. 1a, the direction of the stroke movement is indicated by arrow 114 by way of example.

The at least two piezoelectric actuators 106_1 to 106_n (n=2) may be implemented as bending beams, for example. In addition, the at least two piezoelectric actuators 106_1 to 106_n (n=2) may be clamped within a clamp 118, e.g. a semiconductor substrate such as a silicon semiconductor substrate, for example.

The MEMS 100 shown in FIGS. 1a and 1b comprises, by way of example, two piezoelectric actuators 106_1 to 106_n (n=2). However, the invention is not limited to such embodiments. Rather, the MEMS 100 may comprise up to n piezoelectric actuators 106_1 to 106_n, n being a natural number larger than two, n≥2.

In embodiments, the at least two piezoelectric actuators 106_1 to 106_n (n=2) may be connected to a plurality of mutually spaced-apart contact points 110_1 to 110_m (m=4) of the stroke structure 104 via a plurality of mutually spaced-apart connecting elements 108_1 to 108_m (m=4).

As may be seen in FIG. 1b by way of example, each one of the at least two piezoelectric actuators 106_1 to 106_n (n=2) may be connected to at least two mutually spaced-apart contact points 110_1 to 110_m (m=4) of the stroke structure 104 via at least two mutually spaced-apart connecting elements 108_1 to 108_m (m=4).

For example, a first piezoelectric actuator 106_1 of the at least two piezoelectric actuators 106_1 to 106_n (n=2) may be connected to a first contact point 110_1 of the plurality of mutually spaced-apart contact points 110_1 to 110_m (m=4) of the stroke structure 104 via a first connecting element 110_1 of the plurality of connecting elements 110_1 to 110_m (m=4), and may be connected to a second contact point 110_2 of the plurality of mutually spaced-apart contact points 110_1 to 110_m (m=4) of the stroke structure 104 via a second connecting element 108_2 of the plurality of connecting elements 108_1 to 108_m (m=4).

Similarly, a second piezoelectric actuator 106_2 of the at least two piezoelectric actuators 106_1 to 106_n (n=2) may be connected to a third contact point of the plurality of mutually spaced-apart contact points 110_1 to 110_m (m=4) of the stroke structure 104 via a third connecting element 108_3 of the plurality of mutually spaced-apart connecting elements 108_1 to 108_m (m=4), and may be connected to a fourth contact point 110_4 of the plurality of mutually spaced-apart contact points 110_1 to 110_m (m=4) of the stroke structure 104 via a fourth connecting element 108_4 of the plurality of mutually spaced-apart connecting elements 108_1 to 108_m (m=4).

In embodiments, a distance between the plurality of mutually spaced-apart contact points 110_1 to 110_4 of the stroke structure may be maximized, whereby a distance between the plurality of mutually spaced-apart connecting elements 108_1 to 108_m (m=4) is also maximized.

For example, to this end, the first contact point 110_1 may be arranged in a first outer region of the stroke structure 104, whereas the second contact point 110_2 may be arranged in a second outer region, located opposite the first outer region, of the stroke structure. Similarly, the third contact point 110_3 may be arranged in the first outer region of the stroke structure 104, whereas the fourth contact point 110_4 may be arranged in the second outer region of the stroke structure 104.

As can be seen in FIG. 1b, the plurality of mutually spaced-apart connecting elements 108_1 to 108_m (m=4) may be connected to a plurality of mutually spaced-apart contact points 112_1 to 112_m (m=4) of the at least two piezoelectric actuators 106_1 to 106_n (n=2). Distances between the plurality of mutually spaced-apart contact points 112_1 to 112_m of the stroke structure may also be maximized, as can be seen in FIG. b.

For example, a first contact point 112_1 of the plurality of mutually spaced-apart contact points 112_1 to 112_m (m=4) of the first piezoelectric actuator 106_1 may be arranged in a first outer region of the first piezoelectric actuator 106_1, whereas a second contact point 112_2 of the plurality of mutually spaced-apart contact points 112_1 to 112_m (m=4) can be arranged in a second outer region, located opposite the first outer region, of the first piezoelectric actuator 106_1. A third contact point 112_3 of the plurality of mutually spaced-apart contact points 112_1 to 112_m (m=4) of the second piezoelectric actuator 106_2 may be arranged in a first outer region of the second piezoelectric actuator 106_2, whereas a fourth contact point 112_4 of the plurality of mutually spaced-apart contact points 112_1 to 112_m (m=4) may be arranged in a second outer region, located opposite the first outer region, of the second piezoelectric actuator 106_2.

The MEMS 100 shown in FIGS. 1a and 1b comprises, by way of example, four mutually spaced-apart connecting elements 108_1 to 108_m (m=4) connected to four mutually spaced-apart contact points 110_1 to 110_m (m=4) of the stroke structure 104. However, the invention is not limited to such embodiments. Rather, the MEMS 100 may comprise up to m mutually spaced-apart connecting elements 108_1 to 108_m connected to up to m mutually spaced-apart contact points 110_1 to 110_m of the stroke structure 104, m being a natural number larger than four, m≥4. However, this does not result in that each of the at least two piezoelectric actuators 106_1 to 106_n is necessarily connected to the stroke structure 104 via at least two connecting elements. For example, the MEMS 100 may also comprise four piezoelectric actuators 106_1 to 106_n (n=4), each of the four piezoelectric actuators 106_1 to 106_n (n=4) being connected to the stroke structure 104 via one (single) connecting element in each case.

As can be seen in FIGS. 1a and 1b, the stroke structure 104 may be symmetrical, it being possible for the at least two piezoelectric actuators 106_1 to 106_n (n=2) to be arranged symmetrically with respect to a center of gravity 120 of the stroke structure 104. The plurality of mutually spaced-apart contact points 110_1 to 110_m (m=4) may also be arranged symmetrically with respect to the center of gravity 120 of the stroke structure 104. Similarly, the plurality of mutually spaced-apart contact points 112_1 to 112_m (m=4) of the at least two piezoelectric actuators 106_1 to 106_n (n=2) may be arranged symmetrically with respect to the center of gravity 120 of the stroke structure 104.

As was already mentioned, the diaphragm 102 is coupled to the stroke structure 104 in embodiments. The diaphragm 102 may further be clamped within an outer region 118, e.g. in a semiconductor substrate such as a silicon semiconductor structure, for example. The diaphragm 102 may extend in parallel with a first surface 122 and/or a second surface 124 of the MEMS 100, it being possible for the diaphragm 102 to be configured to separate, when the MEMS 100 is used as intended, the first surface 122 and the second surface 124 of the MEMS 100 from each other, in particular in a fluidic and/or gas-shaped manner.

The plane within which the at least two piezoelectric actuators 106_1 and 106_n (n=2) are arranged in an idle position might extend in parallel with the first and/or second surface 122 and 124 of the MEMS 100.

In the following, embodiments of the MEMS 100 will be explained in more detail with reference to FIGS. 2 to 16. The description which follows, however, is also applicable to the MEMS 100 shown in FIGS. 1a and 1b. Similarly, features that were described with regard to the MEMS 100 shown in FIGS. 1a and 1b are applicable to the embodiments which follow.

The embodiments which follow describe a concept and an architecture of a microactuator for large strokes and forces which exhibits a high level of efficiency and may be produced by means of methods of silicon microsystems technology. The actuator may be used for a loudspeaker, for example. The decisive advantage of chip-based loudspeakers over conventional loudspeakers is the possibility of producing complex and highly precise geometries and to thus implement new sound generation concepts. Additionally, the MEMS actuators may be operated in a regulated manner by integrating a position sensing system.

For implementing large forces and strokes, embodiments provide a MEMS 100 based on efficiently arranged actuator elements connected, via suitable connecting elements (see FIGS. 6a to 6f), to a stroke body 104 which is assumed to be rigid and may be configured as a frame structure (see FIGS. 2a and 2b). The actuator elements 106_1 to 106_n may be controlled at the same time, so that the frame 104 is moved out of the plane in parallel (with a direction of the stroke movement, which is perpendicular to a plane of the actuator elements 106_1 to 106_n), i.e. if possible without any tilting.

FIG. 2a shows a schematic cross-sectional view of the MEMS 100 in the activated state, while FIG. 1b shows a schematic cross-sectional view of the MEMS 100 shown in FIG. 2a (actuator arrangement) in the idle state. The actuators 106_1 and 106_n (n=2) are one-sidedly clamped bending beams (which may be clamped, e.g., in an outer region, within a clamp 118, e.g. a frame such as a silicon frame, for example) and which comprise, in accordance with FIGS. 3a to 3d, at least two layers, at least one of which is piezoelectric. FIGS. 3a to 3d show schematic cross sections of possible actuator elements. In detail, uni-morphic with a piezoelectric functional layer 133 (and a passive layer 135) in FIG. 3a, symmetrical and dimorphic with two piezoelectric layers 133a and 133b (and an interposed passive layer 135) in FIG. 3b, symmetrically dimorphic with a thin conductive separation layer 137 between two piezoelectric layers 133a and 133b in FIG. 3c, and asymmetrically dimorphic with two piezoelectric layers 133a and 133b (on a passive layer 135) separated by means of a separation layer 137 in FIG. 3d.

For contacting purposes, the piezoelectric layers may be provided with corresponding electrodes, which may be configured either as two-dimensional or interdigital electrodes or as a combination of two-dimensional and interdigital electrodes. In addition to piezoelectrically active layers, the actuator elements may comprise one or more passive or piezoelectrically inactive functional layers.

By application of an electric voltage, the piezoelectric material deforms and causes bending of the individual actuator elements 106_1 to 106_n, via which the stroke body, or the stroke structure, 104 is moved out of the plane in the upward or downward direction. While large deflections can only be implemented, in principle, via actuators that are as long and thin-layered as possible, actuators for large forces tend to use short lengths. The latter is due to the fact that long actuators comprise too low levels of spring rigidity to generate high forces. To overcome these conflicting requirements, the proposed design concepts are based on several actuators 106_1 to 106_n, which on account of their lengths achieve large deflections, but in total are able to provide large forces as well due to their number. Thus, the possible stroke of the stroke body 104 can primarily be defined via the lengths of the actuators 106_1 to 106_n, whereas the achievable force can be scaled via the width and number of the actuators 106_1 to 106_n.

FIGS. 4a to 4f show schematic top views of six different embodiments of the stroke structure 104 of the MEMS 100.

FIG. 4a shows a stroke structure 104 which is H-shaped within a plane extending perpendicularly to the direction of the stroke movement of the stroke structure 104. For example, the stroke structure 104 may comprise at least three portions 104a to 104c arranged in the shape of an H, so that the stroke structure 104 is H-shaped within the sectional plane extending perpendicularly to the stroke movement direction of the stroke structure. The three portions 104a to 104c may form a (contiguous) stroke body, as can be seen in FIG. 4a.

The stroke structure 104 or, in other words, the portions 104a to 104c may span a surface area corresponding to at least 30% (or 80%, 70%, 60%, 50%, or 40%) of a surface area of the diaphragm 102.

The stroke structure 104 can be configured such that the stroke structure 104 is coupled to the diaphragm at least by means of the first portion 104a and the second portion 104b (and optionally by means of the third portion 104c). The front ends of the first portion 104a and of the second portion 104b thus form a plurality of regions arranged in a distributed manner by means of which the stroke structure 104 is coupled to the diaphragm 102.

Of course, the stroke structure 104 may also be configured such that the stroke structure 104 is coupled to the diaphragm 102 (in a dot-shaped manner) via a plurality of regions arranged in a distributed manner. The plurality of regions arranged in a distributed manner may be, for example, regions of the first portion 104a and of the second portion 104b (and, optionally, of the third portion 104c).

In addition, it is also possible for at least the first portion 104a and the second portion 104b (and, optionally, the third portion 104c) to be coupled to the diaphragm via a spacer in each case, the cross-sectional area of which may be smaller or larger than the respective portion 104a and 104b. In this case, the spacers form a plurality of regions arranged in a distributed manner, by means of which the stroke structure 104 is coupled to the diaphragm 102.

The plurality of regions arranged in a distributed manner (e.g. front ends or dot-shaped regions of the portions 104a and 104b) may be arranged along straight lines along which the stroke structure 104 is coupled to the diaphragm 102. In FIG. 4a, these two straight lines (defined by the portions 104a and 104b) are arranged in parallel with each other. However, it is also feasible, of course, for these two straight lines to intersect in at least one point, i.e. to be only partially spaced apart from each other, which may be achieved, for example, by a V- or L-shaped structure or by a combination of several structures, i.e., I-shaped and L-shaped structures, to form an H structure.

Since, in particular, the force highly depends on the actuator surface area, the designs shown in FIGS. 4a to 4f exhibit a stroke body 104 configured to take up as small an area as possible while having sufficient rigidity which prevents any appreciable deformation of the stroke body. The stroke body 104 may be configured as a branched frame structure open to the sides, so that the actuator elements may be arranged between or next to the beams of the frame and may engage the frame there. Because of the reduced surface area, the major part of the active area 130 (advantageously rectangular area, which takes up the movable elements of actuator, stroke body, and connecting elements) is available for the actuators 106_1 to 106_n. With regard to as efficient an actuator arrangement as possible, the stroke body 104 may additionally be configured such that the connecting elements 108_1 to 108_m between the actuator and the stroke body 104 comprise as large a distance as possible from the center of gravity of the stroke body 104. In this manner, undesired tilting modes can be shifted upward within the frequency range in relation to the desired stroke mode (lifting mode), whereby parasitic oscillations during operation can be reduced.

FIGS. 4a to 4f show schematic top views of examples of different shapes of the branched rigid stroke body 104. In detail, a stroke body comprising three interconnected beam elements 104a to 104c in FIG. 4a, a stroke body comprising additional struts (or beams) 104d in FIGS. 4b and 4c, a stroke body comprising locally broadened areas 182 in FIG. 4d, a stroke body 104 comprising rounded areas in FIG. 4e, and a stroke body 104 comprising diagonal elements 104c to 104f in FIG. 4f.

As can be seen in FIGS. 4a to 4f, the stroke body 104 may be composed of rigid beam elements, by way of example.

For example, the stroke body 104 may comprise at least two beam elements 104a and 104b which are connected to one another in a direct manner or via a third beam element 104c (see FIG. 4a). In addition, the stroke body 104 may comprise additional, horizontally arranged beam elements 104d (see FIG. 4b) which may have different lengths and may be mutually connected by struts. Moreover, the stroke body 104 may comprise additional, perpendicularly arranged beam elements 104d (see FIG. 4c), the lengths of which may be identical with or different from other horizontal elements. In addition, the stroke body 104 may comprise locally broadened areas 182 or plates (e.g. for providing assembly surfaces or for positioning connecting elements) (see FIG. 4d). Moreover, the stroke body 104 may comprise diagonally arranged beam elements, and/or rounded contours. The stroke body 104 may comprise a square, rectangular or trapezoidal cross-sectional profile. Also, the stroke body may have a centered alignment within the active area 130.

The stroke structures 104 shown in FIGS. 4a to 4f each comprise a (contiguous) stroke body. However, the invention is not limited to such embodiments. Rather, the stroke structure 104 may also comprise two or more stroke bodies in embodiments. The stroke bodies may be coupled or connected to one another via a strip or an extended stroke body, for example (cf. FIG. 8).

FIGS. 5a to 5h show schematic top views of eight different embodiments of arrangements of the piezoelectric actuators 106_1 to 106_n with regard to the stroke structure 104 of the MEMS, the diaphragm 102 not being shown in FIGS. 5a to 5h in each case so as not to impair the view of the stroke structure 104 and the at least two piezoelectric actuators 106_1 to 106_n.

In the embodiments shown in FIGS. 5a to 5h, the stroke structure 104 comprises at least three portions 104a to 104c arranged to form an H-shaped stroke structure 104, so that the stroke structure 104 has the shape of an H within a sectional plane extending perpendicularly to the direction 114 of the stroke movement of the stroke structure 104 (by analogy with FIG. 4a).

The first portion 104a and the second portion 104b are arranged in parallel with each other, whereas the third portion 104c is arranged perpendicularly to the first portion 104a and to the second portion 104b so as to form the H-shaped stroke structure.

As can be seen in FIG. 5a, the MEMS 100 may comprise two piezoelectric actuators 106_1 and 106_n (n=2) which are at least partly arranged, inside the H-shaped stroke structure 104, along the third portion 104c of the stroke structure 104 and are connected, in each case, to the stroke structure 104 via at least two mutually spaced-apart connecting elements 108_1 to 108_m.

In detail, in FIG. 5a, the first piezoelectric actuator 106_1 is connected to the stroke structure 104 via two connecting elements 108_1 and 108_2 of the plurality of mutually spaced-apart connecting elements 108_1 to 108_m (m=4, optionally m=6), the second piezoelectric actuator 106_2 being connected to the stroke structure 104 via two connecting elements 108_3 and 108_4 of the plurality of mutually spaced-apart connecting elements 108_1 to 108_m (m=4, optionally m=6).

A first contact point 112_1 of the plurality of mutually spaced-apart contact points 112_1 to 112_m (m=4) of the first piezoelectric actuator 106_1 may be arranged in a first outer region of the first piezoelectric actuator 106_1, so that the first connecting element 108_1 is arranged adjacently to the first outer region, whereas a second contact point 112_2 of the plurality of mutually spaced-apart contact points 112_1 to 112_m (m=4) may be arranged in a second outer region, located opposite the first outer region, of the first piezoelectric actuator 106_1, so that the second connecting element 108_2 is arranged adjacently to the second outer region. Similarly, a third contact point 112_3 of the plurality of mutually spaced-apart contact points 112_1 to 112_m (m=4) of the second piezoelectric actuator 106_2 may be arranged in a first outer region of the second piezoelectric actuator 106_2, so that the third connecting element 108_1 is arranged adjacently to the first outer region, whereas a fourth contact point 112_4 of the plurality of mutually spaced-apart contact points 112_1 to 112_m (m=4) may be arranged in a second outer region, located opposite the first outer region, of the second piezoelectric actuator 106_2, so that the fourth connecting element 108_4 is arranged adjacently to the second outer region. Such connecting elements will be referred to below as outer connecting elements, or externally located connecting elements.

Optionally, the first piezoelectric actuator 106_1 may further be connected to the stroke structure via a fifth connecting element 108_5, it being possible for a fifth contact point 112_5 of the plurality of mutually spaced-apart contact points 112_1 to 112_m (m=6) of the first piezoelectric actuator 106_1 to be arranged in a central region, so that the fifth connecting element 108_5 is arranged adjacently to the central region. Similarly, the second piezoelectric actuator 106_2 may further be connected to the stroke structure 104 via a sixth connecting element 108_6, it being possible for a sixth contact point 112_6 of the plurality of mutually spaced-apart contact points 112_1 to 112_m (m=6) of the second piezoelectric actuator 106_2 to be arranged in a central region, so that the sixth connecting element 108_6 is arranged adjacently to the central region. Such connecting elements will be referred to below as central connecting elements, or centrally located connecting elements.

FIG. 5b shows a schematic top view of a MEMS 100 comprising four piezoelectric actuators 106_1 to 106_n (n=4) which are at least partly arranged inside the H-shaped stroke structure 104, two piezoelectric actuators 106_1 and 106_2 of the four piezoelectric actuators 106_1 to 106_n (n=4) being arranged along a first side of the third portion 104c, two further piezoelectric actuators 106_3 and 106_4 of the four piezoelectric actuators 106_1 to 106_n (n=4) being arranged along a second side, located opposite the first side, of the third portion 104c. The four piezoelectric actuators 106_1 to 106_n (n=4) are connected to the third portion 104c of the stroke structure 104 via two externally located connecting elements 108_1 to 108_4 in each case and, optionally, via one centrally located connecting element 108_5 and 108_6 in each case.

FIG. 5c also shows a schematic top view of a MEMS 100 comprising four piezoelectric actuators 106_1 to 106_n (n=4), wherein two piezoelectric actuators 106_1 and 106_4 of the four piezoelectric actuators 106_1 to 106_n (n=4) are connected to the first portion 104a of the stroke structure 104 via two externally located connecting elements 108_1 to 108_4 in each case (and optionally via a further, centrally located connecting element), two further piezoelectric actuators 106_2 and 106_3 of the four piezoelectric actuators 106_1 to 106_n (n=4) being connected to the second portion 104b of the stroke structure 104 via two externally located connecting elements 108_5 to 108_8 in each case (and optionally via a further, centrally located connecting element).

FIG. 5d shows a schematic top view of a MEMS 100 comprising eight piezoelectric actuators 106_1 to 106_n (n=8) which are at least partly arranged inside the H-shaped stroke structure 104, so that four piezoelectric actuators 106_1 to 106_4 of the eight piezoelectric actuators 106_1 to 106_n (n=8) are connected to the first portion 104a of the stroke structure 104 via two externally located connecting elements 108_1 to 108_8 in each case, two further piezoelectric actuators 106_5 to 106_8 of the eight piezoelectric actuators 106_1 to 106_n (n=8) being connected to the second portion 104b of the stroke structure 104 via two externally located connecting elements 108_9 to 108_16 in each case.

FIG. 5e shows a schematic top view of a MEMS 100 comprising two piezoelectric actuators 106_1 and 106_n (n=2) arranged outside the H-shaped stroke structure 104. Here, the first piezoelectric actuator 106_1 is arranged along the first portion 104a of the stroke structure 104, the second piezoelectric actuator 106_2 being arranged along the second portion 104b of the stroke structure 104. The first piezoelectric actuator 106_1 is connected to the first portion 104a of the stroke structure 104 via two externally located connecting elements 108_1 and 108_4, whereas the second piezoelectric actuator 106_2 is connected to the second portion 104b of the stroke structure 104 via two externally located connecting elements 108_2 and 108_3. Optionally, the first piezoelectric actuator 106_1 and the second piezoelectric actuator 106_2 may be connected to the respective portion 104a and 104b of the stroke structure 104 in each case via a centrally located connecting element 108_5 and 108_6 in each case.

FIG. 5f shows a schematic top view of a MEMS 100 comprising four piezoelectric actuators 106_1 to 106_n (n=4) which are arranged outside the H-shaped stroke structure 104. The first and fourth piezoelectric actuators 106_1 and 106_4 are arranged along the first portion 104a of the stroke structure 104 and are connected to same via two externally located connecting elements 108_1 to 108_4 in each case. The second piezoelectric actuator 106_2 and the third piezoelectric actuator 106_3 are arranged along the second portion 104b of the stroke structure 104 and are connected to same via two externally located connecting elements 108_5 to 108_8 in each case.

FIGS. 5g and 5h each show a MEMS 100 comprising four piezoelectric actuators 106_1 to 106_n (n=4) arranged outside the H-shaped stroke structure 104. The four piezoelectric actuators 106_1 to 106_4 are connected to the respective portion 104a or 104b of the stroke structure 104 via one connecting element 108_1 to 108_4 in each case. The difference between FIGS. 5g and 5h consists in that the four piezoelectric actuators 106_1 to 106_4 are arranged, in FIG. 5g, such that the contact points between the stroke structure 104 and the connecting elements 108_1 to 108_4 are arranged at outer ends of the portions 104a and 104b, whereas in FIG. 5h, the four piezoelectric actuators 106_1 to 106_4 are arranged such that the contact points between the connecting elements 108_1 to 108_4 and the stroke structure 104 are arranged adjacently to a projected extension of the third portion 104c.

Thus, FIGS. 5a to 5h illustrate different partial actuator configurations by using the example of the stroke body of FIG. 4a. Depending on the arrangement, the actuators are one-sidedly clamped actuators which are connected to the stroke body 104 via at least one, but advantageously two or more connecting elements 108_1 to 108_m and which move said stroke body 104 out of the plane. To achieve as large forces as possible, the actuators 106_1 to 106_n are advantageously configured to be broad, which results in transverse warping due to the piezoelectric effect acting within the plane. Said transverse warping shows in that the outer corners at the free end of the actuator exhibit the highest level of deflection and thus represent the optimum position for the connecting elements. In particular with very broad actuators, insertion of further connecting elements (referred to as optional connecting elements in FIGS. 5a to 5h) may be advantageous in order to achieve larger forces and to shift the stroke mode upward within the frequency range. Depending on the geometry of the stroke body 104, it may additionally be also useful to subdivide individual actuators into several actuators which are advantageously arranged in parallel with one another (e.g. FIG. 4c in combination with FIG. 5b). Wth regard to optimum area utilization for implementing large forces, the partial configurations depicted in FIGS. 5a to 5h may be combined with one another as desired.

It shall be noted that the different actuator configurations shown in FIGS. 5a-h using the example of the stroke body 104 of FIG. 4a are partial actuator configurations which may be combined as desired.

In embodiments, a cross-sectional area of the stroke structure 104 perpendicular to a direction 114 of the stroke movement of the stroke structure 104 may be smaller (e.g. by a factor of two (or three, four, five, or six) than a sum of piezoelectrically active actuator areas of the at least two piezoelectric actuators 106_1 to 106_n.

Thus, the actuator configurations may comprise a high level of area utilization by actuators that is larger than 40% (or 50%, 60%, 70%, or 80%) of the active area 130. Moreover, the actuator configurations may be combined as desired. Moreover, the actuator configurations may comprise additional connecting elements at the free ends of the individual actuators. In addition, the actuator configurations may comprise actuators that are subdivided into several narrow actuators and have additional connecting elements (see FIGS. 5b, 5d, and 5f). Furthermore, the actuator configurations may comprise actuators having trapezoidal or rounded shapes.

As was already mentioned with reference to FIGS. 4a to 4f, the stroke structure 104 may also comprise, in embodiments, two or more stroke bodies, it being possible for the stroke bodies to be coupled, e.g., via a rigid extended stroke body. For example, the central beam 104c might be dispensed with in FIG. 5e, so that the stroke structure 104 comprises two separate stroke bodies that might be coupled to each other by means of an extended stroke body (cf. FIG. 8). The region, or area, that has been freed up might be used more efficiently by other actuators in this case. Moreover, it would be feasible to couple several stroke bodies of an array arrangement via an extended stroke body in combination with spacers.

FIGS. 6a to 6f show schematic top views of six different embodiments of the connecting elements of the MEMS 100. In detail, FIGS. 6a to 6f each show the first connecting element 108_1 by way of example, which connects the first piezoelectric actuator 106_1 to the stroke structure 104. However, the description which follows may also be transferred to the other connecting elements 108_2 to 108_m.

In embodiments, the connecting element 108_1 may comprise a spring element. As can be seen in FIGS. 6a to 6h, the spring element may include at least one flexion spring element 108B (see FIG. 6a), at least one torsion spring element 108T (see FIG. 6b), or a combination of at least one flexion spring element 108B and at least one torsion spring element 108T (see FIGS. 6c to 6f).

Figure 6B:
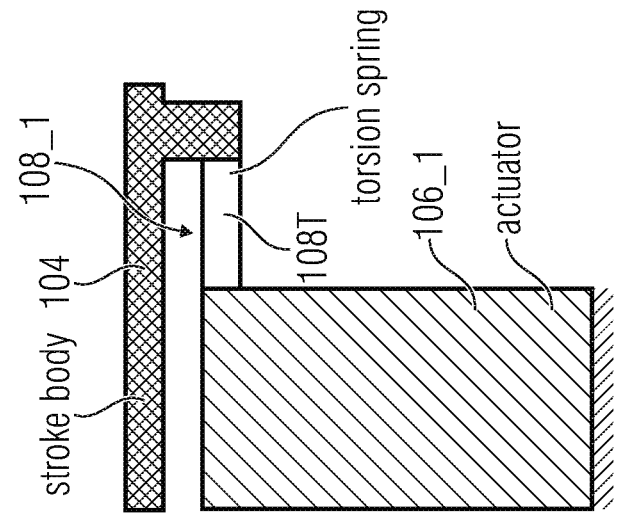
Figure 6A:
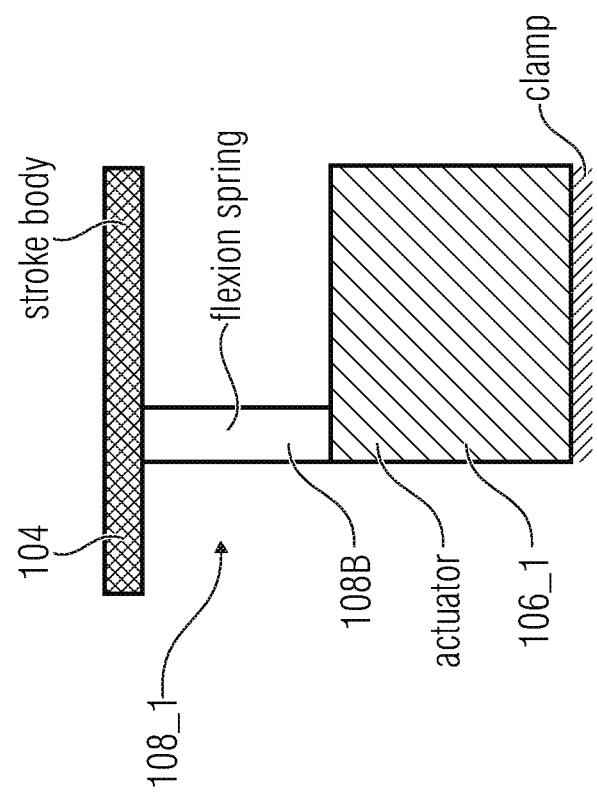
Figure 6D:
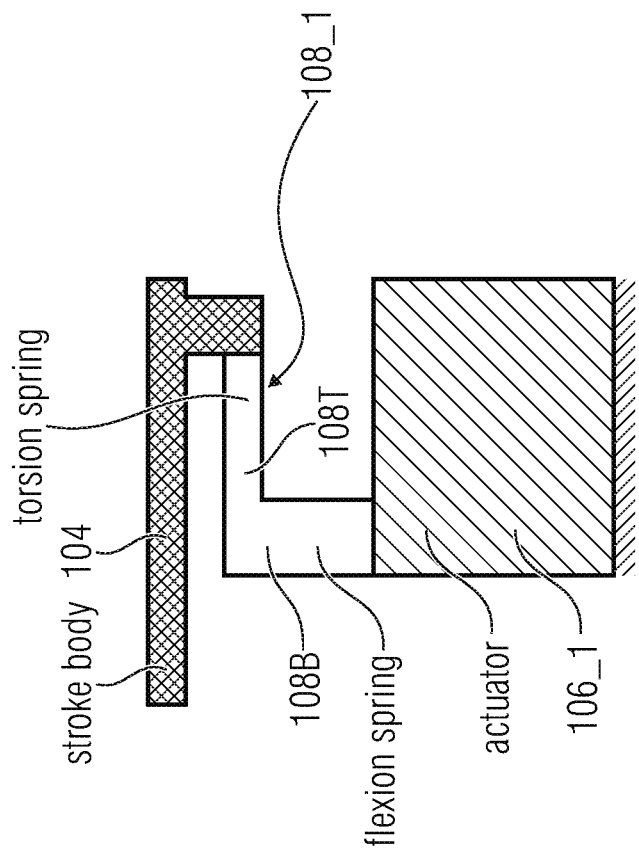
Figure 6C:
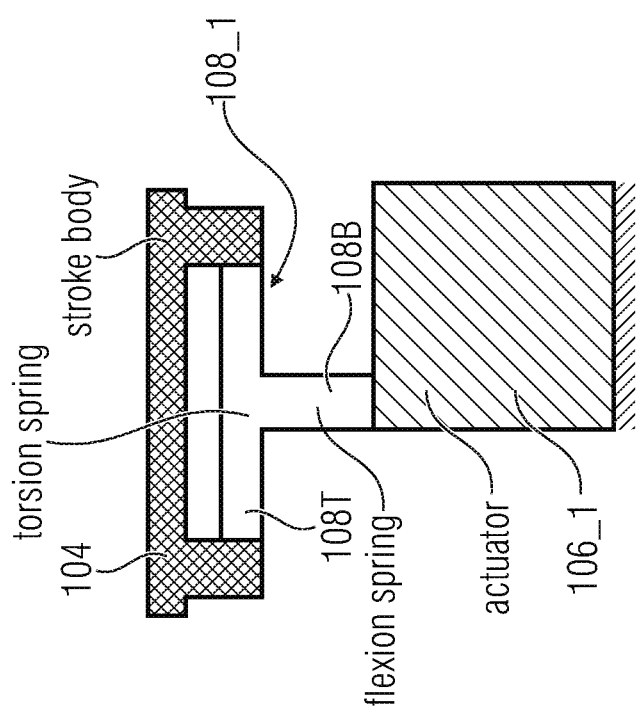

In order to ensure a flexible and, at the same time, robust connection between the actuators 106_1 to 106_n and the stroke body 104, various spring geometries may be employed. FIGS. 6a to 6f illustrate several spring arrangements which comprise, if dimensioned appropriately, a sufficient level of flexibility, on the one hand, in order to enable large deflections, while ensuring, on the other hand, a high level of transmission of forces between the actuators 106_1 to 106_n and the stroke body 104. Due to the fact that both flexion springs 108B and torsion springs 108T use comparatively large distances between actuator and stroke body (distance spring length), utilization of combined spring geometries is recommendable. FIGS. 6c to 6f illustrate corresponding geometries wherein the effective spring length may clearly exceed the distance between actuator and stroke body because of several elements which are advantageously arranged perpendicularly to one another. While arrangements such as FIG. 6d or 6f are suitable, in particular, for connecting elements arranged at outer actuator corners, springs such as those in FIG. 6c and FIG. 6e are suitable primarily for connecting points between the corners on account of their symmetries (see optional connecting elements in FIGS. 5a to 5h).

It shall be noted that in the schematic top views, shown in FIGS. 6a to 6f, of different connecting elements, the elements referred to as the stroke body 104 and the actuator 106_1 are exemplarily and merely represent portions of the actual functional elements.

Apart from the scaling of individual elements, the following deviations from FIG. 6 are feasible. (1) The spacers, referred to as flexion springs in FIGS. 6a to 6h, between the actuator and the torsion springs may also be configured as rigid elements or piezoelectrically active extensions of the actuator. (2) The spacers, depicted as locally broadened areas of the stroke body 104 in FIG. 6, between the springs and the stroke body 104 may also be configured as flexible elements. (3) All of the or individual spring elements may comprise rounded areas. (4) Several spring elements may be combined with one another or be arranged one behind the other in several versions (cascading). (5) The individual spring elements may comprise angles other than 90°, so that the springs are exposed to both bending and torsion stress. (6) All of the springs or spacers may also be laterally attached to the actuators (cf. FIG. 6b). (7) Springs and spacers may consist of the same or individual passive and/or piezoelectric functional layers as do the actuators. Alternatively, other materials may also be used.

For detecting the position of the stroke structure, or of the stroke body 104, the MEMS 100 may additionally comprise at least one sensor element, as will be explained below with reference to FIGS. 7a and 7b.

FIGS. 7a and 7b show schematic top views of two embodiments of a piezoelectric actuator with an integrated position sensor. In detail, FIGS. 6a and 7b each show, by way of example, integration of the position sensor with the first piezoelectric actuator 106_1. However, the description which follows is equally applicable to the other piezoelectric actuators 106_2 to 106_n.

As can be seen in FIG. 7a, the piezoelectric position sensor and the piezoelectric actuator 106_1 may be formed by a piezoelectric layer, it being possible to use one region as the sensor and another region as the actuator. Moreover, it is possible for a stack consisting of two piezoelectric layers to be used, one or two layers at least partly forming the at least one piezoelectric sensor 140, while another one of the two layers forms the piezoelectric actuator 106_1. In other words, FIGS. 7a and 7b show schematic top views of a (contiguous) beam structure having separate sensor areas 140 and actuator areas 142. Of course, it is not necessary to use the entire layer for the sensor. It would also be feasible for a large part to be used for the actuator system and only a small area to be used for the sensor.

In order to keep the losses in terms of actuator performance (deflection, force) which result from the additional space requirement on the part of sensor and connecting elements to a minimum, the sensor electrodes may also be implemented directly on the beam structures used as actuators. FIGS. 7a and 7b illustrate two examples wherein in each case one sensor electrode (sensor area) takes up a comparatively small part of the actuator area. The sensor electrodes are electrically insulated from the actuator electrodes and may be configured both as two-dimensional and interdigital electrodes.

A further, more efficient possibility consists in using several piezoelectric layers (cf. FIGS. 3a to 3d), one layer being at least partially used for position detection. Since the requirements placed upon the sensor system and the actuator system may differ, a combination of different piezoelectric materials having different properties is also feasible (e.g. PZT for the actuator system, AlN for the sensor system). As an alternative to arrangements wherein several piezoelectric layers are arranged one above the other (cf. FIGS. 3a to 3d), the sensor and actuator materials may also be located adjacently to another, by analogy with FIGS. 7a and 7b.

Due to the bidirectionality of the piezoelectric effect, individual actuators may also be used as sensor elements. In this case, the voltage generated via the direct piezoelectric effect and being approximately proportional to the deflection of the stroke body 104 is tapped via the actuator electrodes and is evaluated accordingly. In order to keep impairment of the deflection to a minimum, comparatively long and narrow actuator elements are particularly suitable. In order to prevent undesired tilting of the stroke body 104 due to an asymmetrical drive, corresponding sensor elements should advantageously be arranged opposite each other in pairs in each case.

Instead of or in addition to the at least piezoelectric position sensor, the MEMS may also comprise at least one piezoresistive or one capacitive position sensor configured to provide a sensor signal dependent on the deflection of the diaphragm.

Figure 8:
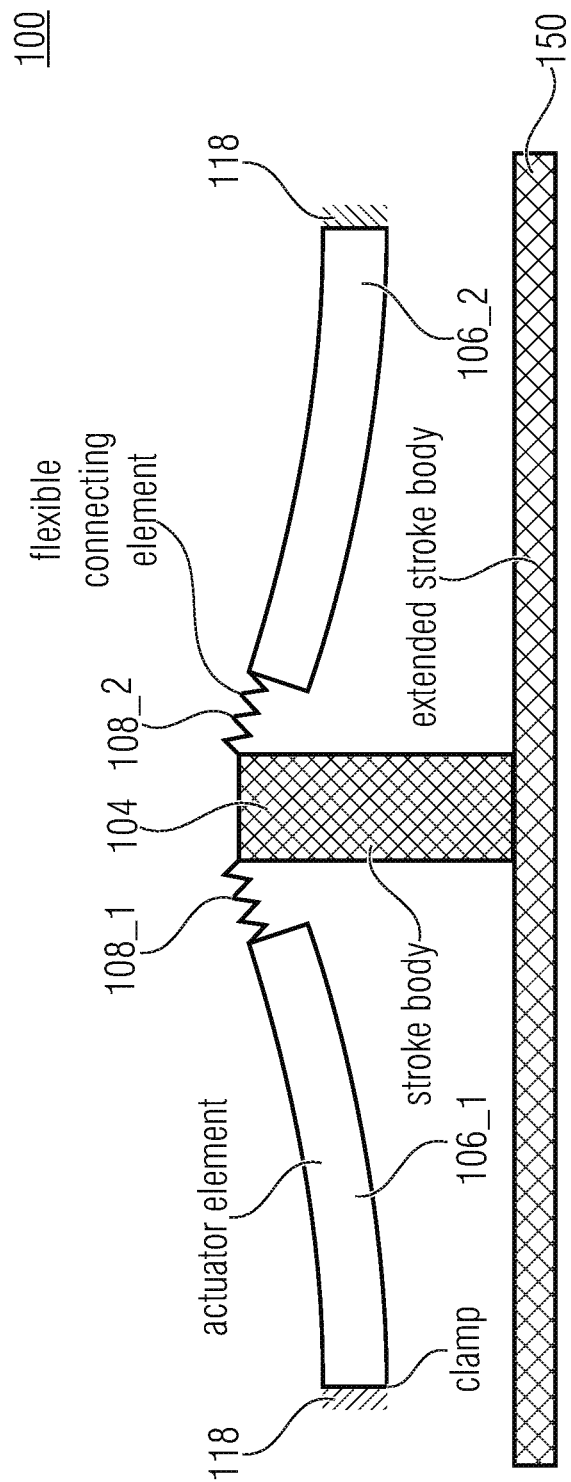
FIG. 8 shows a schematic cross-sectional view of a MEMS, in accordance with an embodiment of the present invention.

While in FIGS. 1a to 2 and 4a to 5a, a stroke body, or a stroke structure, 104 with as small a surface area as possible was aimed at in order to maximize the deflection and force, many applications, however, may use a stroke body 104 which has as large a surface area as possible which is advantageously contiguous. For example in fluidic applications, the displaced gas or liquid volume is increased. By providing suitable assembly surfaces, the stroke body 104 may therefore be configured such that a further, advantageously rigid and large-area body 150 may be attached on top of or underneath the stroke body 104, as is shown in FIG. 8. The extended stroke body 150 may comprise any geometry and may protrude beyond the active area 130 spanned by the stroke body 104 and the spring elements (cf. FIGS. 4a to 4h). FIG. 8 illustrates this by means of a thin plate 150 fixedly connected to the stroke body 104 at corresponding points of support. For example, the MEMS 100 may comprise a stroke body extended by a plate 150 adhered to it.

FIG. 8 shows a schematic cross-sectional view of the MEMS 100, in accordance with an embodiment of the present invention. The MEMS 100 may comprise an extended stroke body 150 coupled to the stroke body 104. The extended stroke body 150 may be arranged perpendicularly to the stroke movement direction 114 of the stroke body, for example, and may be coupled or connected to a front end of the stroke body.

Since actuators exhibiting large strokes and forces are suitable, in particular, for displacing gases and liquids (cf. technical fields of application below), integration of flexible diaphragms may also be useful, as will be explained below.

Figures 9A, 9B:
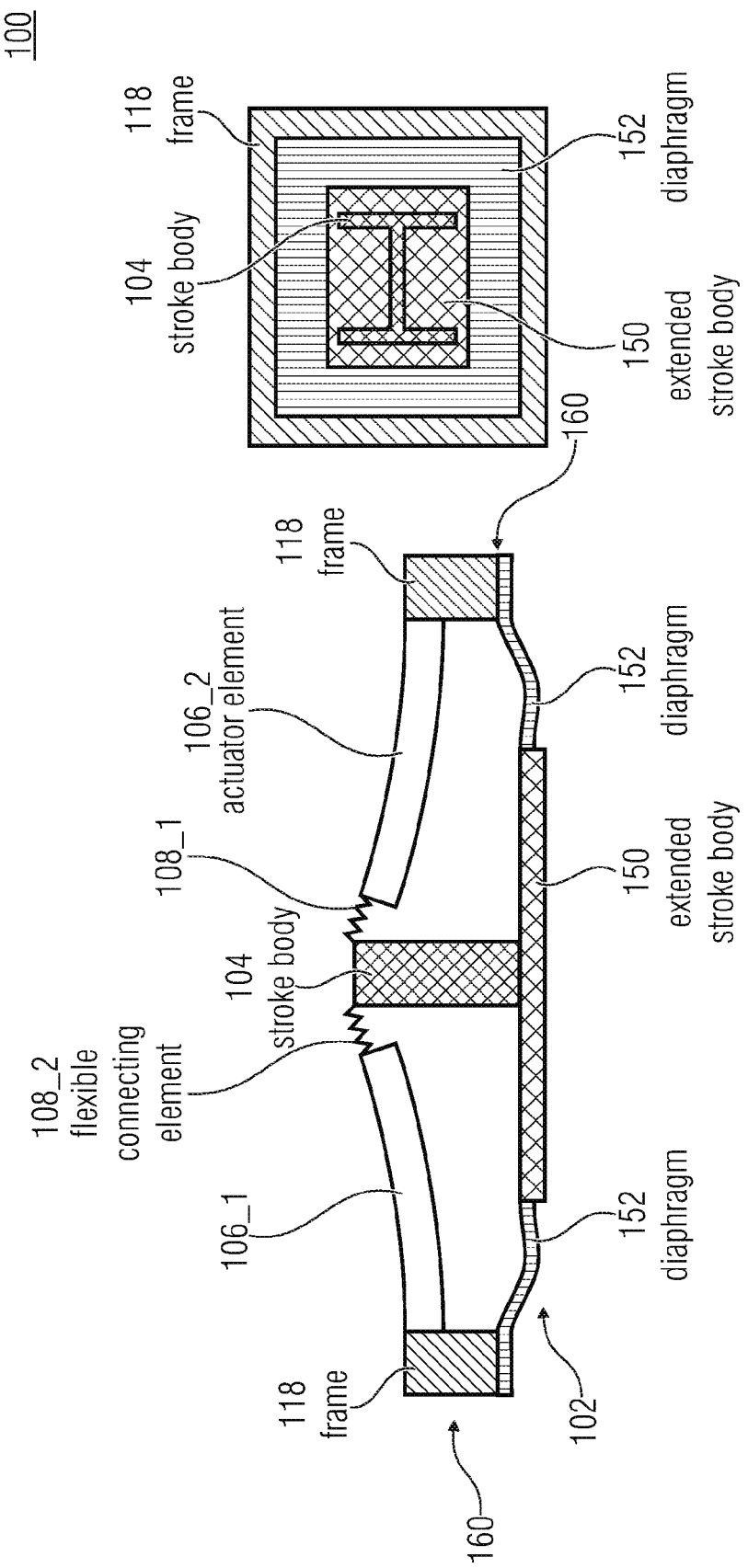
FIG. 9a shows a schematic cross-sectional view of a MEMS having a diaphragm with an extended stroke body, in accordance with an embodiment of the present invention.
FIG. 9b shows a schematic top view of the MEMS shown in FIG. 9a and having the diaphragm and the extended stroke body, in accordance with an embodiment of the present invention.

FIG. 9a shows a schematic cross-sectional view of an embodiment of the MEMS 100, while FIG. 9b shows a schematic top view of the MEMS 100 shown in FIG. 9a; in FIG. 9b, representation of the piezoelectric actuators 106_1 and 106_2 and of the connecting elements 108_1 and 108_2 was dispensed with.

As can be seen in FIGS. 9a and 9b, the diaphragm 102 may comprise a rigid region 150 and a flexible region 152, it being possible for the stroke structure 104 to be coupled to the rigid region 150 of the diaphragm. The rigid region of the diaphragm 102 may be implemented by the extended stroke body 150, for example (cf. FIG. 8). The diaphragm 102 may be clamped within a clamp 118, e.g. a frame.

FIGS. 9a and 9b illustrate, by way of example, a possible architecture wherein the top and bottom sides of the MEMS 100 are completely separate from each other by means of a diaphragm 102 (sealing diaphragm) so that the displaced fluid cannot get to the respectively other side by flowing around the stroke body 104. In acoustics, this separation may be used for preventing an acoustic short circuit. For microvalves and micropumps, too, fluidic separation of front and rear sides may be used.

FIG. 10a shows a schematic cross-sectional view of an embodiment of the MEMS 100, while FIG. 10b shows a schematic top view of the MEMS 100 in FIG. 10a; in FIG. 10b, representation of the piezoelectric actuators 106_1 and 106_2 and of the connecting elements 108_1 and 108_2 was dispensed with.

In accordance with FIGS. 10a and 10b, the diaphragm 102 (sealing diaphragm) formed by a contiguous flexible region 152, for example, may also span the entire active region 130 surrounded by a rigid frame 118, so that an extended stroke body 150 may dispensed with. Irrespectively thereof, the elastic diaphragms may be implemented by means of either hybrid integration or spin-on processes (rotational coating process) or spray processes at the wafer level. Depending on the intended use, the diaphragm 102 may be configured to be either tensioned or loose and to have a wavy or folded profile. The latter variant is suitable, in particular, for applications wherein impairment of the deflection of the stroke body 104 by the diaphragm 102 is to be kept to a minimum.

FIG. 11a shows a schematic cross-sectional view of an embodiment of the MEMS 100, while FIG. 11b shows a schematic top view of the MEMS 100 shown in FIG. 11a; in FIG. 11b, representation of the piezoelectric actuators 106_1 and 106_2 and of the connecting elements 108_1 and 108_2 was dispensed with.

Unlike FIGS. 10a and 10b, FIGS. 11a and 11b illustrate an example wherein the diaphragm 102 is arranged above the actuators 106_1 and 106_2. In order to avoid mechanical contact with the connecting elements 108_1 and 108_2 and actuator elements 106_1 and 106_2, the diaphragm 102 is spaced apart from the actuator plane by means of spacers 160. The actuator plane here is the plane within which the piezoelectric actuators 106_1 and 106_2 are arranged in an idle, i.e. non-deflected, position, and/or the plane spanned by the piezoelectric actuators 106_1 to 106_2 in the idle position.

As is schematically (not to scale) indicated in FIGS. 9a to 11b, a lever arm between one of the points of application of force of the H-shaped stroke structure 104 to the diaphragm 102 and a nearest location point of a diaphragm suspension 118 (e.g. frame) may be half the size, at the most, (i.e. smaller by at least a factor of 2 (or, e.g., 3, 4, or 5)) as a lever arm (e.g. shortest distance between the clamp 118 and one of the contact points 112_1 to 112_m of the respective piezoelectric actuator) of the at least two piezoelectric actuators 106_1 and 106_2.

To illustrate the above generalized representations, some specific embodiments will be presented below. They are designs based on actuators made of piezoelectric PZT (lead zirconium titanate), corresponding metal electrodes as well as silicon as a passive material. The designs have been devised for MEMS loudspeakers and optimized by means of FEM simulations.

Figure 12A:
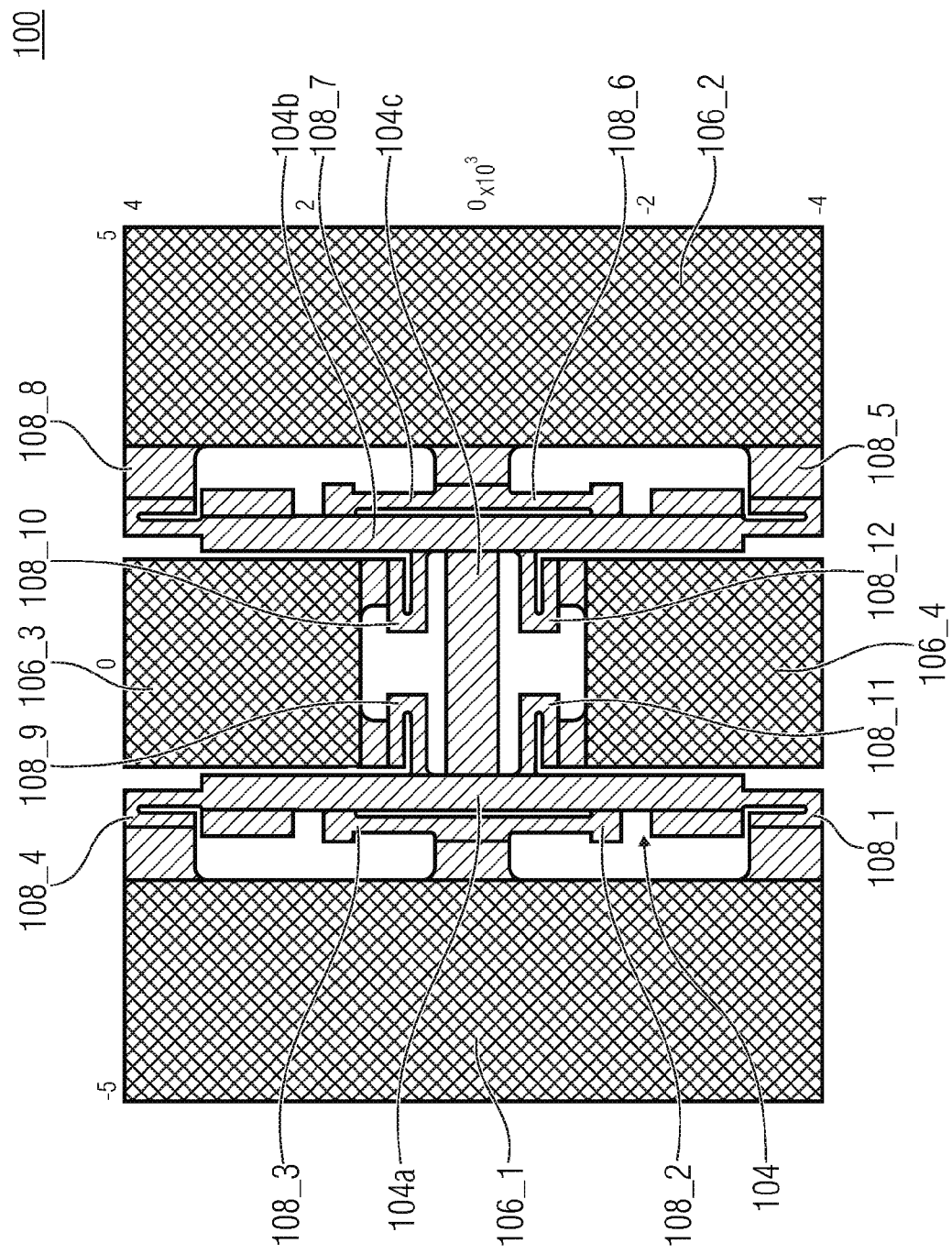
FIG. 12a shows a top view of a CAD model of the MEMS, in accordance with an embodiment of the present invention.
Figure 12B:
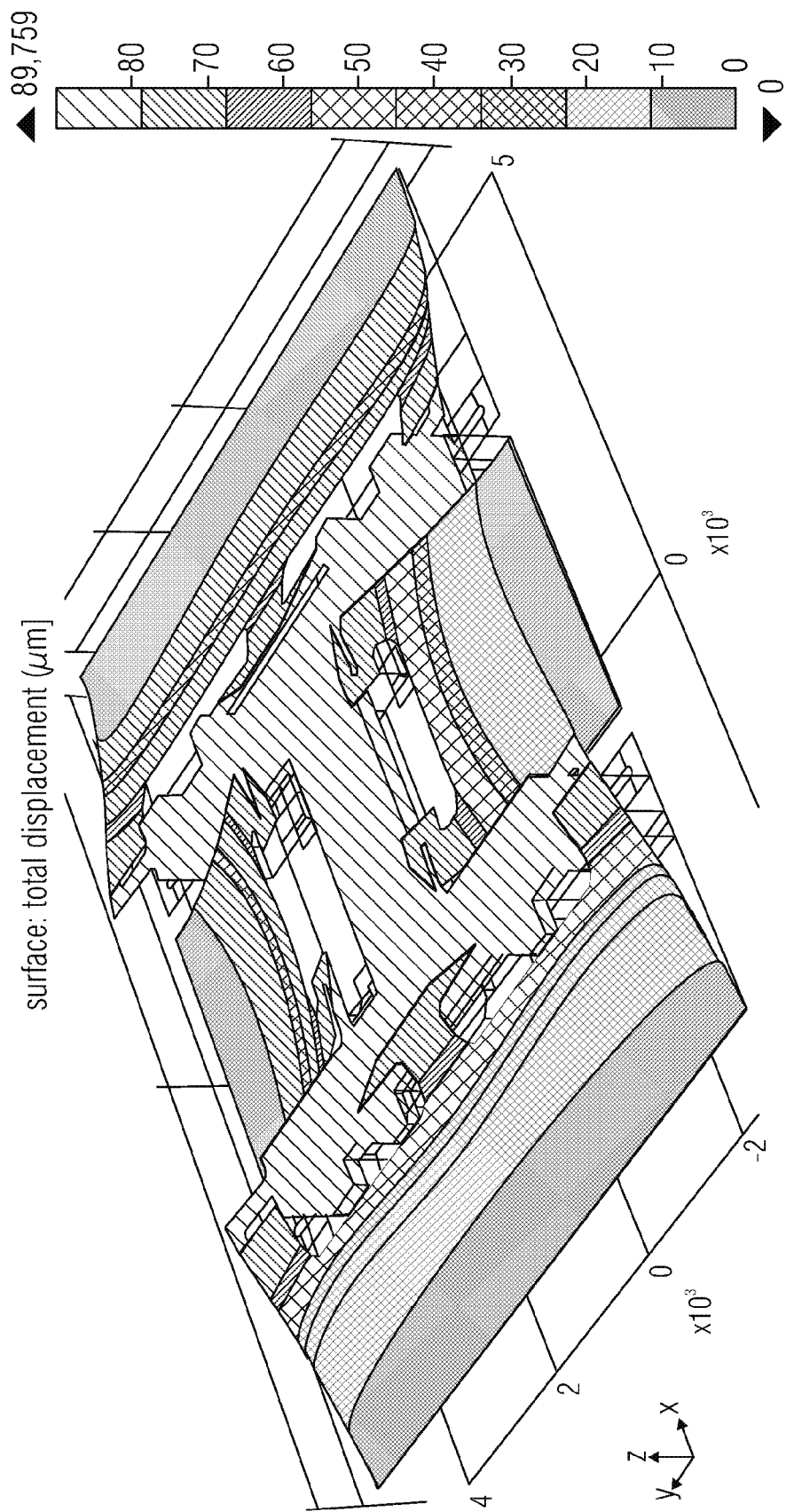
FIG. 12b shows a perspective view of an FEM simulation of the MEMS shown in FIG. 12a, in accordance with an embodiment of the present invention.

FIG. 12a shows a top view of a CAD model of a MEMS 100 in accordance with an embodiment of the present invention, while FIG. 12b shows a perspective view of an FEM simulation of a deflection of the CAD model, shown in FIG. 12a, of the MEMS 100.

The CAD model, shown in FIG. 12a, of the MEMS 100 is based on a combination of the embodiments shown in FIGS. 4a, 4d, 5b, 5e, 6c, 6d, and 6f.

As can be seen in FIG. 12a, the MEMS 100 comprises an H-shaped stroke structure 104 and four piezoelectric actuators 106_1 to 106_n (n=4). In detail, the stroke structure 104 comprises three portions 104a to 104c arranged to form an H-shaped stroke structure 104, so that the stroke structure 104 has the shape of an H within a sectional plane extending perpendicularly to the direction 114 (see FIG. 1a) of the stroke movement of the stroke structure 104.

A first piezoelectric actuator 106_1 of the four piezoelectric actuators 106_1 to 106_ n (n=4) is arranged, outside the H-shaped stroke structure 104, along a first portion 104a of the three portions 104a to 104c of the stroke structure 104, a second piezoelectric actuator 106_2 of the four piezoelectric actuators 106_1 to 106_n (n=4) being arranged, outside the H-shaped stroke structure 104, along a second portion 104b of the three portions 104a to 104c of the stroke structure 104, the first portion 104a and the second portion 104b of the stroke structure 104 extending in parallel with each other.

The first piezoelectric actuator 106_1 extends across at least the entire first portion 104a of the stroke structure 104 and is connected to at least two of the mutually spaced-apart contact points of the first portion 104a of the stroke structure 104 via at least two (according to FIG. 12a, via four) mutually spaced-apart connecting elements 108_1 to 108_4 of the mutually spaced-apart connecting elements 108_1 to 108_m (m=12), the second piezoelectric actuator 106_2 extending across at least the entire second portion 104b of the stroke structure 104 and being connected to at least two of the mutually spaced-apart contact points of the second portion 104b of the stroke structure 104 via at least two (according to FIG. 12a, via four) mutually spaced-apart connecting elements 108_5 to 108_8 of the mutually spaced-apart connecting elements 108_1 to 108_m.

A third piezoelectric actuator 106_3 of the four piezoelectric actuators 106_1 to 106_n (n=4) is at least partly arranged, inside the H-shaped stroke structure 104, along a first side of a third portion 104c of the three portions 104a to 104c of the stroke structure 104, a fourth piezoelectric actuator 106_4 of the four piezoelectric actuators 106_1 to 106_n (n=4) being arranged, inside the H-shaped stroke structure 104, along a second side, located opposite the first side, of the third portion 104c of the stroke structure 104, the third portion 104c extending perpendicularly to the first portion 104a and to the second portion 104b.

The third piezoelectric actuator 106_3 is connected to the stroke structure 104 via at least two mutually spaced-apart connecting elements 108_9 and 108_10 of the mutually spaced-apart connecting elements 108_1 to 108_m (m=12) (here, to the first portion 104a of the stroke structure 104 via a connecting element 108_9, and to the second portion 104b of the stroke structure 104 via a connecting element 108_10), the fourth piezoelectric actuator 106_4 being connected to the stroke structure 104 via at least two mutually spaced-apart connecting elements 108_11 and 108_12 of the mutually spaced-apart connecting elements 108_1 to 108_m (m=12) (here, to the first portion 104a of the stroke structure 104 via a connecting element 108_11, and to the second portion 104b of the stroke structure 104 via a connecting element 108_12).

Thus, FIGS. 12a and 12b show a design based on two outer actuators 106_1 and 106_2 and two inner actuators 106_3 and 106_4, which are arranged opposite each other in pairs in each case. In order to achieve large forces and deflections, the actuators 106_1 to 106_4 have widths as large as possible, whereby in the activated state, the above-mentioned transverse warping clearly arises (see FIG. 12b). At the free actuator corners, at the points exhibiting the highest levels of deflection, the actuators are connected to the stroke body 104 via area-efficient springs (cf. image 3.5d and image 3.5f), said stroke body 104 having additional assembly surfaces implemented on its ends by means of locally broadened areas. Due to the large width/length ratio, the two outer actuators 106_1 and 106_2 comprise an additional connecting element, with the aid of which the generated forces may be clearly increased once more without any major losses in terms of deflection.

Figure 13A:
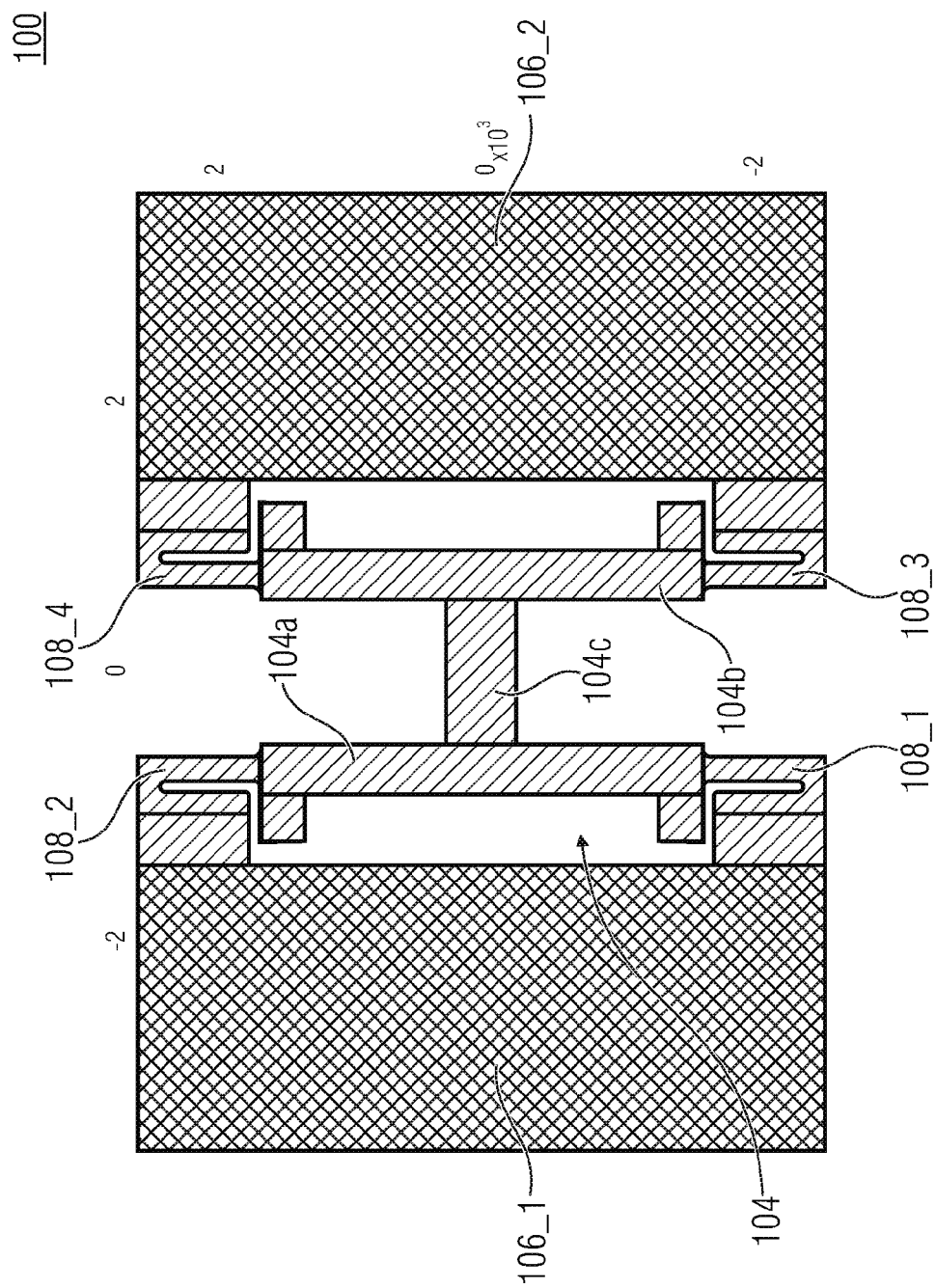
FIG. 13a shows a top view of a CAD model of the MEMS, in accordance with an embodiment of the present invention.
Figure 13B:
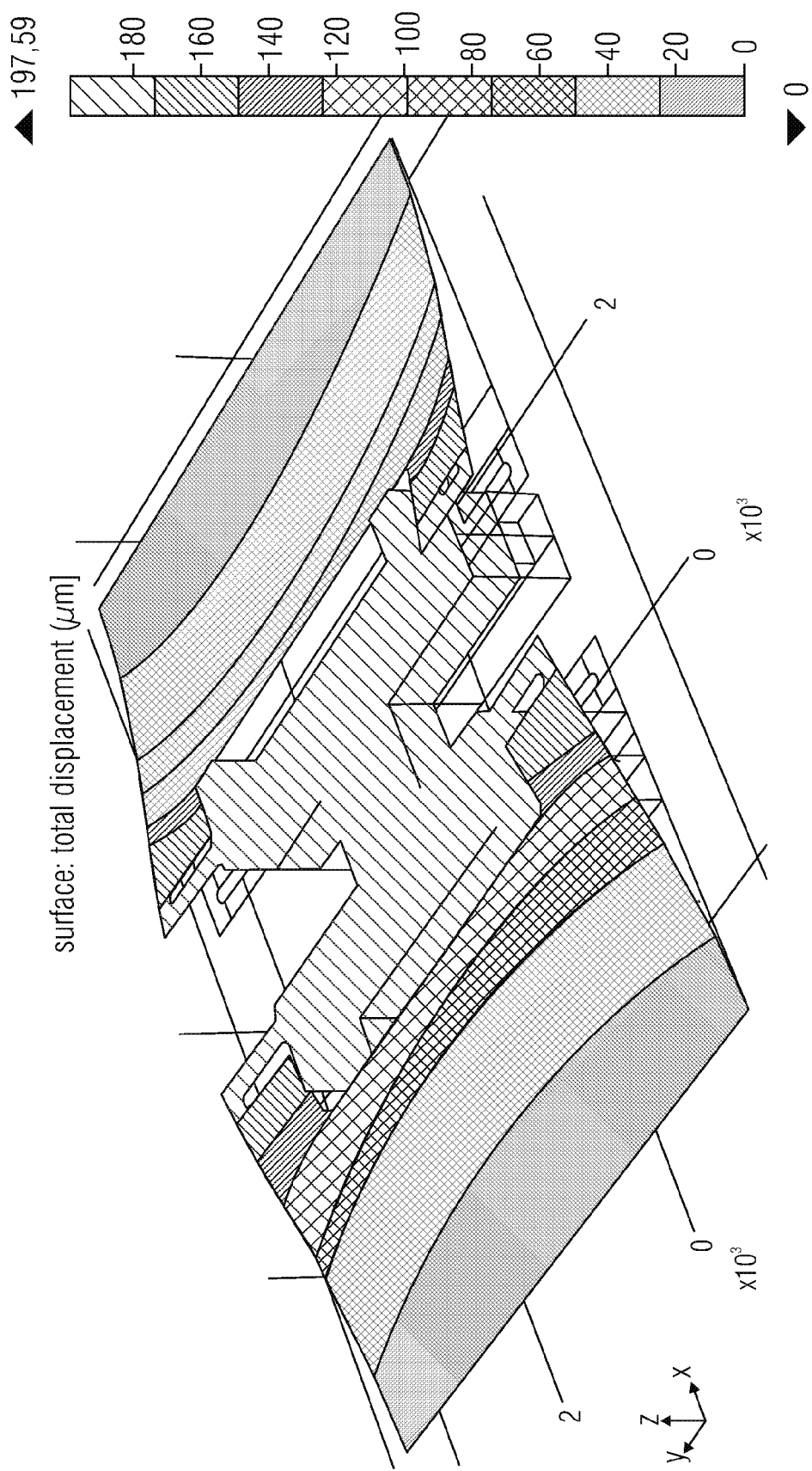
FIG. 13b shows a perspective view of an FEM simulation of the MEMS shown in FIG. 13a, in accordance with an embodiment of the present invention.

FIG. 13a shows a top view of a CAD model of a MEMS 100 in accordance with an embodiment of the present invention, while FIG. 13b shows a perspective view of an FEM simulation of a deflection of the CAD model, shown in FIG. 13a, of the MEMS 100.

The CAD model, shown in FIG. 13a, of the MEMS 100 is based on a combination of the embodiments shown in FIGS. 4a, 4d, 5e, and 6f.

In contrast to FIG. 12a, the CAD model, shown in FIG. 13a, of the MEMS 100 comprises (only) two piezoelectric actuators 106_1 and 106_n (n=2), a first piezoelectric actuators 106_1 of the two piezoelectric actuators 106_1 and 106_2 being connected to the first portion 104a of the stroke structure via two mutually spaced-apart connecting elements 108_1 and 108_2, and the second piezoelectric actuator 106_2 of the two piezoelectric actuators 106_1 and 106_2 being connected to the second portion 104b of the stroke structure 104 via two mutually spaced-apart connecting elements 108_3 and 108_4.

Thus, FIGS. 13a and 13b illustrate a version of FIGS. 12a and 12b that is reduced in size and wherein the two central actuators 106_3 and 106_4 have been dispensed with since the minimum actuator length would have exceeded the available length. On account of the clearly narrower outer actuators 106_1 and 106_2, the two lateral actuators 106_1 and 106_2 comprise only two connecting elements 108_1 to 108_4 in each case, which again is a space-saving combination of flexion and torsion springs.

Figure 14A:
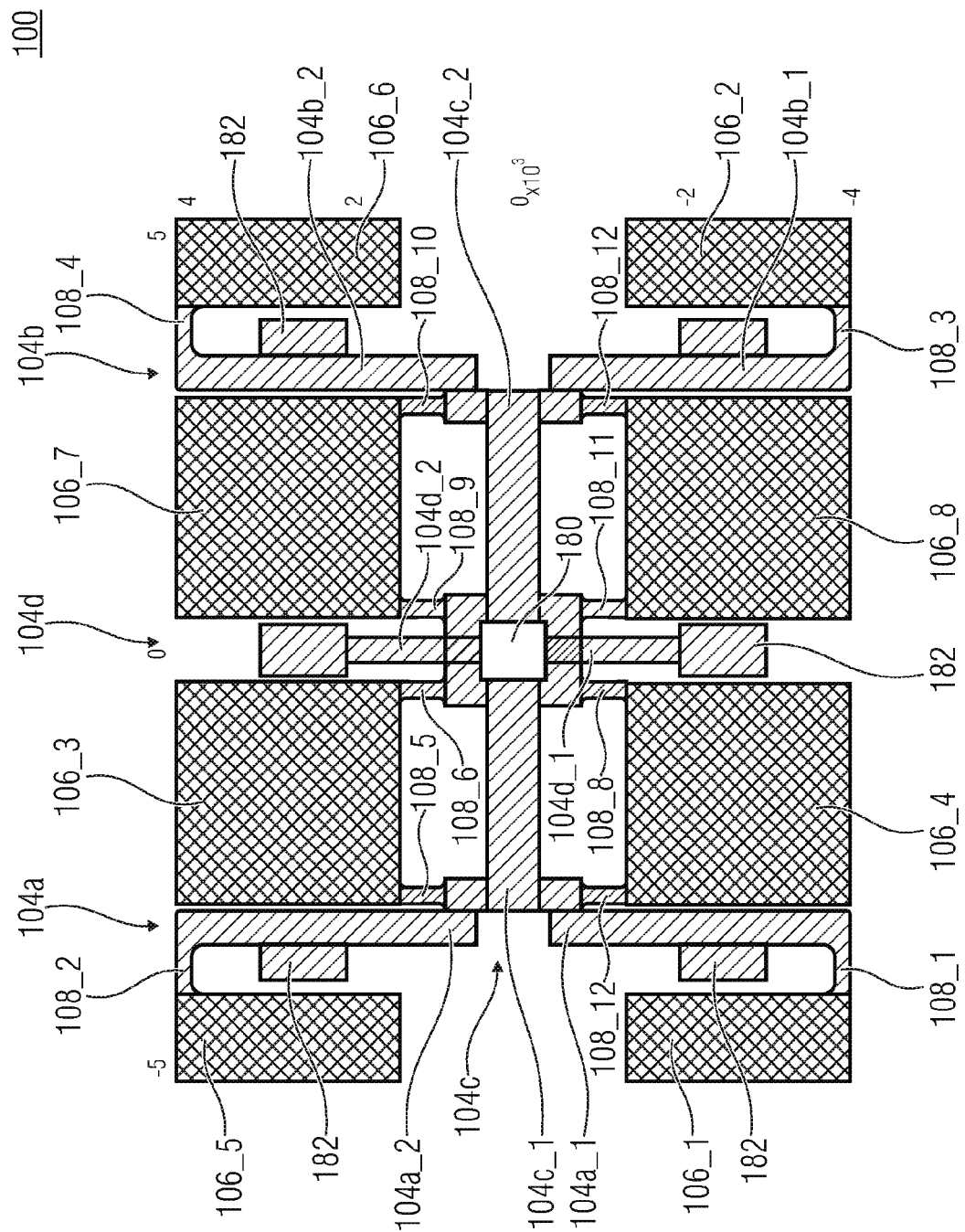
FIG. 14a shows a top view of a CAD model of the MEMS, in accordance with an embodiment of the present invention.
Figure 14B:
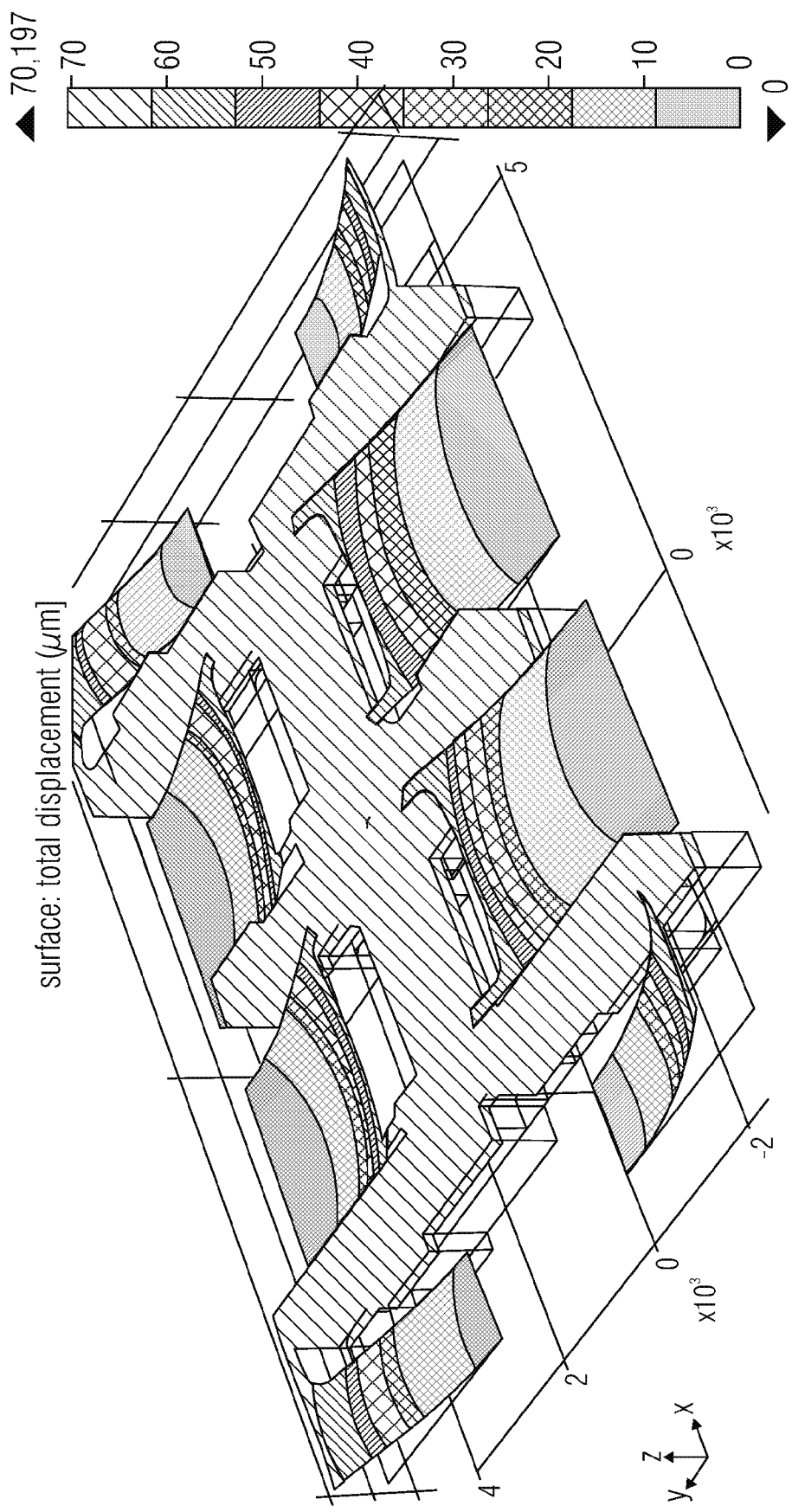
FIG. 14b shows a perspective view of an FEM simulation of the MEMS shown in FIG. 14a, in accordance with an embodiment of the present invention.

FIG. 14a shows a top view of a CAD model of a MEMS 100 in accordance with an embodiment of the present invention, while FIG. 14b shows a perspective view of an FEM simulation of a deflection of the CAD model, shown in FIG. 14a, of the MEMS 100.

As can be seen in FIG. 14a, the MEMS 100 comprises an H-shaped stroke structure 104 and eight piezoelectric actuators 106_1 to 106_n (n=8). In detail, the stroke structure 104 comprises three portions 104a to 104c arranged to form an H-shaped stroke structure 104, so that the stroke structure 104 has the shape of an H within a sectional plane extending perpendicularly to the direction 114 of the stroke movement of the stroke structure 104.

A first piezoelectric actuator 106_1 and a fifth piezoelectric actuator 106_5 of the eight piezoelectric actuators 106_1 to 106_n (n=8) are arranged, outside the stroke structure 104, along the first portion 104a of the stroke structure 104, a second piezoelectric actuator 106_2 and a sixth piezoelectric actuator 106_6 of the eight piezoelectric actuators 106_1 to 106_8 being arranged, outside the stroke structure 104, along the second portion 104b of the stroke structure 104.

The first piezoelectric actuator 106_1 and the fifth piezoelectric actuator 106_5 are connected to at least one of the mutually spaced-apart contact points of the first portion 104a of the stroke structure 104 via in each case at least one connecting element 108_1 and 108_2, respectively, of the mutually spaced-apart connecting elements 108_1 to 108_m (m=12), the second piezoelectric actuator 106_2 and the sixth piezoelectric actuator 106_6 being connected to at least one of the mutually spaced-apart contact points of the second portion 104b of the stroke structure 104 via at least one connecting element 108_3 and 108_4, respectively, of the mutually spaced-apart connecting elements 108_1 to 108_m (m=12).

As can be seen in FIG. 14a, the first portion 104a is subdivided into a first segment 104a_1 and a second segment 104a_2, the first piezoelectric actuator 106_1 being arranged along the first segment 104a_1 of the first portion 104a and connected to the first segment 104a_1 of the first portion 104a via the connecting element 108_1, the fifth piezoelectric actuator 106_5 being arranged along the second segment 104a_2 of the first portion 104a and being connected to the second segment 104a_2 of the first portion 104a via the connecting element 108_2.

Moreover, the second portion 104b is subdivided into a first segment 104b_1 and a second segment 104b_2, the second piezoelectric actuator 106_2 being arranged along the first segment 104b_1 of the second portion 104b and connected to the first segment 104b_1 of the second portion 104b via the connecting element 108_3, the sixth piezoelectric actuator 106_6 being arranged along the second segment 104b_2 of the second section 104b and being connected to the second segment 104b_2 of the second portion 104b via the connecting element 108_4.

A third piezoelectric actuator 106_3 and a seventh piezoelectric actuator 106_7 of the eight piezoelectric actuators 106_1 to 106_n (n=8) is at least partly arranged, inside the stroke structure 104, along the first side of the third portion 104c of the stroke structure 104, a fourth piezoelectric actuator 106_4 and an eighth piezoelectric actuator 106_8 of the eight piezoelectric actuators 106_1 to 106_8 being at least partly arranged, inside the stroke structure 104, along the second side of the third portion 104c of the stroke structure 104.

As can be seen in FIG. 14a, the third portion 104c is subdivided into a first segment 104c_1 and a second segment 104c_2, the third piezoelectric actuator 106_3 being arranged along a first side of the first segment 104c_1 of the third portion 104c, the fourth piezoelectric actuator 106_4 being arranged along a second side, located opposite the first side, of the first segment 104c_1 of the third portion 104c, the seventh piezoelectric actuator 106_7 being arranged along a first side of the second segment 104c_2 of the third portion 104c, the eighth piezoelectric actuator 106_8 being arranged along a second side, located opposite the first side, of the second segment 104c_2 of the third portion 104c.

The third piezoelectric actuator 106_3 and the fourth piezoelectric actuator 106_4 are connected to the respective side of the first segment 104c_1 of the third portion 104c via two mutually spaced-apart connecting elements 108_5 to 108_8, respectively, of the mutually spaced-apart connecting elements, the seventh piezoelectric actuator 106_7 and the eighth piezoelectric actuator 106_8 being connected to the respective side of the second segment 104c_2 of the third portion 104c via two mutually spaced-apart connecting elements 108_9 to 108_12, respectively.

The stroke structure 104 may further comprise a fourth portion 104d which is arranged centrally in parallel between the first portion 104a and the second portion 104b, it also being possible for the fourth portion 104d to be subdivided into a first segment 104d_1 and a second segment 104d_2.

Thus, FIGS. 14a and 14b illustrate an example having eight actuators 106_1 to 106_n (n=8) arranged in parallel with one another, the four outer actuators being aligned in an inverse manner, so that they transmit their force, via torsion springs, as far outside the center of gravity of the stroke body as possible (shift (displacement) of parasitic tilting modes in the frequency range). In contrast to the previous examples, the central beam 104c of the stroke body 104 comprises locally broadened areas as well as a hole 180 in the center. As a result, the points of application where the inner actuators are connected to the stroke body via flexion springs are relocated toward the outside from the center of gravity with as little increase in mass as possible so as to counteract any parasitic modes. The additional vertical cantilevers 104d_1 and 104_d2 as well as the locally broadened areas 182 on the vertical stroke-body beams 104a, 104b, 104c serve as adhesive surfaces for hybrid integration of an extended stroke body with increased surface area. Due to the comparatively narrow actuator elements, deflection and forces are smaller than in the example of FIG. 12a. In contrast, the stroke body 104 exhibits a clearly larger span and a closer arrangement of adhesives surfaces, so that the arrangement enables hybrid application of particularly lightweight plates or diaphragms 102 that are less rigid mechanically.

Figure 15A:
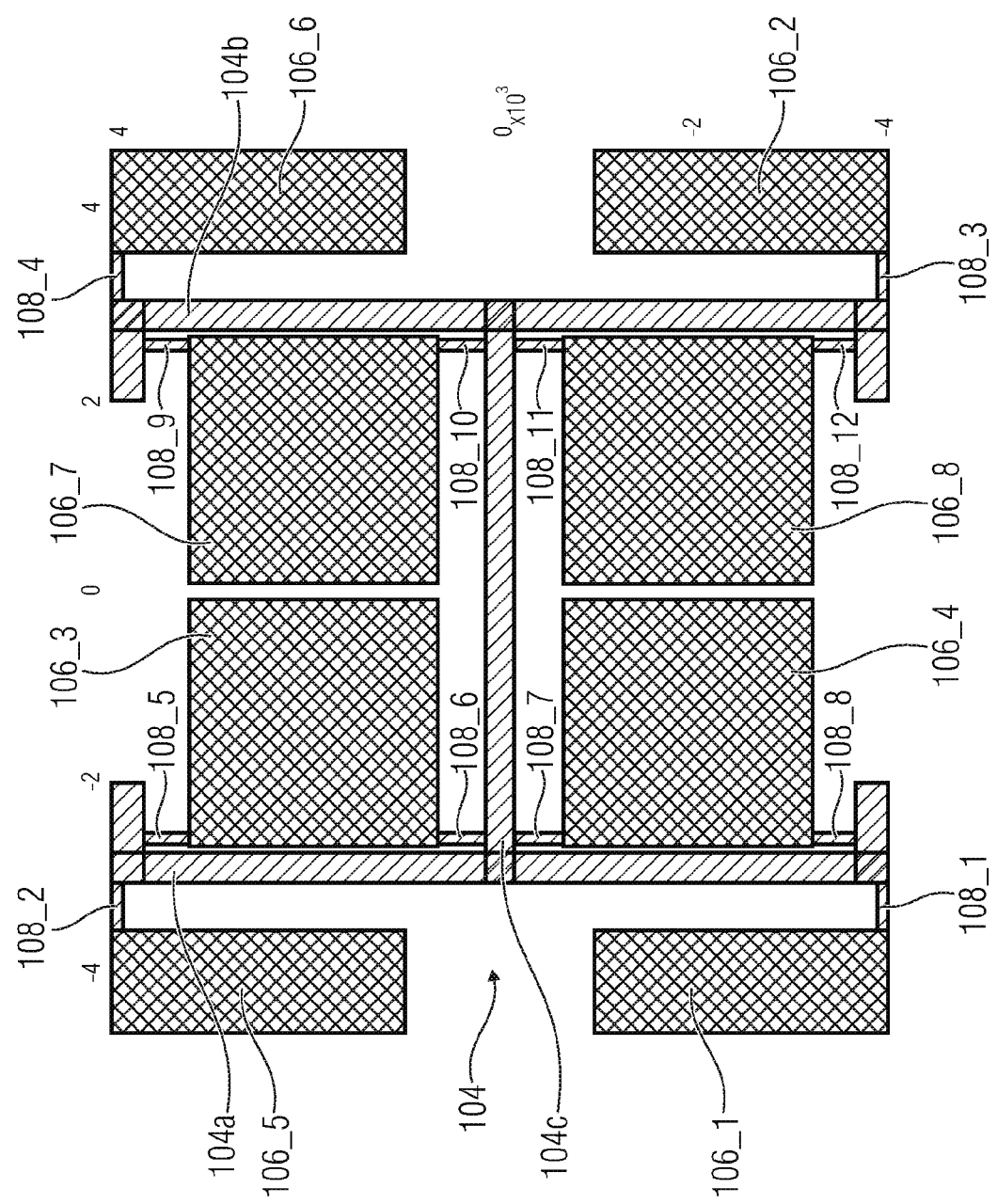
FIG. 15a shows a top view of a CAD model of the MEMS, in accordance with an embodiment of the present invention.
Figure 15B:
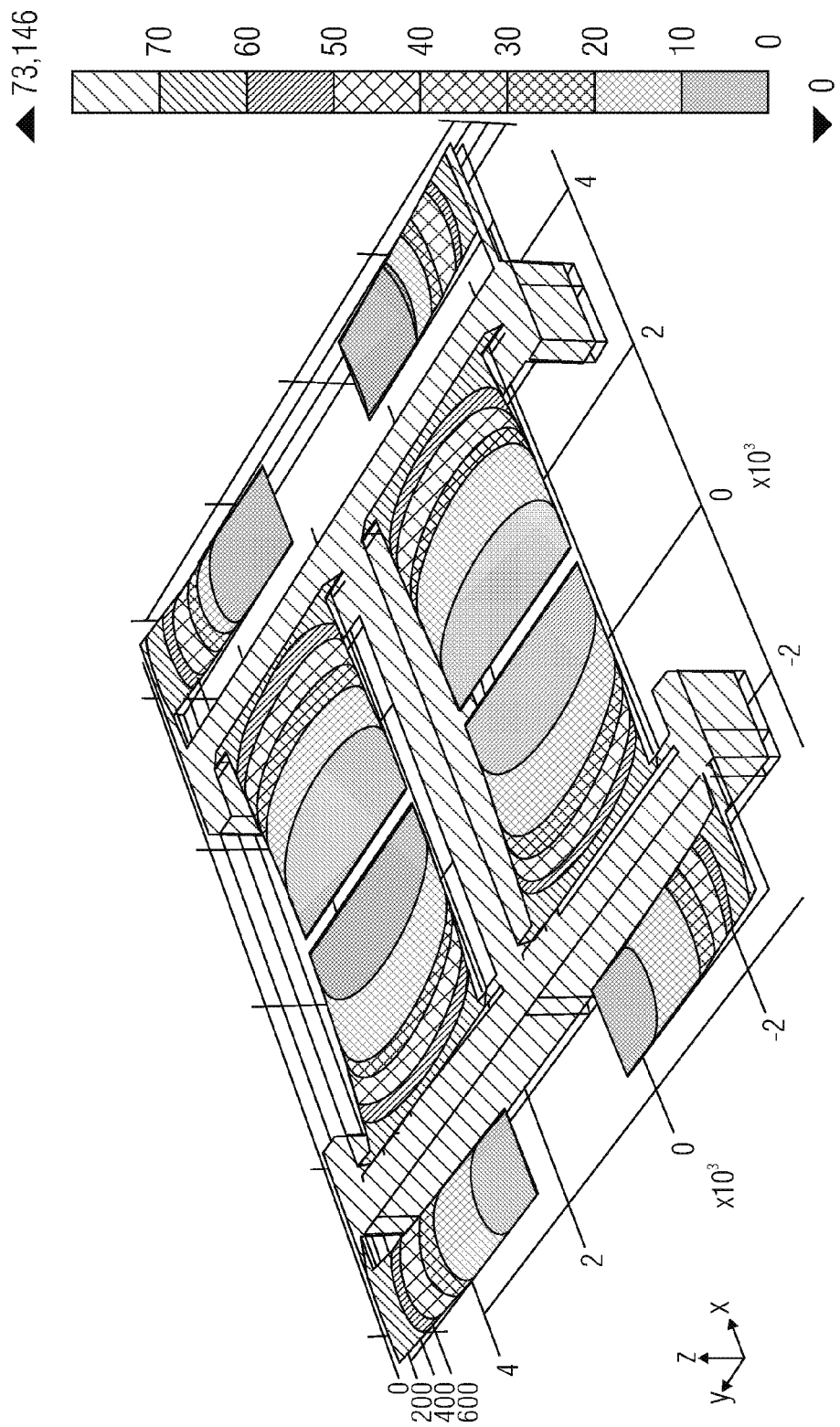
FIG. 15b shows a perspective view of an FEM simulation of the MEMS shown in FIG. 15a, in accordance with an embodiment of the present invention.

FIG. 15a shows a top view of a CAD model of a MEMS 100 in accordance with an embodiment of the present invention, while FIG. 15b shows a perspective view of an FEM simulation of a deflection of the CAD model, shown in FIG. 15a, of the MEMS 100.

The CAD model, shown in FIG. 15a, of the MEMS 100 is based on a combination of the embodiments shown in FIGS. 4a, 4d, 5c, images 5g and 6b.

The CAD model, shown in FIG. 15a, of the MEMS 100 is based on a combination of the embodiments shown in FIGS. 4a, 4d, 5c, image 5g, and 6b.

The MEMS 100 comprises an H-shaped stroke structure 104 and eight piezoelectric actuators 106_1 to 106_n (n=8). In detail, the stroke structure 104 comprises three portions 104a to 104c arranged to form an H-shaped stroke structure 104, so that the stroke structure 104 has the shape of an H within a sectional plane extending perpendicularly to the direction 114 of the stroke movement of the stroke structure 104.

A first piezoelectric actuator 106_1 and a fifth piezoelectric actuator 106_5 of the eight piezoelectric actuators 106_1 to 106_n (n=8) are arranged, outside the stroke structure 104, along the first portion 104a of the stroke structure 104, a second piezoelectric actuator 106_2 and a sixth piezoelectric actuator 106_6 of the eight piezoelectric actuators 106_1 to 106_n (n=8) being arranged, outside the stroke structure 104, along the second portion 104b of the stroke structure 104.

The first piezoelectric actuator 106_1 and the fifth piezoelectric actuator 106_5 are connected to at least one of the mutually spaced-apart contact points of the first portion 104a of the stroke structure 104 via in each case at least one connecting element 108_1 and 108_2 of the mutually spaced-apart connecting elements 108_1 to 108_m (m=12), the second piezoelectric actuator 106_2 and the sixth piezoelectric actuator 106_6 being connected to at least one of the mutually spaced-apart contact points of the second portion 104b of the stroke structure 104 via at least one connecting element 108_3 and 108_4 of the mutually spaced-apart connecting elements 108_1 to 108_m (m=12).

A third piezoelectric actuator 106_3 and a seventh piezoelectric actuator 106_7 of the eight piezoelectric actuators 106_1 to 106_n (n=8) is at least partly arranged, inside the stroke structure 104, along the first side of the third portion 104c of the stroke structure 104, a fourth piezoelectric actuator 106_4 and an eighth piezoelectric actuator 106_n (n=8) of the eight piezoelectric actuators 106_1 to 106_8 being at least partly arranged, inside the stroke structure 104, along the second side of the third portion 104c of the stroke structure 104.

The third piezoelectric actuator 106_3 and the fourth piezoelectric actuator 106_4 are connected to the stroke structure 104 via two mutually spaced-apart connecting elements 108_5 to 108_8, respectively, of the mutually spaced-apart connecting elements, the seventh piezoelectric actuator 106_7 and the eighth piezoelectric actuator 106_8 being connected to the the stroke structure 104 via two mutually spaced-apart connecting elements 108_9 to 108_12, respectively.

The clamping of the third, fourth, seventh, and eighth piezoelectric actuators 106_3, 106_4, 106_7, and 106_8 extend centrally and in parallel between the first and second portions 104a and 104b.

Thus, FIGS. 15a and 15b show a similar design as FIGS. 14a and 14b, however with inner actuators 106_3, 106_4, 106_7, and 106_8 rotated by 90° (cf. FIG. 5c). In contrast to the flexion springs in the previous example, the four inner actuators are connected to the stroke body 104 via two torsion springs in each case.

Figure 16A:
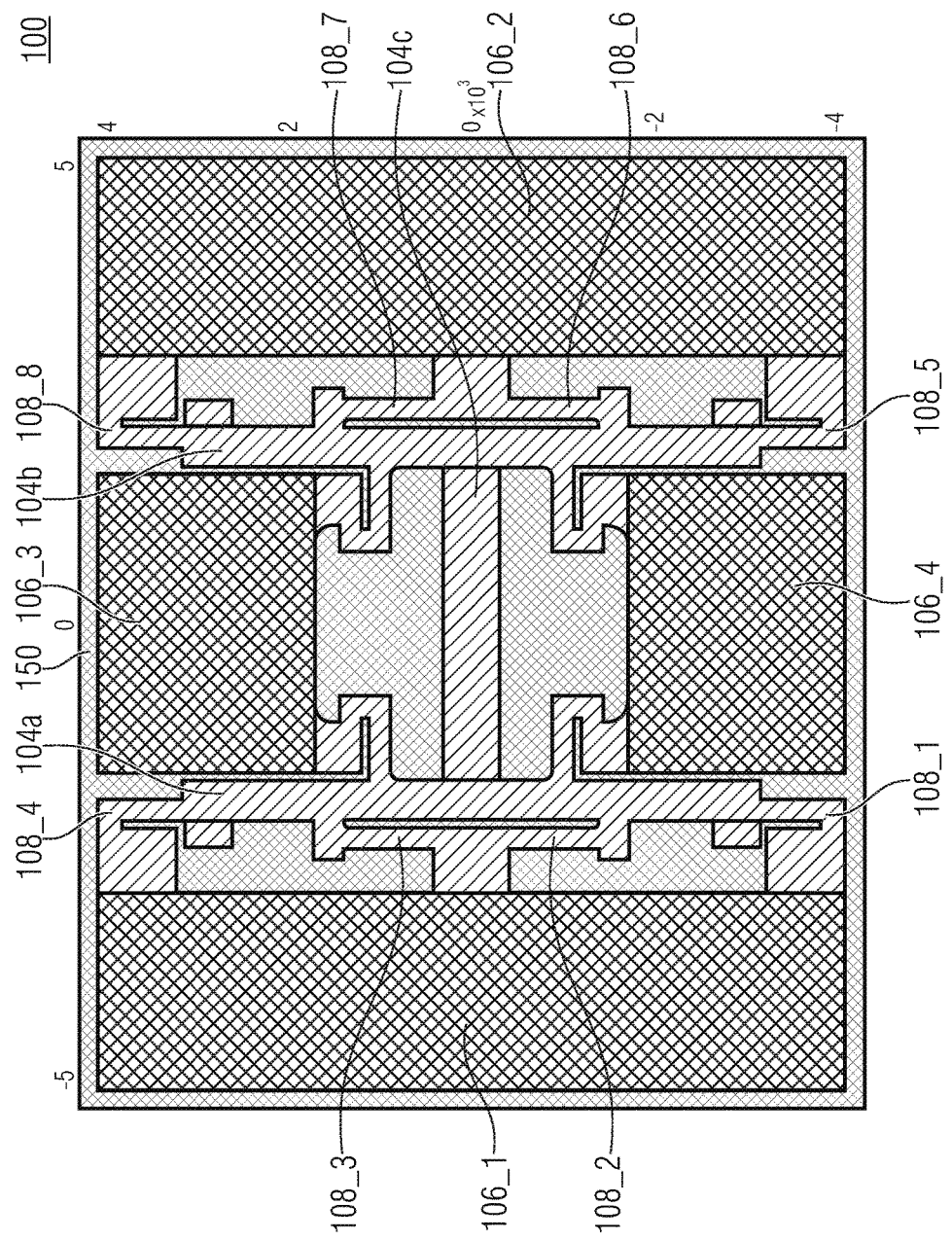
FIG. 16a shows a top view of a CAD model of the MEMS, in accordance with an embodiment of the present invention.
Figure 16B:
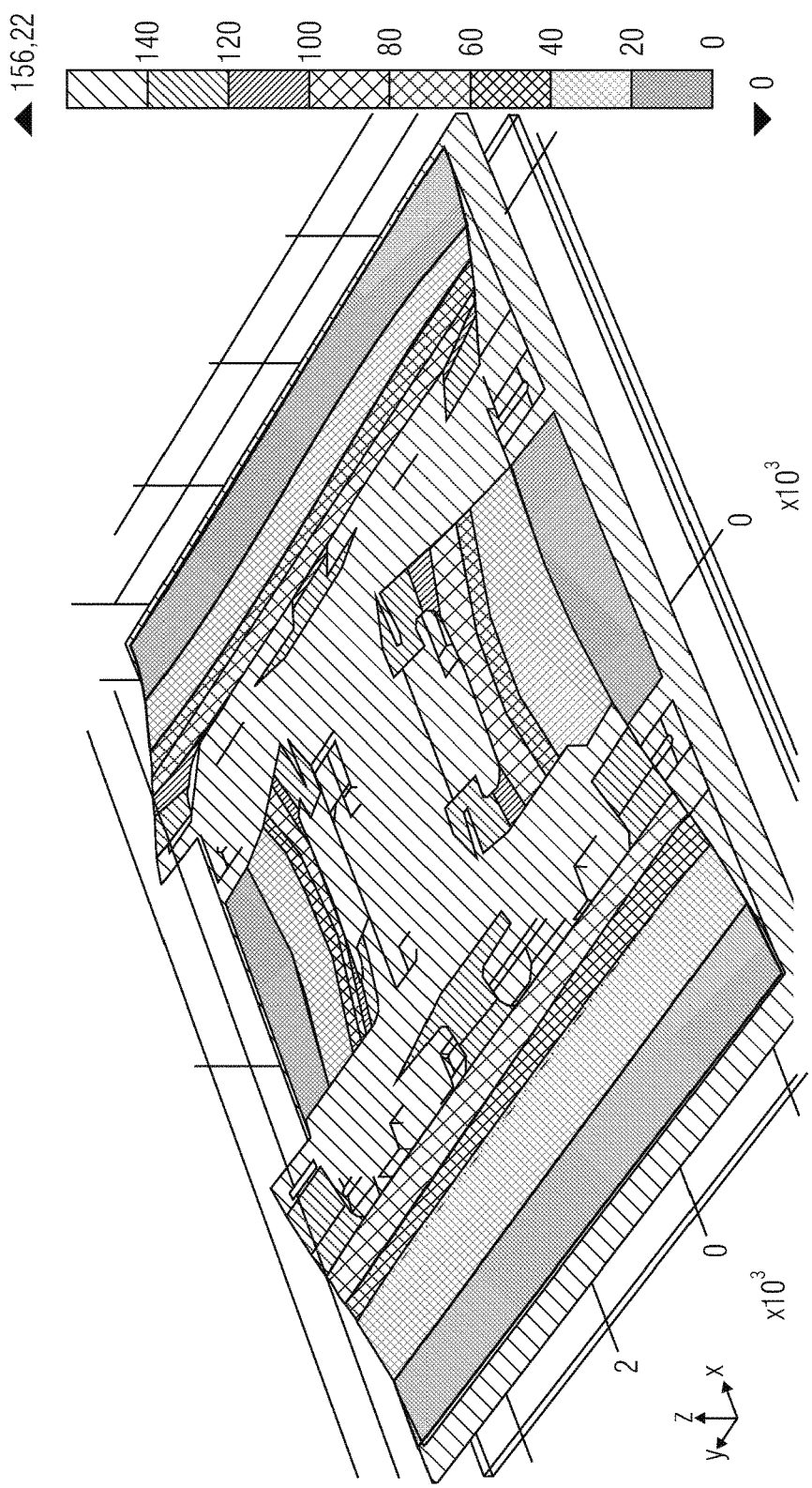
FIG. 16b shows a perspective view of an FEM simulation of the MEMS shown in FIG. 16a, in accordance with an embodiment of the present invention.

FIG. 16a shows a top view of a CAD model of a MEMS 100 in accordance with an embodiment of the present invention, while FIG. 16b shows a perspective view of an FEM simulation of a deflection of the CAD model, shown in FIG. 16a, of the MEMS 100.

In contrast to the CAD model of the MEMS 100 that is shown in FIGS. 12a and 12b, the CAD model of the MEMS that is shown in FIGS. 16a and 16b additionally comprises an extended stroke body 150, specifically a plate-shaped stroke body 150 mounted on the bottom side.

Thus, FIGS. 15a and 15b illustrate a slightly modified version of FIGS. 12a and 12b, wherein an extended, plate-shaped stroke body 150 is attached to the bottom side of the actual stroke body 104. The extended stroke body 150 takes up an area roughly corresponding to the active area (cf. FIGS. 4a to 4f). Of course, the extended stroke body 150 may, in embodiments, be larger than the active area.

General properties and boundary conditions of embodiments of the present invention will be explained in more detail below.

In the following table, typical minimum and maximum values of essential target parameters are listed in a tabular manner:

| parameter | typical values | minimum/maximum |
| --- | --- | --- |
| resonant frequency (stroke mode) | 500 Hz | 10 Hz-10 kHz |
| excitation frequency | static - 20 kHz | static - 1 MHz |
| min. active area | 10 × 10 mm$^2$ | 100 × 100 µm$^2$ – 3 × 3 cm$^2$ |
| deflection amplitude | 200 µm | 0.1 µm-3 mm |
| piezoelectric force | 20 mN | 1 µN-2N |

Materials that can be used for the corresponding functional elements are listed in a tabular manner in the following table:

| function | materials |
| --- | --- |
| piezoelectric layer | PZT, PNZT, AlN, AlScN, ZnO, BCZT, KNN |
| passive layer | Si, poly-Si, SiN, SiNO, SiO$_2$, AlN, metals |
| stroke body | Si, [piezoelectric layer], [passive layer] |
| extended stroke body | Si, metals, plastics |
| connecting elements | [passive layer], [piezoelectric layer] |
| diaphragm | silicones, parylenes, PDMS, PI, BCB, PMMA ... |

Figure 17A:
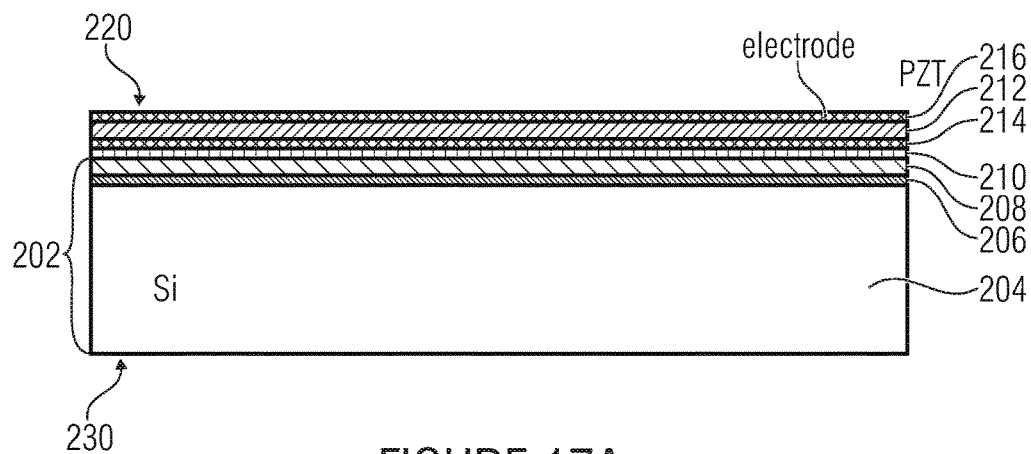
FIGS. 17a-c show schematic cross sections of the MEMS following various process steps of a method of producing the MEMS.
Figure 17B:
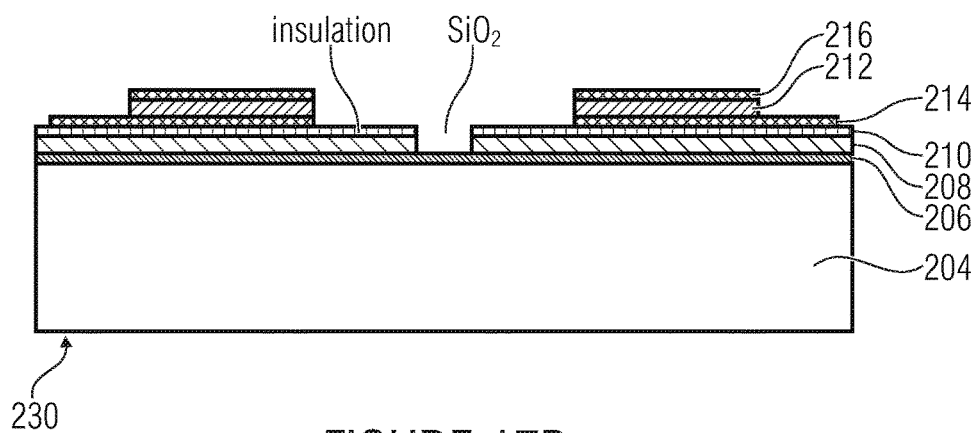
Figure 17C:
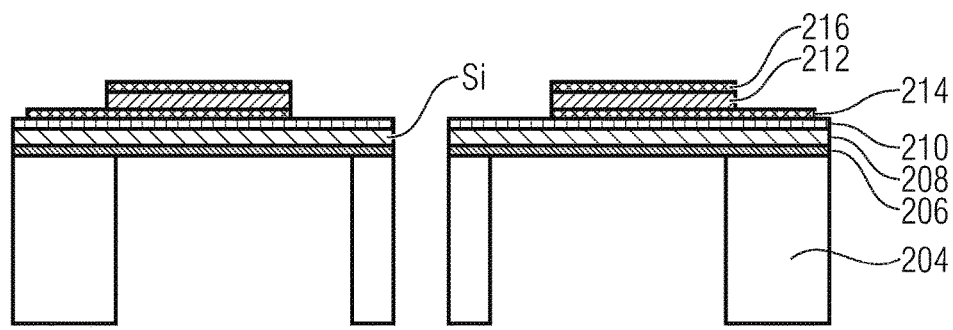

In the following, a method of producing the MEMS 100 shall be presented by way of example with reference to FIGS. 17a to 17c. In detail, FIGS. 17a to 17c illustrate a process flow, depicted in a simplified manner, for a unimorphic configuration with PZT as the piezoelectric material and silicon as the passive material. FIG. 17a shows a schematic cross-sectional view of an SOI (silicon on insulator) wafer prior to front-side patterning, while FIG. 17b shows a schematic cross-sectional view following patterning of the front-side layers, and while FIG. 17c shows a schematic cross-sectional view following rear-side Si and SiO$_2$ patterning.

The method may comprise the process steps listed below.

A step of providing an SOI wafer 202 having an Si substrate 204, an SiO$_2$ layer 206 applied thereto, and an Si functional layer 208 applied thereto.

A step of applying or depositing an insulating layer (SiO$_2$) 210, a piezoelectric functional layer (PZT) 212, and corresponding metal electrodes (Pt, Au, Mo) 214 and 216.

A step of patterning the electrodes 214 and 216, of the piezoelectric functional layer 212, and of the insulating layer 210 by means of wet and/or dry etching, starting from the first surface 220 with a stop on the buried SiO$_2$ layer 206.

A step of rear-side Si etching with a stop on the buried SiO$_2$ layer 206 with subsequent removal of the exposed SiO$_2$ areas.

Figure 18:
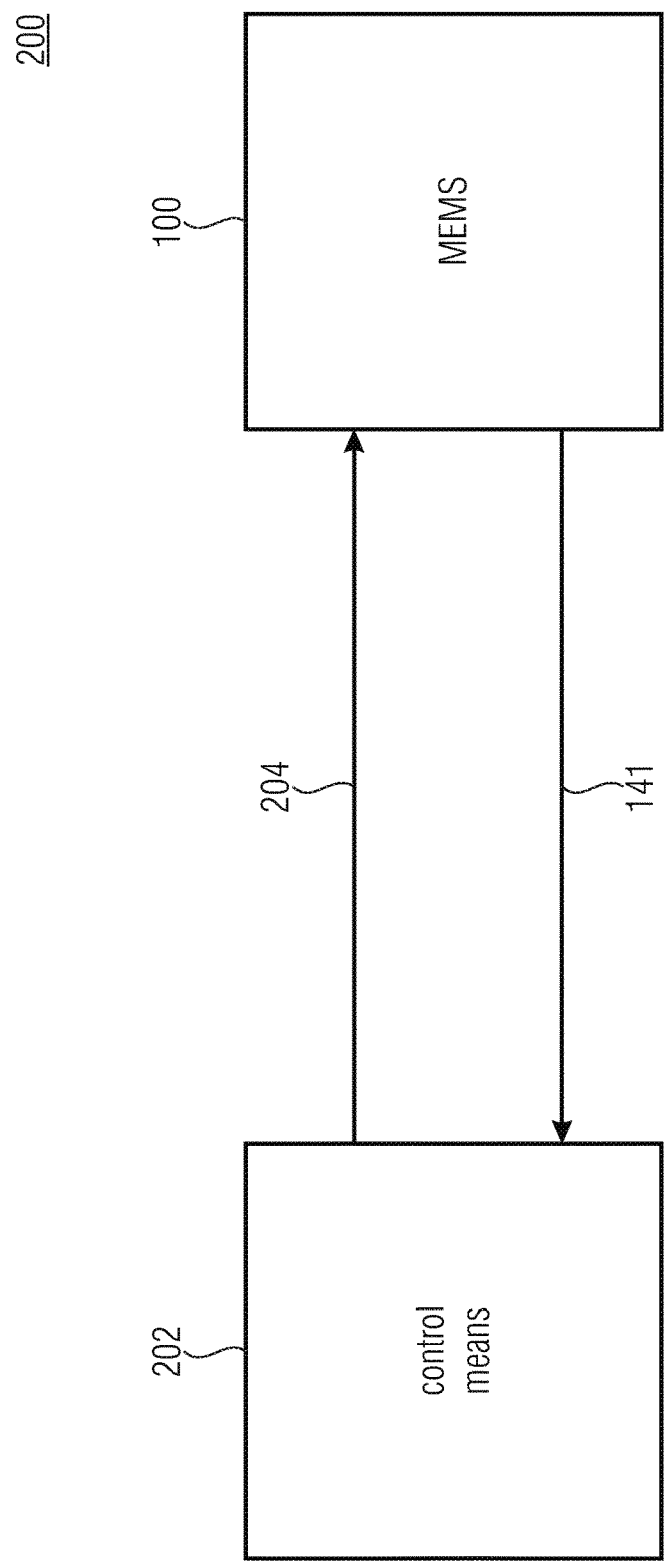
FIG. 18 shows a schematic view of a system comprising a MEMS and a control means for controlling the at least two piezoelectric actuators of the MEMS, in accordance with an embodiment.

FIG. 18 shows a schematic view of a system 200, in accordance with an embodiment of the present invention. The system comprises the above-described MEMS 100 and a control means 202, it being possible for the control means 202 to control the at least two piezoelectric actuators 106_1 to 106_n of the MEMS 100.

For example, the control means 202 may be configured to provide a control signal 204 for controlling the at least two piezoelectric actuators 106_1 to 106_n.

Moreover, in embodiments, the MEMS 100 may comprise a position sensor 140, e.g. a piezoelectric or capacitive position sensor, configured to provide a sensor signal 141 dependent on the deflection of the diaphragm 102. The control means may be configured to control the at least two piezoelectric actuators 106_1 to 106_n of the MEMS 100 in a regulated manner on the basis of the sensor signal 141.

Further embodiments of the present invention provide a miniaturized stroke actuator (lifting actuator) with a rigid stroke body having a reduced surface area (which takes up, e.g., less than 40% (or 30% or 20%) of the active area); at least two piezoelectric drives (which take up, e.g., at least 40% (or 50%, 60%, 70%, or 80%) of the active area) which are arranged next to the stroke body and move the stroke body out of the plane in the upward or downward direction; comprising connecting elements via which the piezoelectric drives are connected to the stroke body; and comprising a diaphragm fixed to the stroke body and ensuring separation, in particular fluidic separation, of the front side and the rear side. In this context, the miniaturized stroke actuator may be manufactured in silicon technology.

In embodiments, the miniaturized stroke actuator may be used for sound or ultrasound generation (within a range from 20 Hz to 1 MHz, within a range from 20 Hz to 20 kHz, within a range from 20 kHz to 100 kHz, or within a range from 100 kHz to 1 MHz), for displacing liquids or for displacing gasses. In addition, the miniaturized stroke actuator may also be used for generating droplets, e.g. for inkjet printers.

In embodiments, the miniaturized stroke actuator may comprise a stroke-body geometry including a frame structure, beams, and/or a plate.

In embodiments, the miniaturized stroke actuator may comprise an extended stroke body with a large surface area for increasing the displaced fluid volume.

In embodiments, the miniaturized stroke actuator may comprise sensor elements for position detection and regulation (cf. FIGS. 7a and 7b).

In embodiments, several miniaturized stroke actuators may be arranged within an array.

By means of embodiments of the present invention, very large forces can be generated during resonant and non-resonant operation while also achieving a high degree of deflection. The reasons for this consist in the use of (1) stroke bodies reduced in size which enable a high level of area utilization with regard to the actuators, (2) stroke bodies reduced in size which, on account of their geometry, allow transmission of forces to take place as far away from the center of gravity of the stroke body as possible, (3) actuator arrangements wherein the available active area is exploited in a particular efficient manner, (4) advantageously broad bending actuators with one-sided clamping, which can generate large forces in the activated state due to the pronounced transverse warping, and (5) suitable spring elements configured to be as efficient in terms of surface area as possible and which allow large forces to be transmitted without impeding the deflection of the stroke body too heavily.

In addition, the following advantages result. First, the effective spring rigidity increases due to several actuators being connected in parallel, so that comparatively high resonant frequencies with, simultaneously, large deflections can be implemented. Second, due to the reduction in surface area, the stroke bodies comprise a comparatively small mass, so that comparatively high resonant frequencies can be implemented with simultaneously large deflections. Third, due to the use of a light-weight material, advantageously silicon, for the stroke body, high resonant frequencies can be implemented with simultaneously large deflections. Fourth, by applying plate-shaped or differently shaped forms, extended stroke bodies can be implemented whose surface area is larger than the active area. In case of production in silicon technology, manufacturing costs may thus be reduced since the size of the chip area is primarily determined by the actuator and may be smaller than the stroke surface area (lifting surface area) that may be used. Fifth, the actual position of the stroke body may be continually determined during operation with the aid of the integrated sensor system. This forms the foundation for closed-loop excitation via which external influences and aging effects may be compensated for electronically. Sixth, utilization of piezoelectric drives enables a reduction of the energy that may be used as compared to stroke actuators comprising electrodynamic drives.

In the following, exemplary technical fields of application of the MEMS 100 shall be listed.

The above-described actuator structures are suitable for applications wherein large force and strokes are to be generated by means of piezoelectric drives. This applies, for example, to fields of application where fluids are displaced, such as valves and pumps, for example. In addition, this applies to MEMS loudspeakers. MEMS loudspeakers (e.g. chip-based intelligent micro loudspeakers) can be used in mobile communication devices, such as primarily in mobile phones, for example, but additionally also in tablets, laptops, earphones, and hearing aids.

Even though embodiments of a MEMS have been described herein in general by means of FIGS. 1 to 18, it shall be noted that same are equally applicable to a MEMS loudspeaker.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A MEMS comprising:
    a diaphragm;
    a stroke structure coupled to the diaphragm; and
    at least two piezoelectric actuators coupled to a plurality of mutually spaced-apart contact points of the stroke structure via a plurality of mutually spaced-apart connecting elements;
    the at least two piezoelectric actuators being configured to cause a stroke movement of the stroke structure so as to deflect the diaphragm; and
    wherein each of the at least two piezoelectric actuators is connected to at least two mutually spaced-apart contact points of the stroke structure via at least two mutually spaced-apart connecting elements.

2. The MEMS as claimed in claim 1, wherein the plurality of mutually spaced-apart connecting elements are connected to a plurality of mutually spaced-apart contact points of the at least two piezoelectric actuators.

3. The MEMS as claimed in claim 1, wherein the stroke structure spans, perpendicularly to a direction of the stroke movement, an area which corresponds to at least 30% of an area of the diaphragm.

4. The MEMS as claimed in claim 1, wherein the stroke structure is coupled to the diaphragm via a plurality of regions arranged in a distributed manner.

5. The MEMS as claimed in claim 1, wherein a cross-sectional area of the stroke structure that is perpendicular to a direction of the stroke movement of the stroke structure is smaller than a sum of piezoelectrically active actuator areas of the at least two piezoelectric actuators.

6. The MEMS as claimed in claim 1, wherein the stroke structure comprises a plurality of stroke bodies.

7. A system comprising:
    a MEMS as claimed in claim 1; and
    a controller configured to control the at least two piezoelectric actuators of the MEMS;
    the MEMS comprising at least one piezoelectric position sensor configured to provide a sensor signal dependent on the deflection of the diaphragm; and
    the controller being configured to control the at least two piezoelectric actuators of the MEMS in a regulated manner on the basis of the sensor signal.

8. A utilization of the MEMS as claimed in claim 1 for sound generation, for ultrasound generation, for displacing liquids, for displacing gasses, or for generating droplets of liquid.

9. A MEMS loudspeaker for generating sound waves within the audible wavelength spectrum, comprising
    a diaphragm,
    a stroke structure coupled to the diaphragm, and
    at least two piezoelectric actuators,
    by means of which a stroke movement of the stroke structure can be caused for deflecting the diaphragm,
    wherein
    the piezoelectric actuators are connected to a plurality of mutually spaced-apart contact points of the stroke structure via a plurality of mutually spaced-apart flexible connecting elements, and that each of the at least two piezoelectric actuators is connected to at least two mutually spaced-apart contact points of the stroke structure via at least two mutually spaced-apart connecting elements.

10. The MEMS loudspeaker as claimed in claim 9, wherein the diaphragm is connected to the stroke structure at a front end of the stroke structure in a direct manner, and/or the piezoelectric actuators are connected to the stroke structure on at least one side face of the stroke structure, in particular on two opposite side faces, in an indirect manner via the connecting elements.

11. The MEMS loudspeaker as claimed in claim 9, wherein the plurality of connecting elements that are mutually spaced-apart in particular in the transverse direction of the MEMS loudspeaker are connected to a plurality of mutually spaced-apart contact points of the at least two piezoelectric actuators.

12. The MEMS loudspeaker as claimed in claim 9, wherein the stroke structure is coupled to the diaphragm via a plurality of regions arranged along at least two at least partly mutually spaced-apart straight lines or curves.

13. A MEMS loudspeaker for generating sound waves within the audible wavelength spectrum, comprising
    a diaphragm,
    a stroke structure coupled to the diaphragm, and
    at least one piezoelectric actuator by means of which a stroke movement of the stroke structure can be caused for deflecting the diaphragm,
    wherein
    the MEMS loudspeaker comprises at least one position sensor configured to provide a sensor signal dependent on the deflection of the diaphragm, and that each of the at least two piezoelectric actuators is connected to at least two mutually spaced-apart contact points of the stroke structure via at least two mutually spaced-apart connecting elements.

14. The MEMS loudspeaker as claimed in claim 13, wherein the actuator is configured to be operated in a regulated manner as a function of the sensor signal by means of a controller provided therefor;
    or that the position sensor is integrated in the actuator;

or that the sensor electrodes of the integrated position sensor are configured as two-dimensional or interdigital electrodes and/or are electrically insulated from the actuator electrodes;

or that the piezoelectric position sensor and the piezoelectric actuator are configured by a common piezoelectric layer.

15. A regulating unit for operating a MEMS loudspeaker in a regulated manner, comprising a MEMS loudspeaker as claimed in claim 13, and a controller configured to control a piezoelectric actuator of the MEMS loudspeaker, wherein the MEMS loudspeaker comprises at least one piezoelectric position sensor configured to provide the controller with a sensor signal dependent on the deflection of a diaphragm of the MEMS loudspeaker, and in that the controller is configured to control the at least one piezoelectric actuator of the MEMS loudspeaker in a regulated manner on the basis of the sensor signal.

* * * * *